(12) United States Patent
Inoue

(10) Patent No.: US 8,785,917 B2
(45) Date of Patent: Jul. 22, 2014

(54) ACTINIC RAY-SENSITIVE OR RADIATION-SENSITIVE RESIN COMPOSITION, AND ACTINIC RAY-SENSITIVE OR RADIATION-SENSITIVE FILM AND PATTERN FORMING METHOD USING THE SAME

(75) Inventor: Naoki Inoue, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 189 days.

(21) Appl. No.: 13/537,734

(22) Filed: Jun. 29, 2012

(65) Prior Publication Data
US 2013/0001751 A1 Jan. 3, 2013

(30) Foreign Application Priority Data
Jun. 30, 2011 (JP) ................................. 2011-146475

(51) Int. Cl.
*H01L 35/24* (2006.01)
(52) U.S. Cl.
USPC .................................... 257/40; 257/E51.001
(58) Field of Classification Search
USPC ........................................... 257/40, E51.001
See application file for complete search history.

(56) References Cited

U.S. PATENT DOCUMENTS

| 5,945,250 A | 8/1999 | Aoai et al. |
| 2007/0117043 A1 | 5/2007 | Gonsalves |
| 2009/0069521 A1 | 3/2009 | Nagai et al. |
| 2010/0233617 A1 | 9/2010 | Wada |

FOREIGN PATENT DOCUMENTS

| JP | 9-325497 A | 12/1997 |
| JP | 10-221852 A | 8/1998 |
| JP | 2006-259509 A | 9/2006 |
| JP | 2007-197718 A | 8/2007 |
| JP | 2008-133448 A | 6/2008 |
| JP | 2009-93137 A | 4/2009 |
| JP | 2011033839 A | 2/2011 |
| JP | 2011039315 A | 2/2011 |
| WO | 2006/121096 A1 | 11/2006 |

OTHER PUBLICATIONS

Mingxing Wang et al., "Synthesis and Properties of New Anionic Photoacid Generators Bound Polymer Resists for e-beam and EUV Lithography", Advances in Resist Materials and Processing Technology XXV, Proc. of SPIE, 2008, vol. 6923, pp. 692312-1 to 692312-7.

Mingxing Wang et al., "Synthesis and Properties of New Anionic Photoacid Generators Bound Polymer Resists for e-beam and EUV Lithography", Advancies in Resist Materials and Properties, Proc. of SPIE, 2008, vol. 6923, pp. 692312-1 to 692312-7.
Notice of Reasons for Rejection, dated Apr. 16, 2013, issued in corresponding JP Application No. 2011-146475, 6 pages In English and Japanese.
Notice of Reasons for Rejection, dated Dec. 3, 2013, issued in corresponding JP Application No. 2011-146475, 4 pages In English and Japanese.

*Primary Examiner* — Anthony Ho
(74) *Attorney, Agent, or Firm* — Sughrue Mion, PLLC

(57) ABSTRACT

An actinic ray-sensitive or radiation-sensitive resin composition of the present invention contains a resin (P) which includes a repeating unit (A) having an ionic structural moiety which generates an acid anion by being decomposed due to irradiation with actinic rays or radiation, a repeating unit (B) having a proton acceptor moiety, and a repeating unit (C) having a group which generates an alkali soluble group by being decomposed by the action of an acid, and the resin (P) has at least one repeating unit which is represented by the general formulae (I) to (III) below as the repeating unit (A) (the reference numerals in the general formulae represent the meaning of the description in the scope of the claims and the specifications).

[chem. 1]

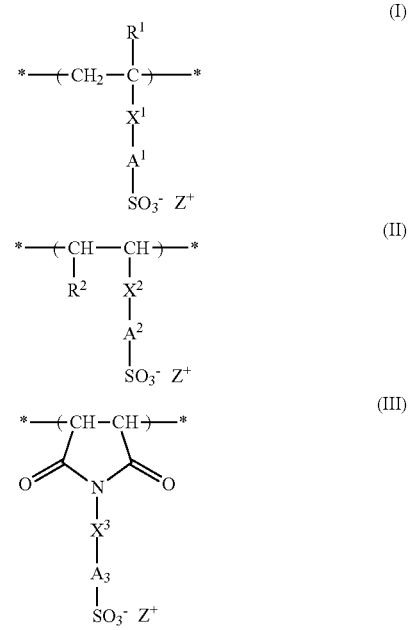

16 Claims, No Drawings

ACTINIC RAY-SENSITIVE OR RADIATION-SENSITIVE RESIN COMPOSITION, AND ACTINIC RAY-SENSITIVE OR RADIATION-SENSITIVE FILM AND PATTERN FORMING METHOD USING THE SAME

BACKGROUND OF THE INVENTION

1. Field of the Invention

The present invention relates to an actinic ray-sensitive or radiation-sensitive resin composition suitably used for a lithography process which is performed in the production process of a VLSI, a high-capacity microchip and an imprint mold structure, and the like and for other photofabrication processes, and an actinic ray-sensitive or radiation-sensitive film and a pattern forming method each using the same. More specifically, the invention relates to a positive type resist composition where an electron beam, an X ray, or EUV light is used which is preferably applied in the process described above and a resist film and pattern forming method which use the same.

2. Description of the Related Art

In micromachining using lithography, recently, along with the high integration of integrated circuits, there has been a demand for ultra fine pattern formation of the order of several tens of nanometers. Along with this demand, a trend of shorter wavelengths is able to be seen where the exposure wavelength changes from g-rays to i-rays and further to KrF excimer laser light. Furthermore, currently, other than excimer laser light, development in lithography where an electron beam, an X ray, or EUV light is used is also progressing.

In addition, micromachining using a resist composition is not only directly used in the manufacturing of integrated circuits but has also been applied recently to the manufacturing of a so-called imprint mold structure and the like (for example, refer to JP2004-158287A, JP2008-162101A, and "Science and New Technology in Nanoimprint", edited by Yoshihiko Hirai, Frontier Publishing (published in June 2006)).

In particular, lithography where an X ray or EUV light is used is positioned as the next generation or a more advanced generation of pattern forming technology and a positive type resist with high sensitivity and high resolution is desired. In particular, higher sensitivity is an extremely important issue in order to reduce the wafer processing time, but when higher sensitivity is pursued, not only is there a reduction in the resolving power but there is a deterioration in line edge roughness and development of a resist which satisfies all of these properties is strongly desired. Here, line edge roughness refers to that an edge appears uneven when a pattern is viewed from directly above since an edge of the pattern of the resist and the interface with the substrate changes in a manner which is not regular in a direction which is perpendicular to the line direction due to the properties of the resist. In particular, line edge roughness is an extremely important issue for improvement in an ultra fine region. High sensitivity, high resolution, excellent pattern formation, and excellent line roughness are in a tradeoff relationship and the means by which all of these are satisfied is extremely important.

As a method which solves these problems, the use of a resin, which has a structural moiety where an acid is generated due to the irradiation with actinic rays or radiation (below, "photo-acid generator") in a main chain or a side chain of a polymer, is being considered (for example, refer to JP1997-325497A (JP-H9-325497A), JP1998-221852A (JP-H10-221852A), JP2007-197718A, WO06/121096A, JP2009-93137A, US2007/117043A, JP2008-133448A, JP2006-259509A, and Proc. of SPIE Vol. 6923, 692312, 2008)

Among these, for example, a ternary copolymer of hydroxystyrene, an acrylate containing an adamantyl group, and an acrylate containing a photo-acid generator is disclosed in US2007/117043A and Proc. of SPIE Vol. 6923, 692312, 2008.

In addition, a resist composition, which contains resin which is sensitive to high energy rays or heat and has a repeating unit which generates a sulfonic acid in an end of a side chain containing fluorine, is disclosed in JP2008-133448A to improve the high resolution, the density bias, and the exposure margin.

In addition, a resist composition which contains a resin, which includes a repeating unit with a sulfonium cation structure as the repeating unit which has the acid-photo generating group in the side chain, and a composition, which generates sulfonic acid, bis(alkylsulfonyl)amide, or tris(alkylsulfonyl)methine due to irradiation with actinic rays or radiation is disclosed in WO06/121096A.

However, in particular, in lithography where an electron beam, an X ray, or EUV light is used, the actual state of affairs is that there is a demand for further improvements in the sensitivity, resolution, pattern formation, and line edge roughness.

SUMMARY OF THE INVENTION

The present invention takes into consideration of the related art and has an object to provide an actinic ray-sensitive or radiation-sensitive resin composition which is resistant to the changes in sensitivity even if the pitch width is narrow, have high resolution, and is capable of forming pattern with excellent roughness characteristics and pattern formation in lithography where an electron beam, an X ray, or EUV light is particularly used as an exposure light source, and an actinic ray-sensitive or radiation-sensitive film and a pattern forming method each using the same.

The inventors have reached the completion of the present invention which is shown below as a result of extensive studies in order to solve the issues described above.

[1] An actinic ray-sensitive or radiation-sensitive resin composition which contains a resin (P), which includes a repeating unit (A) having an ionic structural moiety which generates an acid anion by being decomposed due to irradiation with actinic rays or radiation, a repeating unit (B) having a proton acceptor moiety, and a repeating unit (C) having a group which generates an alkali soluble group by being decomposed by the action of an acid, and the resin (P) has at least one repeating unit which is represented by the general formulae (I) to (III) as the repeating unit (A).

[Chem. 1]

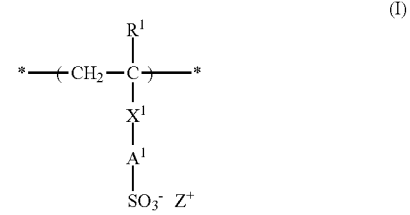

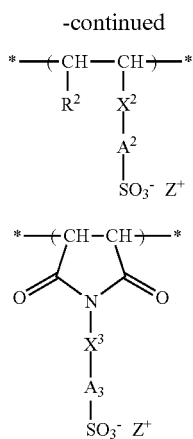

In the general formulae (I) to (III), $R^1$ represents a hydrogen atom, an alkyl group, a cycloalkyl group, a hydroxymethyl group, an alkoxymethyl group, a halogen atom, or a cyano group.

$R^2$ represents —COOR$^{11}$ or —CON(R$^{12}$)(R$^{13}$). $R^{11}$, $R^{12}$, and $R^{13}$ each independently represent a hydrogen atom, an alkyl group, a cycloalkyl group, an alkenyl group, an aryl group, or an aralkyl group. $R^{12}$ and $R^{13}$ may form a ring with a nitrogen atom by being bonded.

$X^1$, $X^2$, and $X^3$ each independently represent a single bond or a divalent linking group.

$A^1$, $A^2$, and $A^3$ each independently represent a divalent linking group which does not include a fluorine atom.

$Z^+$ represents an onium cation.

[2] The composition described in [1] where $A^1$, $A^2$, and $A^3$ are alkylene groups which include only carbon atoms and hydrogen atoms or arylene groups which include only carbon atoms and hydrogen atoms.

[3] The composition described in [1] or [2] where $A^1$, $A^2$, and $A^3$ are unsubstituted phenylene groups.

[4] The composition described in any one of [1] to [3] where the proton acceptor moiety of the repeating unit (B) is an amine, aniline, or a nitrogen-containing heterocyclic structure.

[5] The composition described in any one of [1] to [4] where the repeating unit (C) is a repeating unit represented by the general formula (V) or the general formula (VI) below.

[Chem. 2]

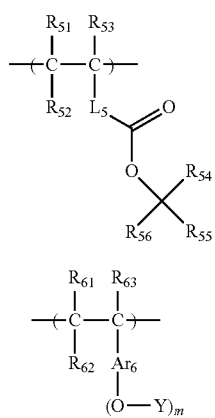

In the general formula (V), $R_{51}$, $R_{52}$, and $R_{53}$ each independently represent a hydrogen atom, an alkyl group, a monovalent aliphatic hydrocarbon ring group, a halogen atom, a cyano group, or an alkoxycarbonyl group. $R_{52}$ may form a ring by being bonded with $L_5$ and $R_{52}$ in this case represents an alkylene group.

$L_5$ represents a single bond or a divalent linking group and represents a trivalent linking group when forming a ring with $R_{52}$.

$R_{54}$ represents an alkyl group and $R_{55}$ and $R_{56}$ each independently represent a hydrogen atom, an alkyl group, a monovalent aliphatic hydrocarbon ring group, or a monovalent aromatic ring group. Meanwhile, $R_{55}$ and $R_{56}$ are not hydrogen atoms at the same time. $R_{55}$ and $R_{56}$ may form a ring by being bonded to each other.

In the general formula (VI), $R_{61}$, $R_{62}$, and $R_{63}$ each independently represent a hydrogen atom or an alkyl group, $Ar_6$ represents a divalent aromatic ring group.

Y represents a group which generates an alkali soluble group by being decomposed by the action of an acid, and each independently represents a group which generates an alkali soluble group by being decomposed by the action of an acid in a case of there being a plurality thereof.

m represents an integer of 1 to 4.

[6] The composition described in [5] where the repeating unit (C) is a repeating unit represented by the general formula (VI) and is a group where an —O—Y group forms an acetal structure.

[7] The composition described in any one of [1] to [6] where the repeating unit (A) is a repeating unit represented by the general formula (I)

[8] The composition described in any one of [1] to [7] where $X^1$, $X^2$, and $X^3$ represent a single bond, an arylene group, an alkylene group, a cycloalkylene group, —O—, —SO$_2$—, —CO—, —NR$_{21}$—, or a divalent linking group which combine thereof. Here, $R_{21}$ represents an alkyl group, a cycloalkyl group, or an aryl group.

[9] The composition described in any one of [1] to [8] where $Z^+$ represents a sulfonium cation.

[10] The composition described in any one of [1] to [9] where the proton acceptor moiety of the repeating unit (B) is a nitrogen-containing heterocyclic structure.

[11] The composition described in any one of [1] to [10] where the resin (P) further includes a repeating unit (D) represented by the general formula (IV) below.

[Chem. 3]

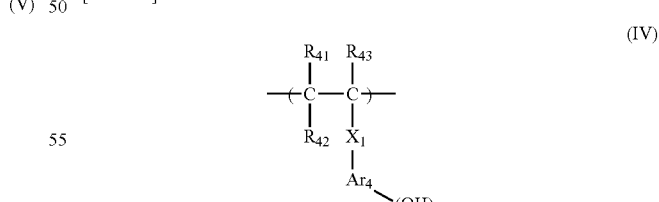

In the general formula (IV), $R_{41}$, $R_{42}$, and $R_{43}$ each independently represent a hydrogen atom, an alkyl group, a monovalent aliphatic hydrocarbon ring group, a halogen atom, a cyano group, or an alkoxycarbonyl group. In addition, $R_{42}$ may form a ring by being bonded with $Ar_4$ and $R_{42}$ in this case represents an alkylene group.

$X_1$ represents a single bond or a divalent linking group.

Ar$_4$ represents a divalent aromatic ring group and represents a trivalent aromatic ring group when forming a ring with R$_{42}$.

n is an integer of 1 to 4.

[12] An actinic ray-sensitive or radiation-sensitive film which is formed using the composition described in any one of [1] to [11].

[13] A pattern forming method which includes exposing of the actinic ray-sensitive or radiation-sensitive film described in [12] and developing of the exposed film.

[14] The pattern forming method described in [13] where an exposure light source is at least one of an electron beam, an X ray, or EUV light.

[15] A semiconductor device manufacturing method which includes the pattern forming method described in [13] or [14].

[16] A semiconductor device which is manufactured using the method described in [15].

It is further preferable that the present invention is the configuration described below.

[17] An actinic ray-sensitive or radiation-sensitive resin composition described in any one of [1] to [11] which is exposed using an electron beam, an X ray, and EUV light.

[18] The pattern forming method described in [13] where an electron beam, an X ray, or EUV light is used as an exposure light source.

According to the present invention, it is possible to provide an actinic ray-sensitive or radiation-sensitive resin composition where high sensitivity, high resolution, excellent shape, and excellent line edge roughness are satisfied at the same time in lithography where an electron beam, an X ray, or EUV light is particularly used as the exposure light source, and an actinic ray-sensitive or radiation-sensitive film and a pattern forming method each using the same.

DESCRIPTION OF THE PREFERRED EMBODIMENTS

Hereinafter, embodiments of the present invention will be described.

Here, in denoting of a group (atomic group) in the specifications, in the denotation where substituted or unsubstituted is not specified, both not having of a substituent and having a substituent are included. For example, "an alkyl group" includes not only an alkyl group which has no substituent (unsubstituted alkyl group) but also an alkyl group which has a substituent (substituted alkyl group).

"Actinic light ray" or "radiation" in the specifications has the meaning of, for example, a bright line spectrum of a mercury lamp, far ultraviolet rays which are typified by an excimer laser, extreme-ultraviolet rays (EUV light), an X ray, soft X ray, an electron beam, or the like. In addition, "light" in the present invention has the meaning of actinic rays or radiation.

In addition, unless otherwise stated, "exposure" in the specifications includes not only exposure by a mercury lamp, far ultraviolet rays which are typified by an excimer laser, an X ray, EUV light or the like but drawing using a particle beam such as an electron beam or an ion beam is also included as exposure.

The actinic ray-sensitive or radiation-sensitive resin composition of the present invention contains a resin (P), which includes a repeating unit (A) having an ionic structural moiety which generates an acid anion in a side chain of the resin by being decomposed due to irradiation with actinic rays or radiation and which is represented by at least any of the general formulae (I) to (III) which will be described later, a repeating unit (B) which has a proton acceptor moiety, and a repeating unit (C) with a group which generates an alkali soluble group by being decomposed by the action of an acid. Due to this, it is possible to satisfy high sensitivity, high resolution, excellent shape and superior line edge roughness at the same time.

The actinic ray-sensitive or radiation-sensitive resin composition according to the present invention is, for example, a positive type composition and typically is a positive type resist composition. Below, the configuration of the composition will be described.

[1] Resin (P)

[Repeating Unit (A)]

The repeating unit (A) is a repeating unit having an ionic structural moiety which generates an acid anion in a side chain of the resin by being decomposed due to irradiation of actinic rays or radiation and is a repeating unit which is represented by any of the general formulae (I) to (III) described below.

[Chem. 4]

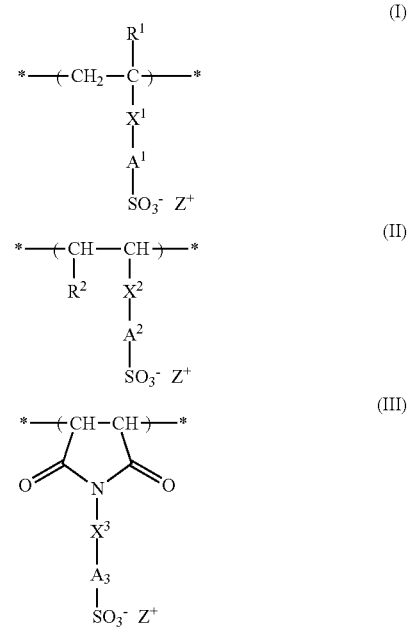

In general formulae (I) to (III),

R$^1$ represents a hydrogen atom, an alkyl group, a cycloalkyl group, a hydroxymethyl group, an alkoxymethyl group, a halogen atom, or a cyano group.

R$^2$ represents —COOR$^{11}$ or —CON(R$^{12}$)(R$^{13}$). R$^{11}$, R$^{12}$, and R$^{13}$ each independently represent a hydrogen atom, an alkyl group, a cycloalkyl group, an alkenyl group, an aryl group, or an aralkyl group. R$^{12}$ and R$^{13}$ may form a ring with a nitrogen atom by being bonded.

X$^1$, X$^2$, and X$^3$ each independently represent a single bond or a divalent linking group.

A$^1$, A$^2$, and A$^3$ each independently represent a divalent linking group which does not include a fluorine atom.

Z$^+$ represents an onium cation.

The general formulae (I) to (III) will be described in detail.

In the general formula (I), R$^1$ represents a hydrogen atom, an alkyl group, a cycloalkyl group, a hydroxymethyl group, an alkoxymethyl group, a halogen atom, or a cyano group. In a case where R$^1$ is an alkyl group, R$^1$ may be a linear shape or a branched shape and the carbon number is preferably 1 to 10 and more preferably 1 to 6, and a methyl group is particularly preferable. In a case where $R^1$ is a cycloalkyl group, a 5-membered ring or a 6-membered ring is preferable. The carbon number is preferably 3 to 10 and more preferably 5 to 8. In a case where $R^1$ is an alkoxymethyl group, the carbon number is preferably 1 to 10 and more preferably 1 to 6, and a methoxymethyl group is particularly preferable. In a case of a halogen atom, any of fluorine, chlorine, or bromine is preferable.

As a specific group of $R^1$, a hydrogen atom, a methyl group, a hydroxymethyl group, a methoxymethyl group, a fluorine atom, a chlorine atom, a bromine atom, or a cyano group is preferable, a hydrogen atom, a methyl group, or a hydroxymethyl group are more preferable, and a hydrogen atom or a methyl group is particularly preferable.

In the general formula (II), $R^2$ represents —COOR$^{11}$ or —CON($R^{12}$)($R^{13}$), $R^{11}$, $R^{12}$, and $R^{13}$ each independently represent a hydrogen atom, an alkyl group, a cycloalkyl group, an alkenyl group, an aryl group, or an aralkyl group. A preferable example where $R^{11}$, $R^{12}$, and $R^{13}$ are alkyl groups or cycloalkyl groups is the same as the alkyl groups and the cycloalkyl groups which have been described previously as $R^1$ and $R^2$. As the alkenyl group, the carbon number is preferably 2 to 10 and more preferably 2 to 6, and examples thereof include an ethenyl or a propenyl group, and the like. In a case of an aryl group, the carbon number is preferably 6 to 12 and more preferably 6 to 10, and examples thereof include a phenyl group, a naphthyl group, p-methoxyphenyl, and the like. In a case of the aralkyl group, the carbon number is preferably 7 to 12 and more preferably 7 to 10, and there specifically are a benzyl group, 2-phenylethyl, and the like. $R^{12}$ and $R^{13}$ may form a ring with a nitrogen atom by being bonded, and in this case, a 5-membered ring or a 6-membered ring is preferable. The ring containing nitrogen which is formed may be aromatic and non-aromatic, and for example, there are a piperidine ring, a pyrrolidine ring, a pyrrole ring, and the like. $R^2$ is preferably a carboxyl group or an alkoxycarbonyl group.

$X^1$, $X^2$, and $X^3$ represent a single bond or a divalent linking group as described above. As the divalent linking group, for example, there are an arylene group, an alkylene group, a cycloalkylene group, —O—, —SO$_2$—, —CO—, —NR$_{21}$—, or a divalent linking group which combine thereof. In a case where $X^1$, $X^2$, and $X^3$ are divalent linking groups, the total carbon number is preferably 20 or less. Here, $R_{21}$ represents a hydrogen atom, an alkyl group, a cycloalkyl group, or an aryl group. A preferable example where $R_{21}$ is an alkyl group, a cycloalkyl group, or an aryl group is the same as $R^1$ or $R^2$.

As the alkylene group of $X^1$ to $X^3$, a carbon number of 1 to 12 is preferable such as a methylene group, an ethylene group, a propylene group, a butylene group, a hexylene group, an octylene group, or a dodecanylene group.

As the cycloalkylene group of $X^1$ to $X^3$, a carbon number of 5 to 8 is preferable such as a cyclopentylene group or a cyclohexylene group.

As the arylene group of $X^1$ to $X^3$, a carbon number of 6 to 14 is preferable such as a phenylene group or a naphthylene group.

The alkylene group, the cycloalkylene group, and the arylene group may or may not further have substituents. As the substituents, for example, there are an alkyl group, a cycloalkyl group, an aryl group, an amino group, an amide group, a ureido group, a urethane group, a hydroxy group, a carboxy group, a halogen atom, an alkoxy group, a thioether group, an acyl group, an acyloxy group, an alkoxycarbonyl group, a cyano group, and a nitro group.

$A^1$ to $A^3$ each independently represent a divalent linking group which does not include a fluorine atom as described above.

In a case where $A^1$ to $A^3$ includes a fluorine atom, since the fluorine atom is a group which strongly withdraws electrons, the strength of the acid of the sulfonic acid which is generated rises excessively, negativization (a phenomenon where a cross-linking reaction occurs in a portion of the resin due to the acid which is generated and solubility is reduced) occurs, and there is an adverse effect on the sensitivity, the resolving power, the line edge roughness, and the like. This tendency is particularly a problem in a case where the group decomposed by the acid which is included in the general formula (C) and is presented as a —OY group is acetal. Accordingly, the divalent linking group which is represented by $A^1$ to $A^3$ preferably does not have a group which strongly attracts electrons nor the fluorine atom and more preferably is formed from only carbon atoms and hydrogen atoms.

As the divalent linking group, for example, there are an alkylene group, an arylene group, a cycloalkylene group, and the like.

As the alkylene group, a carbon number of 1 to 6 is preferable, and specifically, for example, there are methylene, ethylene, propylene, and the like.

As the arylene group, a carbon number of 6 to 10 is preferable, and specifically, for example, there are phenylene, naphthylene, and the like.

As the cycloalkylene group, a carbon number of 3 to 8 is preferable, and specifically, for example, there are cyclopentylene, a cyclohexylene group, and the like.

As the divalent linking group, an alkylene group and an arylene group are preferable, an arylene group is more preferable, and an unsubstituted phenylene group is even more preferable.

Here, "a group which strongly attracts electrons" in the specifications is defined as "a group where the σm Hammett value is +0.2 or more" in a case where, for example, $A^1$ to $A^3$ are alkylene groups and in the case of arylene groups.

As the onium cation which is represented by $Z^+$, a sulfonium cation or an iodonium cation is preferable, and in one aspect, the sulfonium cation is more preferable. A configuration where the sulfonium cation and the iodonium cation which is represented by Z+ is represented by, for example, the general formulae (ZI) or (ZII) below is preferable.

[Chem. 5]

(ZI)

(ZII)

In the general formula (ZI) above, $R_{201}$, $R_{202}$, and $R_{203}$ each independently represent an organic group. The carbon number of the organic group of $R_{201}$, $R_{202}$, and $R_{203}$, is typically 1 to 30 and is preferably 1 to 20.

In addition, a ring structure may be formed (including a condensed ring) by bonding two out of $R_{201}$ to $R_{203}$, and an oxygen atom, a sulfur atom, an ester bond, an amide bond, or a carbonyl group may be included in the ring. As the group which is formed by the bonding of two out of $R_{201}$ to $R_{203}$, there can be the examples of an alkylene group (for example, a butylene group and a pentylene group) and the like.

As the organic groups of $R_{201}$, $R_{202}$, and $R_{203}$, for example, there can be the examples of the groups which correspond to the groups which are represented in (ZI-1), (ZI-2), and (ZI-3) which are described below as groups which are preferable as groups which are represented by the general formula (ZI).

The (ZI-1) group is a group with arylsulfonium as a cation where at least one of $R_{201}$ to $R_{203}$ in the general formula (ZI) above is an aryl group.

All of the $R_{201}$ to $R_{203}$ may be aryl groups or a portion of $R_{201}$ to $R_{203}$ may be aryl groups with the remainder being alkyl groups or a monovalent aliphatic hydrocarbon ring group.

For example, it is possible that there is a group which is equivalent to triarylsulfonium, alkyldiarylsulfonium, aryldialkylsulfonium, diarylcycloalkyl sulfonium, and aryldicycloalkyl sulfonium.

As the aryl group in the arylsulfonium, a phenyl group and a naphthyl group are preferred and a phenyl group is more preferable. The aryl group may be an aryl group which has a heterocyclic structure with an oxygen atom, a nitrogen atom, a sulfur atom or the like. As the heterocyclic structure, there are the examples of structures such as pyrrole, furan, thiophene, indole, benzofuran, and benzothiophene.

In a case where arylsulfonium has two or more aryl groups, the two or more aryl groups may be the same or may be different.

The alkyl group or the monovalent aliphatic hydrocarbon ring group which the arylsulfonium has as necessary are preferably a linear or branched alkyl group with a carbon number of 1 to 15 and a monovalent aliphatic hydrocarbon ring group with a carbon number of 3 to 15, and for example, there can be the examples of a methyl group, an ethyl group, a propyl group, an n-butyl group, a sec-butyl, a t-butyl group, a cyclopropyl group, a cyclobutyl group, a cyclohexyl group, and the like.

The aryl group, the alkyl group, and the monovalent aliphatic hydrocarbon ring group of $R_{201}$ to $R_{203}$ may have an alkyl group (for example, a carbon number of 1 to 15), a monovalent aliphatic hydrocarbon ring group (for example, a carbon number of 3 to 15), an aryl group (for example, a carbon number of 6 to 14), an alkoxy group (for example, a carbon number of 1 to 15), a halogen atom, a hydroxyl group, and a phenylthio group as a substituent. As a preferable substituent, there are the examples of a linear or branched alkyl group with a carbon number of 1 to 12, a monovalent aliphatic hydrocarbon ring group with a carbon number 3 to 12, a linear, branched, or ring alkoxy group with a carbon number of 1 to 12, and an alkyl group with a carbon number of 1 to 4 and an alkoxy group with a carbon number of 1 to 4 are more preferable. The substituent may be substituted at any one of the three of $R_{201}$ to $R_{203}$ and may be substituted at all three. In addition, in a case where $R_{201}$ to $R_{203}$ are aryl groups, it is preferable that the substituent is substituted at the p-position of the aryl group.

As one aspect of the group which is represented by (ZI-1), there is a structure which is represented by the general formula (ZI-1A) below.

[Chem. 6]

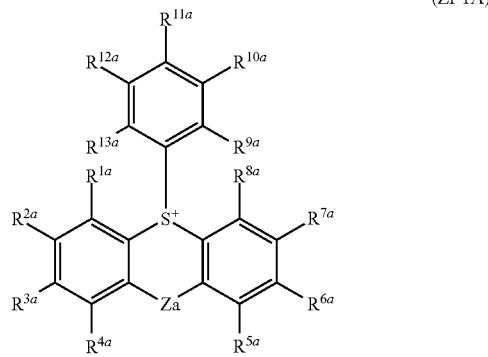

(ZI-1A)

In the general formula (ZI-1A), $R^{1a}$ to $R^{13a}$ each independently represent a hydrogen atom or a substituent and it is preferable that at least one of $R^{1a}$ to $R^{13a}$ be a substituent which includes an alcoholic hydroxyl group.

Za is a single bond or a divalent linking group.

The alcoholic hydroxyl group represents a hydroxyl group which is bonded to a carbon atom of an alkyl group with a chain shape or a ring shape.

In a case where $R^{1a}$ to $R^{13a}$ are substituents which include an alcoholic hydroxyl group, $R^{1a}$ to $R^{13a}$ are represented by —W—Y. Here, Y is an alkyl group with a chain shape or a ring shape which has been substituted with a hydroxyl group and W is a single bond or a divalent linking group.

As the alkyl group with a chain shape or a ring shape of Y, there can be the examples of a methyl group, an ethyl group, a propyl group, an isopropyl group, a n-butyl group, an isobutyl group, a sec-butyl group, a pentyl group, a neopentyl group, a hexyl group, a heptyl group, an octyl group, a nonyl group, a decyl group, a cyclopropyl group, a cyclopentyl group, a cyclohexyl group, an adamantyl group, a norbornyl group, a bornyl group, and the like, an ethyl group, a propyl group, an isopropyl group, a n-butyl group, an isobutyl group and a sec-butyl group are preferable, and an ethyl group, a propyl group, and an isopropyl group are more preferable. It is particularly preferable if Y contains a —CH$_2$CH$_2$OH structure.

W is preferably a single bond or a divalent group where an arbitrary hydrogen atom is replaced with a single bond in an alkoxy group, an acyloxy group, an acylamino group, an alkyl and arylsulfonylamino group, an alkylthio group, an alkylsulfonyl group, an acyl group, an alkoxycarbonyl group, a carbamoyl group, and more preferably, is a single bond or a divalent group where an arbitrary hydrogen atom is replaced with in a single bond, an acyloxy group, an alkylsulfonyl group, an acyl group, and an alkoxycarbonyl group.

In a case where $R^{1a}$ to $R^{13a}$ are substituents which include an alcoholic hydroxyl group, the number of carbon atoms which are included is preferably 2 to 10, more preferably 2 to 6, and even more preferably 2 to 4.

In a case where $R^{1a}$ to $R^{13a}$ are substituents which include an alcoholic hydroxyl group, there may be two or more alcoholic hydroxyl groups. The number of alcoholic hydroxyl groups, which have a substituent including an alcoholic hydroxyl group of $R^{1a}$ to $R^{13a}$, is 1 to 6, is preferably 1 to 3, and even more preferably 1.

The number of alcoholic hydroxyl groups which are included in the compound represented by the general formula (ZI-1A) is from 1 to 10 in total for all of $R^{1a}$ to $R^{13a}$, is preferably from 1 to 6, and more preferably from 1 to 3.

In a case where $R^{1a}$ to $R^{13a}$ do not have an alcoholic hydroxyl group, $R^{1a}$ to $R^{13a}$ are preferably a hydrogen atom, a halogen atom, an alkyl group (including a monovalent aliphatic hydrocarbon ring group), an alkenyl group (including a cycloalkenyl group and a bicycloalkenyl group), an alkynyl group, an aryl group, a cyano group, a carboxyl group, an alkoxy group, an aryloxy group, an acyloxy group, a carbamoyloxy group, an acylamino group, an amino carbonyl amino group, an alkoxycarbonylamino group, an aryloxy carbonyl amino group, a sulfamoylamino group, an alkyl and aryl sulfonyl amino group, an alkylthio group, an arylthio group, a sulfamoyl group, an alkyl and arylsulfonyl group, an aryloxycarbonyl group, an alkoxycarbonyl group, a carbamoyl group, an imide group, a silyl group, or an ureido group.

In a case where $R^{1a}$ to $R^{13a}$ do not have an alcoholic hydroxyl group, $R^{1a}$ to $R^{13a}$ are more preferably a hydrogen atom, a halogen atom, an alkyl group (including a monovalent aliphatic hydrocarbon ring group), a cyano group, an alkoxy group, an acyloxy group, an acylamino group, an amino carbonyl amino group, an alkoxycarbonyl amino group, an alkyl and an aryl sulfonyl amino group, alkylthio group, a sulfamoyl group, an alkyl and arylsulfonyl group, an alkoxycarbonyl group, or a carbamoyl group.

Furthermore, in a case where $R^{1a}$ to $R^{13a}$ do not have an alcoholic hydroxyl group, $R^{1a}$ to $R^{13a}$ are particularly preferably a hydrogen atom, an alkyl group (including a monovalent aliphatic hydrocarbon ring group), a halogen atom, or an alkoxy group.

In addition, it is possible for an adjacent two out of $R^{1a}$ to $R^{13a}$ to form a ring by joining together (an aromatic or non-aromatic hydrocarbon ring or heterocyclic ring. This is able to form a polycyclic condensed ring by being further combined. For example, there are a benzene ring, a naphthalene ring, an anthracene ring, a phenanthrene ring, a fluorene ring, a triphenylene ring, a naphthacene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an indolizine ring, an indole ring, a benzofuran ring, a benzothiophene ring, an isobenzofuran ring, a quinolizine ring, a quinoline ring, a phthalazine ring, a naphthyridine ring, a quinoxaline ring, a quinoxazoline ring, an isoquinoline ring, a carbazole ring, a phenanthridine ring, an acridine ring, a phenanthroline ring, a thianthrene ring, a chromene ring, a xanthene ring, a phenoxathiin ring, a phenothiazine ring, or a phenazine ring).

In the general formula (ZI-1A), at least one out of $R^{1a}$ to $R^{13a}$ includes an alcoholic hydroxyl group and preferably one out of $R^{9a}$ to $R^{13a}$ includes an alcoholic hydroxyl group.

Za represents a single bond or a divalent linking group, and as the divalent linking group, for example, there are an alkylene group, an arylene group, a carbonyl group, a sulfonyl group, a carbonyloxy group, a carbonyl amino group, a sulfonyl amide group, an ether group, a thioether group, an amino group, a disulfide group, an acyl group, an alkylsulfonyl group, —CH=CH—, —C≡C—, an amino carbonyl amino group, an amino sulfonylamino group, and the like, and may have a substituent. The substituent is the same as the substituent which is shown in $R^{1a}$ to $R^{13a}$. Za is preferably a substituent which does not attract electrons such as a single bond, an alkylene group, an arylene group, an ether group, a thioether group, an amino group, —CH=CH—, —C≡C—, an amino carbonyl amino group, or an amino sulfonylamino group, and is more preferably a single bond, an ether group, or a thioether group, and particularly preferably a single bond.

Next, the (ZI-2) group will be described.

The (ZI-2) group is a group where $R_{201}$ to $R_{203}$ in the general formula (ZI) each independently represent an organic group which does not have an aromatic ring. Here, the aromatic ring includes an aromatic ring which contains a hetero atom.

The organic group which does not include an aromatic ring as the $R_{201}$ to $R_{203}$ typically has a carbon number 1 to 30 and preferably a carbon number of 1 to 20.

$R_{201}$ to $R_{203}$ each independently represent preferably an alkyl group, a monovalent aliphatic hydrocarbon ring group, an allyl group, or a vinyl group, and more preferably, a linear or branched 2-oxo alkyl group, 2-oxo aliphatic hydrocarbon ring group, or an alkoxycarbonyl methyl group, and particularly preferably a chain or branched 2-oxo aliphatic hydrocarbon ring group.

As an alkyl group or an aliphatic hydrocarbon ring group of $R_{201}$ to $R_{203}$, there can be the example of a linear or branched alkyl group with a carbon number of 1 to 10 (for example, a methyl group, an ethyl group, a propyl group, a butyl group, a pentyl group, or a norbornyl group). As the alkyl group, more preferably, there can be the examples of a 2-oxo alkyl group and an alkoxycarbonyl methyl group. As the aliphatic hydrocarbon ring group, more preferably, it is possible that there is a 2-oxo aliphatic hydrocarbon ring group.

The 2-oxo alkyl group may be either a linear or branched, and preferably, it is possible that there is a group described above with >C=O in the 2 position of the alkyl group.

The 2-oxo aliphatic hydrocarbon ring group preferably is possible to be a group described above with >C=O in the 2 position of the aliphatic hydrocarbon ring group.

As the alkoxy group of the alkoxycarbonyl methyl group, there can be the example of an alkoxy group with a carbon number of 1 to 5 (a methoxy group, an ethoxy group, a propoxy group, a butoxy group, or a pentoxy group).

$R_{201}$ to $R_{203}$ may be further substituted by a halogen atom, an alkoxy group (for example, a carbon number of 1 to 5), a hydroxyl group, a cyano group, or a nitro group.

Next, (ZI-3) group will be described.

(ZI-3) group is a group which is represented by the general formula (ZI-3) below and a group which has a phenacyl sulfonium structure.

[Chem. 7]

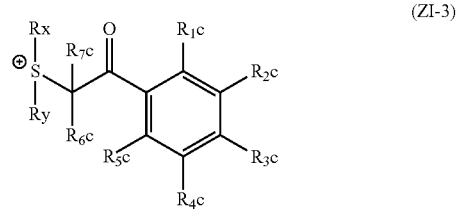

(ZI-3)

In the general formula (ZI-3), $R_{1c}$ to $R_{5c}$ each independently represent a hydrogen atom, an alkyl group, a monovalent aliphatic hydrocarbon ring group, an alkoxy group, or a halogen atom.

$R_{6c}$ and $R_{7c}$ each independently represent a hydrogen atom, an alkyl group, or a monovalent aliphatic hydrocarbon ring group.

$R_x$ and $R_y$ each independently represent an alkyl group, a monovalent aliphatic hydrocarbon ring group, an allyl group, and a vinyl group.

Two or more of $R_{1c}$ to $R_{5c}$, and $R_{6c}$ and $R_{7c}$, $R_x$ and $R_y$ may form a ring structure by being bonded to each other, and the ring structure may include an oxygen atom, a sulfur atom, an ester bond, or an amide bond. There can be the examples of a butylene group, a pentylene group, and the like as a group which is formed by bonding two or more of $R_{1c}$ to $R_{5c}$, and $R_{6c}$ and $R_{7c}$, and $R_x$ and $R_y$.

The alkyl group of $R_{1c}$ to $R_{7c}$ may be either a linear or branched, and for example, and there can be the examples of an alkyl group with a carbon number of 1 to 20, and more preferably, a branched alkyl group with a linear with a carbon number of 1 to 12 (for example, a methyl group, an ethyl group, a linear or branched propyl group, a chain or branched butyl group, and a chain or branched pentyl group).

In addition, as the monovalent aliphatic hydrocarbon ring group of $R_{1c}$ to $R_{7c}$, there may be a single ring type or a polycyclic type, and for example, it is possible that there is a monovalent aliphatic hydrocarbon ring group with a carbon number of 3 to 8 (for example, a cyclopentyl group and a cyclohexyl group).

As the alkoxy group of $R_{1c}$ to $R_{5c}$, there may be either a linear, branched, or ring shape, and for example, there can be the examples of an alkoxy group with a carbon number of 1 to 10, and more preferably, a linear or branched alkoxy group with a carbon number of 1 to 5 (for example, a methoxy group, an ethoxy group, a chain or branched propoxy group, a linear or branched butoxy group, or a linear or branched pentoxy group) or an alkoxy group with a ring structure with a carbon number of 3 to 8 (for example, a cyclopentyloxy group or a cyclohexyloxy group).

Preferably, any of $R_{1c}$ to $R_{5c}$ is a linear or branched alkyl group, a monovalent aliphatic hydrocarbon ring group, or a linear, branched, or ring alkoxy group, and more preferably, the total number of carbon atoms of $R_{1c}$ to $R_{5c}$ is 2 to 15. Due to this, solvent solubility is further improved and the generation of particles during storage is suppressed.

An alkyl group and a monovalent aliphatic hydrocarbon ring group of $R_x$ and $R_y$ is possible to be the alkyl group and the monovalent aliphatic hydrocarbon ring group in the same manner as $R_{1c}$ to $R_{7c}$, and a 2-oxo alkyl group, a 2-oxo aliphatic hydrocarbon ring group, or an alkoxycarbonyl methyl group are more preferable.

The 2-oxo alkyl group and the 2-oxo aliphatic hydrocarbon ring group is possible to be the >C=0 in the 2 position of the alkyl group and the monovalent aliphatic hydrocarbon ring of $R_{1c}$ to $R_{7c}$.

The alkoxy group in the alkoxycarbonyl methyl group is possible to be the alkoxy group in the same manner in $R_{1c}$ to $R_{5c}$.

$R_x$ and $R_y$ are preferably an alkyl group and a monovalent aliphatic hydrocarbon ring group with a carbon number of 4 or more, more preferably 6 or more, and even more preferably an alkyl group and a monovalent aliphatic hydrocarbon ring group with a carbon number of 8 or more.

Next, the general formula (ZII) will be described.

In the general formula (ZII), $R_{204}$ and $R_{205}$ each independently represent an aryl group, an alkyl group, or an aliphatic hydrocarbon ring group.

As specific examples of the aryl group, the alkyl group, or the aliphatic hydrocarbon ring group of $R_{204}$ and $R_{205}$, there can be the examples of the same aryl group, alkyl group, or aliphatic hydrocarbon ring group which were given as examples with the general formula (ZI-1) above.

The aryl group, the alkyl group, or the aliphatic hydrocarbon ring group of $R_{204}$ and $R_{205}$ may have or not have a substituent. As the substituent which the aryl group, the alkyl group, or the aliphatic hydrocarbon ring group of $R_{204}$ and $R_{205}$ may have, for example, there can be the examples of an alkyl group (for example, a carbon number of 1 to 15), an aliphatic hydrocarbon ring group (for example, a carbon number of 3 to 15), an aryl group (for example, a carbon number of 6 to 15), an alkoxy group (for example, a carbon number of 1 to 15), a halogen atom, a hydroxyl group, a phenylthio group, or the like.

With regard to the repeating units of general formula (I), general formula (II), and general formula (III), the followings are exemplifications of sulfonic units which are generated by separation of a cation which is represented by $Z^+$ due to the irradiation with actinic rays or radiation.

[Chem. 8]

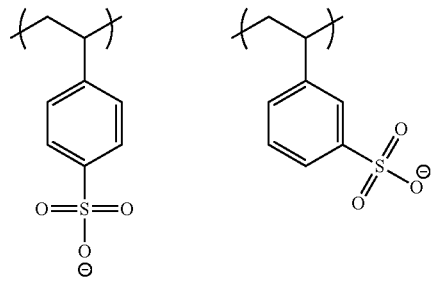

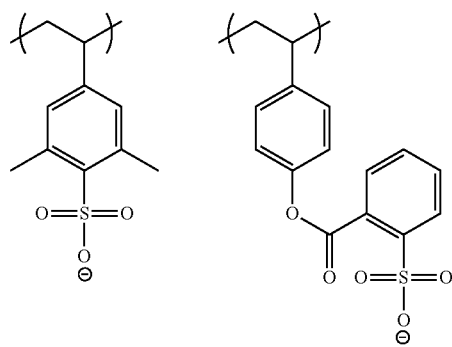

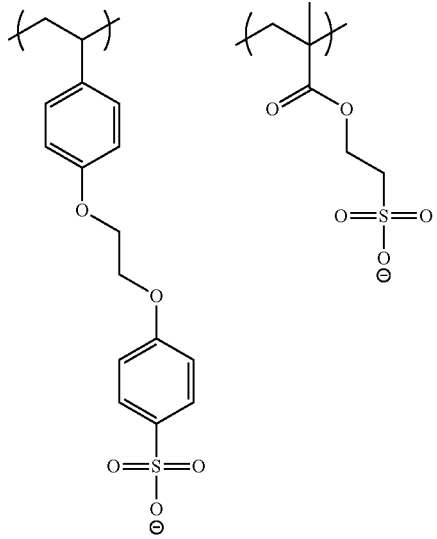

-continued
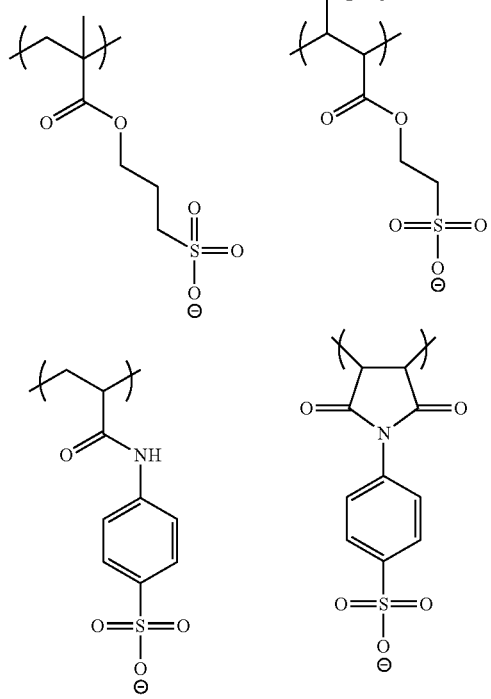
Specific examples of the onium cation which is represented by Z+ in general formula (I), general formula (II), and general formula (III) are shown below.
[Chem. 9]
(Z-1)
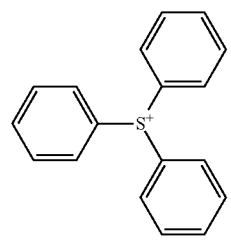
(Z-2)
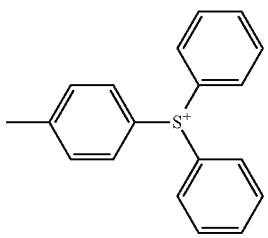
(Z-3)
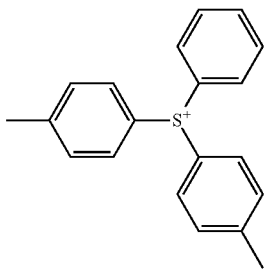
(Z-4)
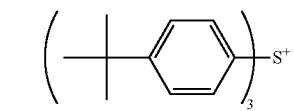
(Z-5)
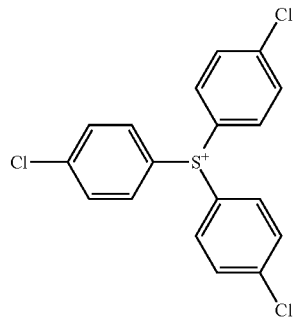
(Z-6)
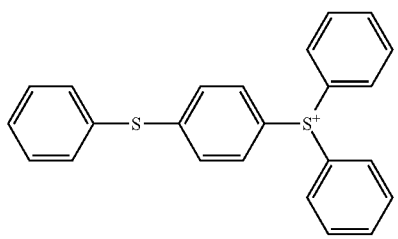
(Z-7)
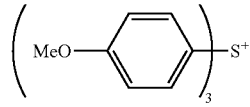
(Z-8)
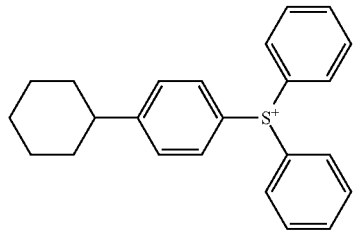
(Z-9)
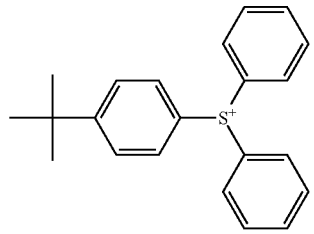
(Z-10)
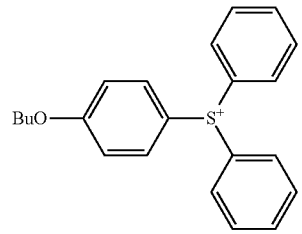

(Z-11) 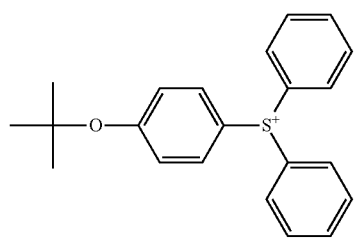
(Z-12) 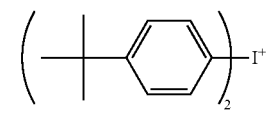
(Z-13) 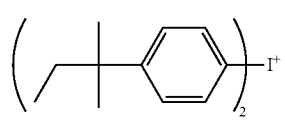
(Z-14) 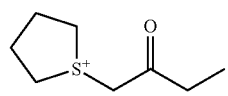
(Z-15) 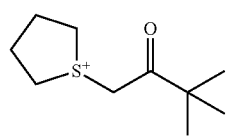
(Z-16) 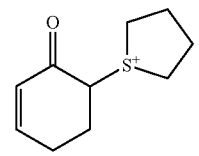
(Z-17) 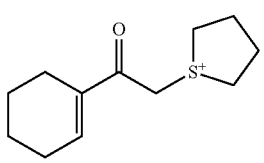
(Z-18) 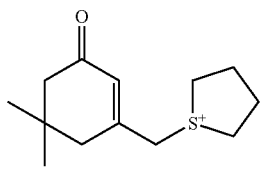
(Z-19) 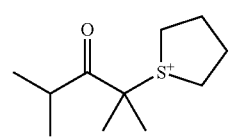
(Z-20) 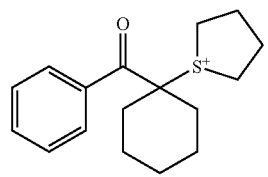
(Z-21) 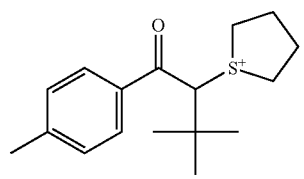
(Z-22) 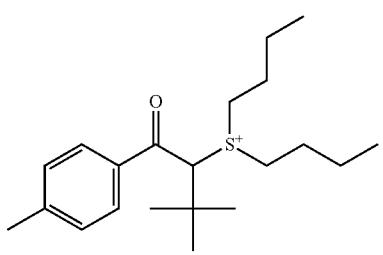
(Z-23) 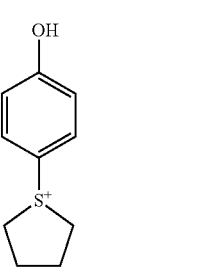
(Z-24) 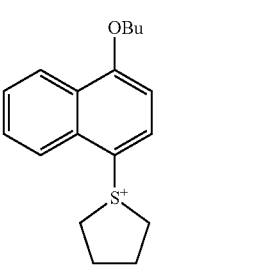
(Z-25) 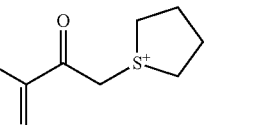
(Z-26) 
(Z-27) 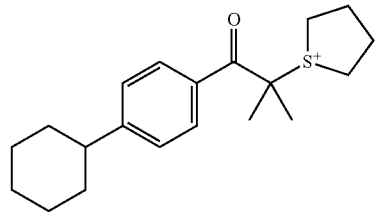

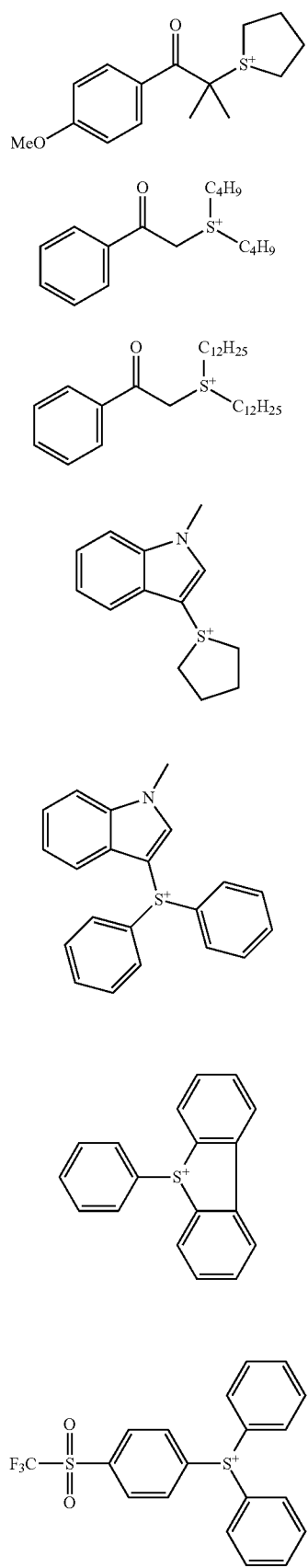
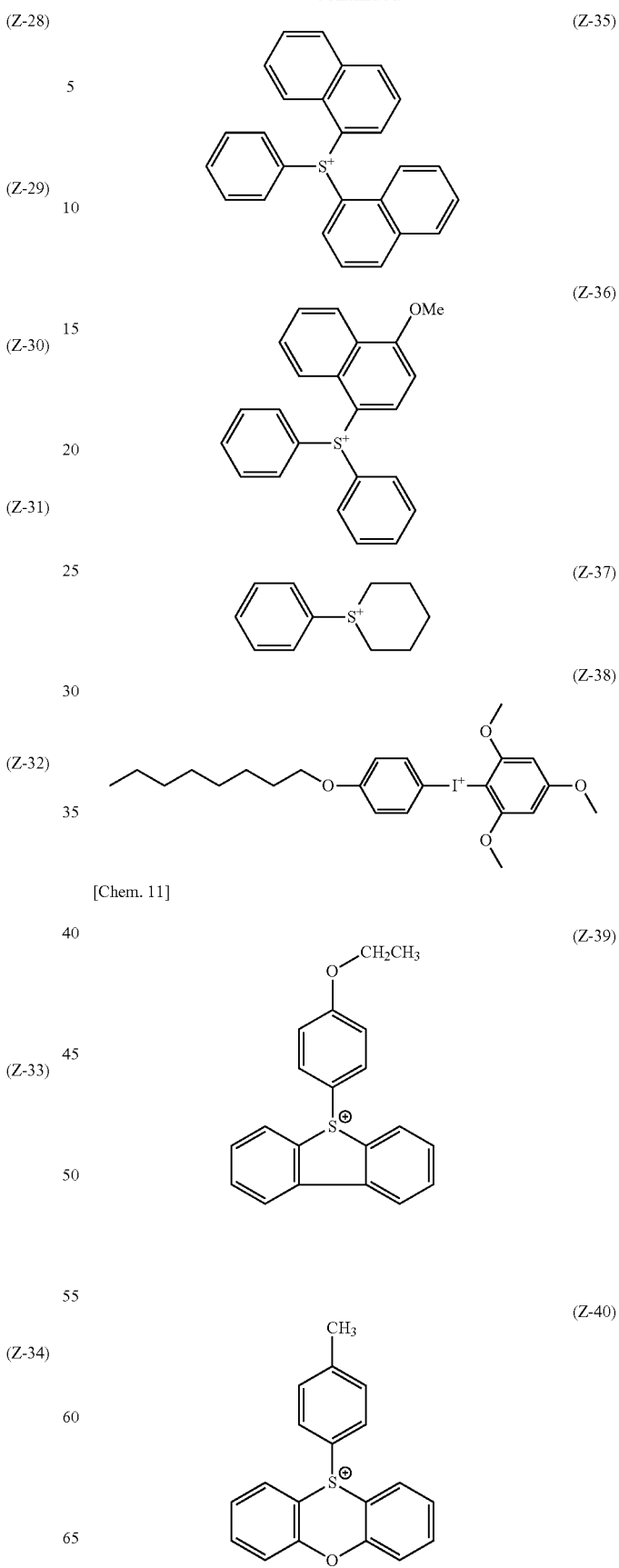

-continued
(Z-41)
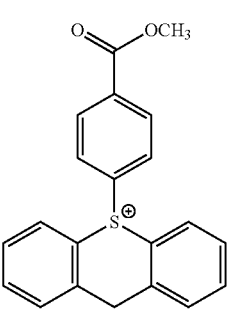
(Z-42)
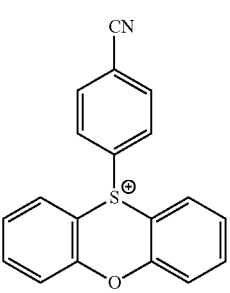
(Z-43)
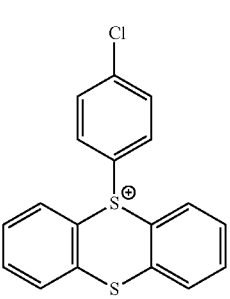
(Z-44)
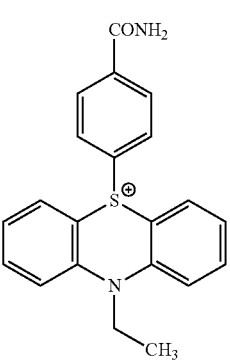
(Z-45)
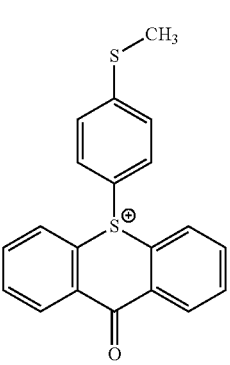
-continued
(Z-46)
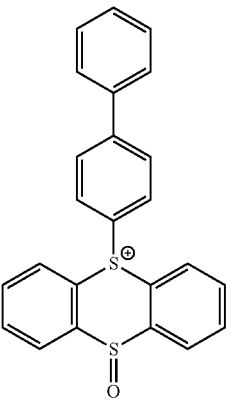
(Z-47)
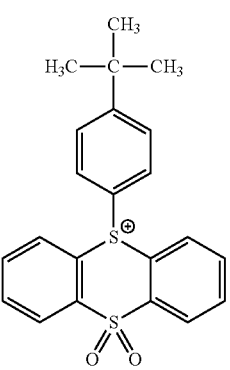
(Z-48)
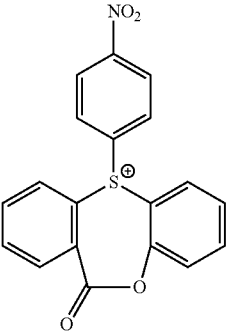
(Z-49)

-continued
(Z-50)
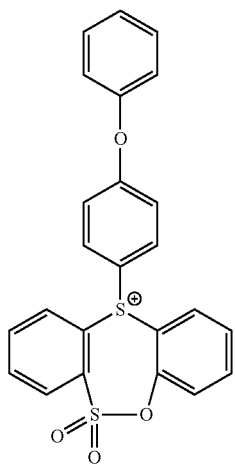
(Z-51)
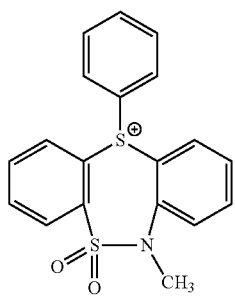
(Z-52)
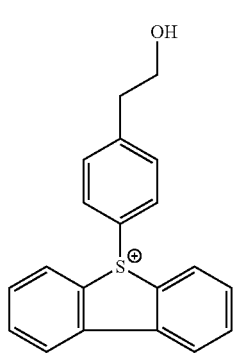
(Z-53)
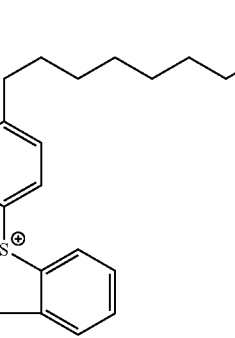
-continued
(Z-54)
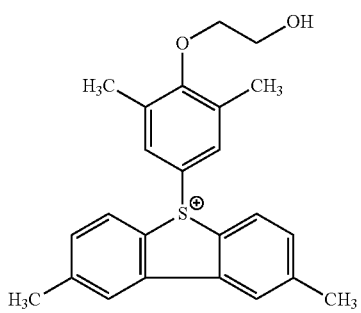
(Z-55)
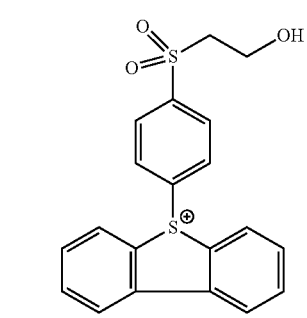
(Z-56)
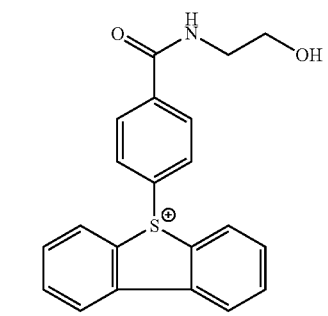
(Z-57)
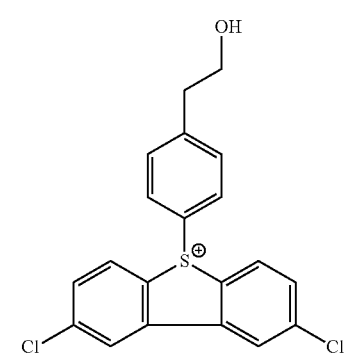

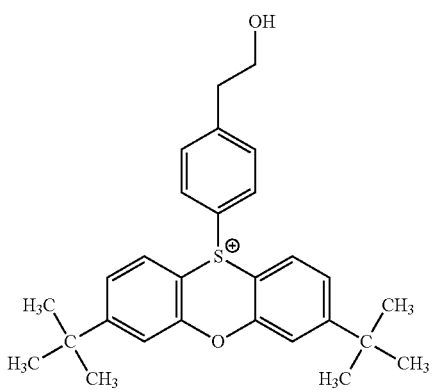

(Z-58)

The content of the repeating unit (A) with regard to all of the repeating units in the resin (P) is preferably in the range of 3 to 20 mol %, is more preferably in the range of 5 to 15 mol %, and is even more preferably in the range of 8 to 12 mol %.

[Repeating Unit (B)]

The repeating unit (B) is a repeating unit with a proton acceptor moiety in a side chain.

The proton acceptor moiety is a group which is able to electrostatically interact with a proton or a functional group with a lone pair of electrons, and for example, there can be the example of a functional group with a microcyclic structure such as a cyclic polyether or a functional group with a nitrogen atom which has a lone pair of electrons where contribution to π conjugation is low. Among these, the functional group with a nitrogen atom which has a lone pair of electrons where contribution to π conjugation is low is particularly preferable. As the nitrogen atom which has a lone pair of electrons where contribution to π conjugation is low, for example, there can be the example of a nitrogen atom with a partial structure which is shown in the general formula below.

[Chem. 12]

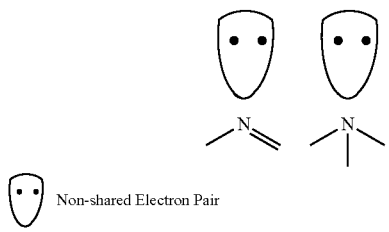

As such a structure with a nitrogen atom, it is possible that there preferably are a tertiary amine, a secondary amine, a primary amine, a heterocyclic structure which contains nitrogen (such as a pyridine, imidazole, pyrazine, or aniline structure), and a heterocyclic structure which contains nitrogen is particularly preferable.

Due to the resin (P) containing the repeating unit (B), the sensitivity and the resolution is particularly superior since a proton acceptor moiety is held in the side chain of the resin (P). This is inferred according to the following reasons, that is, a proton acceptor moiety is not held in the side chain of the polymer in the typical positive resist composition in the related art and a low-molecular compound which has a proton acceptor moiety (for example, there are amines and the like) is added separately. Accordingly, in the positive resist composition in the related art, there are cases where the proton acceptor moiety is dispersed from a non-exposed portion into an exposed portion.

On the other hand, the resin (P) in the present invention is able to prevent the proton acceptor moiety flowing from a non-exposed portion into an exposed portion since the proton acceptor moiety is held in the side chain. It is inferred that as a result, not only is the sensitivity is improved by the acid strength of the exposed portion being relatively increased, but the deprotection contrast between the exposed portion and the non-exposed portion will increase.

In addition, the resin (P) of the present invention improves the line edge roughness due to the dispersion of the proton acceptor moiety being suppressed, and furthermore, since the uneven distribution of the proton acceptor moiety is suppressed, it is possible to suppress the pattern shape being a T-top or tapered shape. As a result, the resin (P) of the present invention has a resolution improving effect due to the improvement in adhesion. Here, in the case where the pattern shape is a T-top shape, the area sharing with the substrate is reduced and a reduction in resolution is caused due to collapsing of the pattern.

It is preferable that the proton acceptor moiety which the repeating unit (B) has be a heterocyclic group which contains nitrogen. The heterocyclic group which contains nitrogen may be an aliphatic ring or an aromatic ring. In addition, the heterocyclic group which contains nitrogen may be a single ring or polycyclic. In addition, a plurality of nitrogen atoms may be included, or furthermore, a hetero atom (for example, an oxygen atom or a sulfur atom) may be included as well as the nitrogen atom.

As specific heterocyclic groups which contains nitrogen, there are the examples of pyridine, pyrrole, imidazole, pyrimidine, pyrazole, pyrazine, pyridazine, quinoline, isoquinoline, acridine, purine, pyrrolidine, piperidine, or imidazoline. Among these, pyridine, pyrrole, imidazole, pyrazole, or purine are preferable and pyridine or imidazole are particularly preferable.

In one aspect, the repeating unit (B) is able to be a repeating unit where a partial structure which is represented by the general formula (B1) below is bonded in the main chain of the polymer.

[Chem. 13]

(B1)

In general formula (B1), the ring structure which includes N represents the heterocyclic group which contains nitrogen.

$L_1$ represents a single bond or a linking group.

* represents a bonding portion with the main chain of the resin (P).

The heterocyclic group which contains nitrogen in general formula (B1) is the same as the heterocyclic group which contains nitrogen described previously and has the same specific examples.

The divalent linking group which is represented by $L_1$ has the same specific examples as the divalent linking group of $X^1$ to $X^3$ in the general formulae (I) to (III) described above.

As specific example of the repeating unit (B), there are the following.
[Chem. 14]
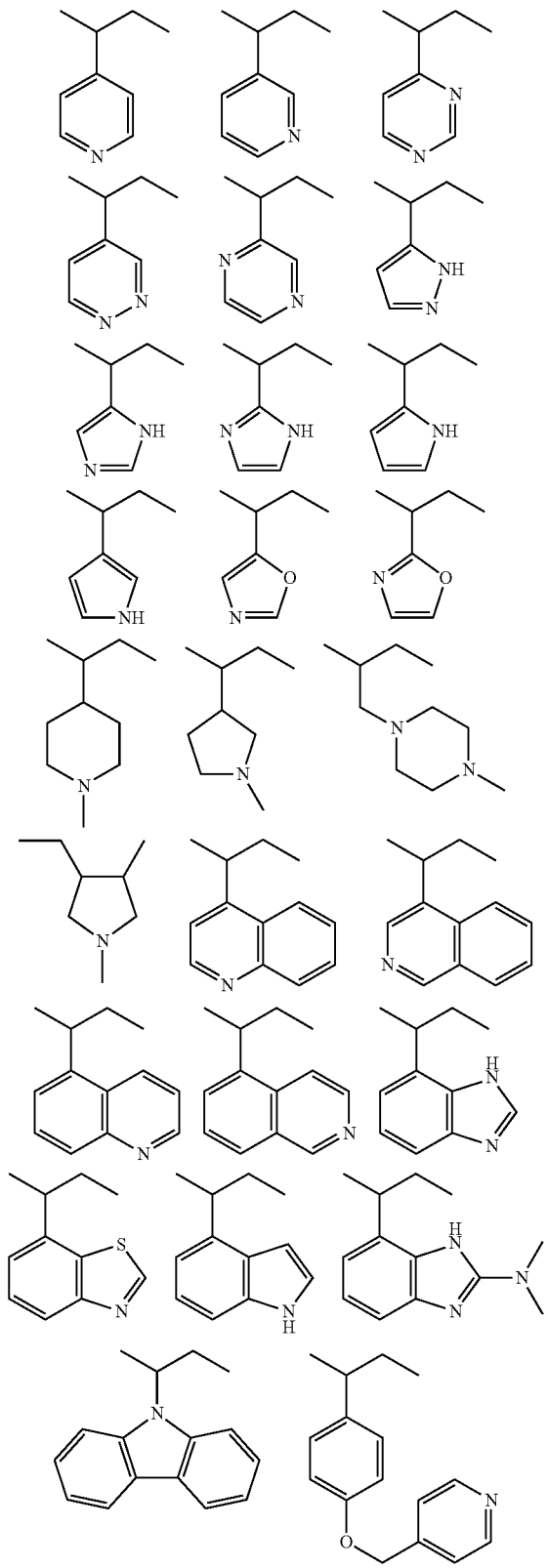
[Chem. 15]
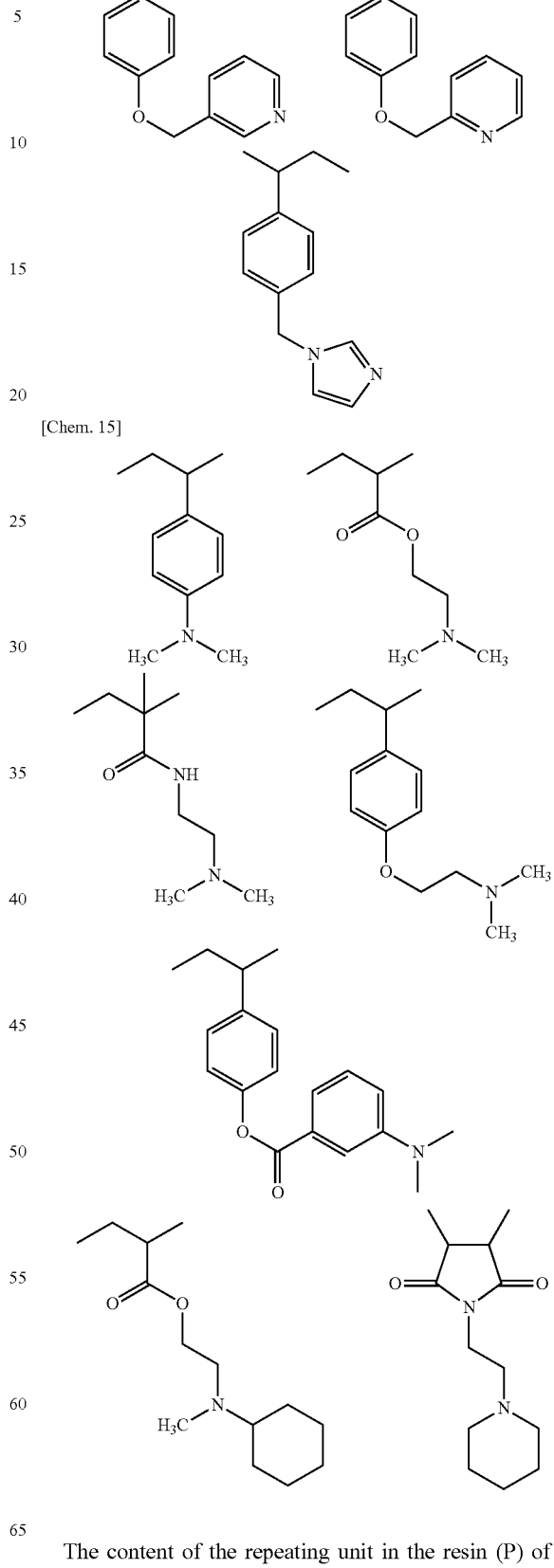
The content of the repeating unit in the resin (P) of the present invention with regard to all of the repeating units is preferably in the range of 0.1 to 30 mol %, is more preferably in the range of 0.5 to 5 mol %, and is particularly preferably in the range of 1 to 4 mol %.

[Repeating Unit (C)]

The resin (P) contains the repeating unit (C) which includes a group which generates an alkali soluble group by being decomposed by the action of an acid (referred to below as "acid decomposable group").

As the alkali soluble group, there are the examples of a phenolic hydroxyl group, a carboxyl group, a fluorinated alcohol group, a sulfonic acid group, a sulfonamide group, a sulfonylimide group, an (alkyl sulfonyl)(alkyl-carbonyl)methylene group, an (alkyl sulfonyl)(alkyl carbonyl)imide group, a bis(alkyl-carbonyl)methylene group, a bis(alkyl-carbonyl)imide group, a bis(alkylsulfonyl)methylene group, a bis(alkyl-sulfonyl)imide group, a tris(alkyl-carbonyl)methylene group, a tris(alkyl-sulfonyl)methylene group, or the like.

As a preferable alkali soluble group, there are the examples of a phenolic hydroxyl group, a carboxyl group, a fluorinated alcohol group (preferably, hexafluoroisopropanol), or a sulfonic acid group.

A preferable group for the acid decomposable group is a group where the hydrogen atom of the alkali soluble group is desorbed by acid.

As the group which is desorbed by acid, for example, there can be the examples of —C($R_{36}$)($R_{37}$)($R_{38}$), —C($R_{01}$)($R_{02}$)(OR$_{39}$), —C(=O)—O—C($R_{36}$)($R_{37}$)($R_{38}$), —C($R_{01}$)($R_{02}$)—C(=O)—O—C($R_{36}$)($R_{37}$)($R_{38}$), —CH($R_{36}$)(Ar), and the like.

In the general formulae, $R_{36}$ to $R_{39}$ each independently represent an alkyl group, a monovalent aliphatic hydrocarbon ring group, a monovalent aromatic ring group, a group where an alkylene group and a monovalent aromatic ring group are combined, or an alkenyl group. A ring may be formed by the bonding of $R_{36}$ and $R_{37}$.

$R_{01}$ and $R_{02}$ each independently represent a hydrogen atom, an alkyl group, a monovalent aliphatic hydrocarbon ring group, a monovalent aromatic ring group, a group where an alkylene group and a monovalent aromatic ring group are combined, or an alkenyl group.

Ar represents a monovalent aromatic ring group.

The alkyl group of $R_{36}$ to $R_{39}$ and $R_{01}$ and $R_{02}$ is preferably an alkyl group with a carbon number of 1 to 8, and for example, there can be the examples of a methyl group, an ethyl group, a propyl group, an n-butyl group, a sec-butyl, a hexyl group, an octyl group, or the like.

The monovalent aliphatic hydrocarbon ring group of $R_{36}$ to $R_{39}$ and $R_{01}$ and $R_{02}$ may be a single ring type or a polycyclic type. As a single ring type, a monovalent aliphatic hydrocarbon ring group with a carbon number of 3 to 8 is preferable, and for example, there can be the examples of a cyclopropyl group, a cyclobutyl group, a cyclopentyl group, a cyclohexyl group, a cyclooctyl group, or the like. As the polycyclic type, a monovalent aliphatic hydrocarbon ring group with a carbon number of 6 to 20 is preferable, and for example, there can be the examples of an adamantyl group, a norbornyl group, an isobornyl group, a camphanyl group, a dicyclopentyl group, an α-pinel group, a tricyclodecanyl group, a tetracyclododecyl group and an androstanyl group. Here, a portion of the carbon atoms in the monovalent aliphatic hydrocarbon ring group may be substituted by a hetero atom such as an oxygen atom.

The monovalent aromatic ring group of $R_{36}$ to $R_{39}$, $R_{01}$ and $R_{02}$, and Ar is preferably a monovalent aromatic ring group with a carbon number of 6 to 10, and for example, there can be the examples of a divalent aromatic ring group which includes an aryl group such as a phenyl group, a naphthyl group, and an anthryl group, or a hetero ring such as thiophene, furan, pyrrole, benzothiophene, benzofuran, benzopyrrole, triazine, imidazole, benzimidazole, triazole, thiadiazole, and thiazole.

As the group of $R_{36}$ to $R_{39}$ and $R_{01}$ and $R_{02}$ where an alkylene group and a monovalent aromatic ring group are combined, an aralkyl group with a carbon number of 7 to 12, and for example, there can be the examples of a benzyl group, a phenethyl group, a naphthylmethyl group, and the like.

As the alkenyl group of $R_{36}$ to $R_{39}$ and $R_{01}$ and $R_{02}$, an alkenyl group with a carbon number of 2 to 8 is preferable, and for example, there can be the examples of a vinyl group, an allyl group, a butenyl group, a cyclohexenyl group, and the like.

A ring which is formed by $R_{36}$ and $R_{37}$ by bonding may be a single ring type or a polycyclic type. As a single ring type, an aliphatic hydrocarbon ring structure with a carbon number 3 to 8 is preferred, and for example, there can be the examples of a cyclopropane structure, a cyclobutane structure, a cyclopentane structure, a cyclohexane structure, a cycloheptane structure, a cyclooctane structure, and the like. As the polycyclic type, an aliphatic hydrocarbon ring structure with a carbon number of 6 to 20 is preferable, and for example, there can be the examples of an adamantane structure, a norbornane structure, a dicyclopentane structure, a tricyclodecane structure, a tetracyclododecane structure, and the like. Here, a portion of the carbon atoms in the aliphatic hydrocarbon ring structure may be substituted using a hetero atom such as an oxygen atom.

Each of the groups above as $R_{36}$ to $R_{39}$, $R_{01}$ and $R_{02}$, and Ar may have a substituent, and as the substituent, there can be the examples of, for example, an alkyl group, a monovalent aliphatic hydrocarbon ring group, an aryl group, an amino group, an amide group, a ureido group, a urethane group, a hydroxyl group, a carboxyl group, a halogen atom, an alkoxy group, a thioether group, an acyl group, an acyloxy group, an alkoxycarbonyl group, a cyano group, a nitro group, and the like, and the carbon number of the substituent is preferably 8 or less.

In one aspect, the repeating unit (C) is a repeating unit which is represented by the general formula (V) below.

[Chem. 16]

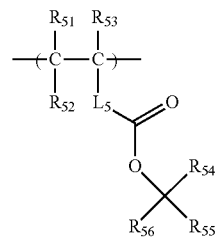

(V)

In the general formula (V), $R_{51}$, $R_{52}$, and $R_{53}$ each independently represent a hydrogen atom, an alkyl group, an aliphatic hydrocarbon ring group, a halogen atom, a cyano group, or an alkoxycarbonyl group.

$L_5$ represents a single bond or a divalent linking group.

$R_{54}$ represents an alkyl group and $R_{55}$ and $R_{56}$ each independently represent a hydrogen atom, an alkyl group, a monovalent aliphatic hydrocarbon ring group, or a monovalent aromatic ring group. However, $R_{55}$ and $R_{56}$ are not hydrogen atoms at the same time. $R_{55}$ and $R_{56}$ may form a ring by being bonded to each other.

In the general formula (V), $R_{52}$ may form a ring by bonding with $L_5$ (preferably, a 5-membered or a 6-membered ring) and $R_{52}$ in this case represents an alkyl group and $L_5$ represents a trivalent linking group.

$R_{55}$ and $R_{56}$ may form a ring by being bonded to each other.

The general formula (V) will be described in further detail.

As the alkyl group of $R_{51}$ to $R_{53}$ in the general formula (V), preferably, there are the examples of an alkyl group with a carbon number of 20 or less such as a methyl group, an ethyl group, a propyl group, an isopropyl group, a n-butyl group, a sec-butyl group, a hexyl group, a 2-ethylhexyl group, an octyl group, and a dodecyl group which may have a substituent, more preferably an alkyl group with a carbon number of 8 or less, and particularly preferably, there is an alkyl group with a carbon number of 3 or less.

The alkyl group which is included in the alkoxycarbonyl group is preferably the same as the alkyl group in $R_{51}$ to $R_{53}$ above.

As the monovalent aliphatic hydrocarbon ring group, there is a monovalent aliphatic hydrocarbon ring group which may be a single ring type or a polycyclic type. Preferably, there is a single ring type monovalent aliphatic hydrocarbon ring group with a carbon number of 3 to 8 such as a cyclopropyl group, a cyclopentyl group, and a cyclohexyl group which may have a substituent.

As the halogen atom, there are the examples of a fluorine atom, a chlorine atom, a bromine atom, and an iodine atom, and a fluorine atom is particularly preferable.

As the substituent which is preferable for each of the groups above, for example, there can be the examples of an alkyl group, an aliphatic hydrocarbon ring group, an aryl group, an amino group, an amide group, a ureido group, a urethane group, a hydroxyl group, a carboxyl group, a halogen atom, an alkoxy group, a thioether group, an acyl group, an acyloxy group, an alkoxycarbonyl group, a cyano group, a nitro group, and the like, and it is preferable that the carbon number of the substituent be 8 or less.

In addition, in a case where $R_{52}$ represents an alkylene group, preferably, there is an alkylene group with a carbon number of 1 to 8 such as a methylene group, an ethylene group, a propylene group, a butylene group, a hexylene group, and an octylene group. An alkylene group with a carbon number of 1 to 4 is more preferable and an alkylene group with a carbon number of 1 or 2 is particularly preferable.

As $R_{51}$ and $R_{53}$ in the general formula (V), a hydrogen atom, an alkyl group, and a halogen atom are more preferable and a hydrogen atom, a methyl group, an ethyl group, a trifluoromethyl group (—$CF_3$), a hydroxymethyl group (—$CH_2$—OH), a chloromethyl group (—$CH_2$—Cl), or a fluorine atom (F) is particularly preferable. As $R_{52}$, a hydrogen atom, an alkyl group, a halogen atom, and an alkylene group (forming a ring with Q) is more preferable, and a hydrogen atom, a methyl group, an ethyl group, a trifluoromethyl group (—$CF_3$), a hydroxymethyl group (—$CH_2$—OH), a chloromethyl group (—$CH_2$—Cl), a fluorine atom (F), a methylene group (forming a ring with $L_5$), and an ethylene group (forming a ring with $L_5$) are particularly preferable.

As the divalent linking group which is represented by $L_5$, there are the examples of an alkylene group, a divalent aromatic ring group, —COO-$L_1$-, —O-$L_1$-, a group where two or more of these are combined, and the like. Here, $L_1$ represents an alkylene group, a divalent aliphatic hydrocarbon ring group, a divalent aromatic ring group, and a group where an alkylene group and a divalent aromatic ring are combined, and may be further substituted by a substituent such as a fluoride atom.

$L_5$ is a single bond, —COO-$L_1$- ($L_1$ is preferably an alkylene group with a carbon number of 1 to 5 and more preferably a methylene group or a propylene group), or a divalent aromatic ring.

As the alkyl group of $R_{54}$, $R_{55}$, and $R_{56}$, a carbon number of 1 to 20 is preferable, a carbon number of 1 to 10 is more preferable, and a carbon number of 1 to 4 such as a methyl group, an ethyl group, an n-propyl group, an isopropyl group, an n-butyl group, an isobutyl group, and a t-butyl group are particularly preferable.

As the monovalent aliphatic hydrocarbon ring group of $R_{55}$ and $R_{56}$, a carbon number of 3 to 20 is preferable and there may be a single ring group such as a cyclopentyl group and a cyclohexyl group or there may be a polycyclic group such as a norbornyl group, an adamantyl group, a tetracyclodecanyl group, and a tetracyclododecanyl group.

As the aryl group which is represented by $R_{55}$ and $R_{56}$, a carbon number of 6 to 20 such as a phenyl group, a naphthyl group, an anthryl group, and a fluorene group and a carbon number of 6 to 15 is more preferable. It is preferable that $R_{55}$ and $R_{56}$ both be aryl groups or one be a hydrogen atom and the other be an aryl group.

As a synthesis method of a monomer which corresponds to the repeating unit which is represented by the general formula (V), application of a synthesis method of a typical ester which contains a polymerizable group is possible and is not particularly limited.

Below, specific examples of the repeating unit which is represented by the general formula (V) are shown, but the invention is not limited to these.

[Chem. 17]

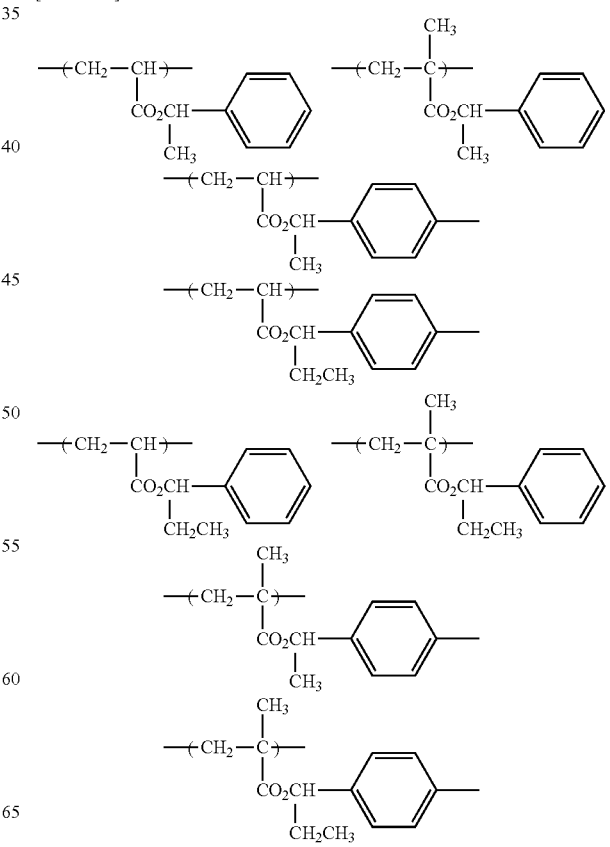

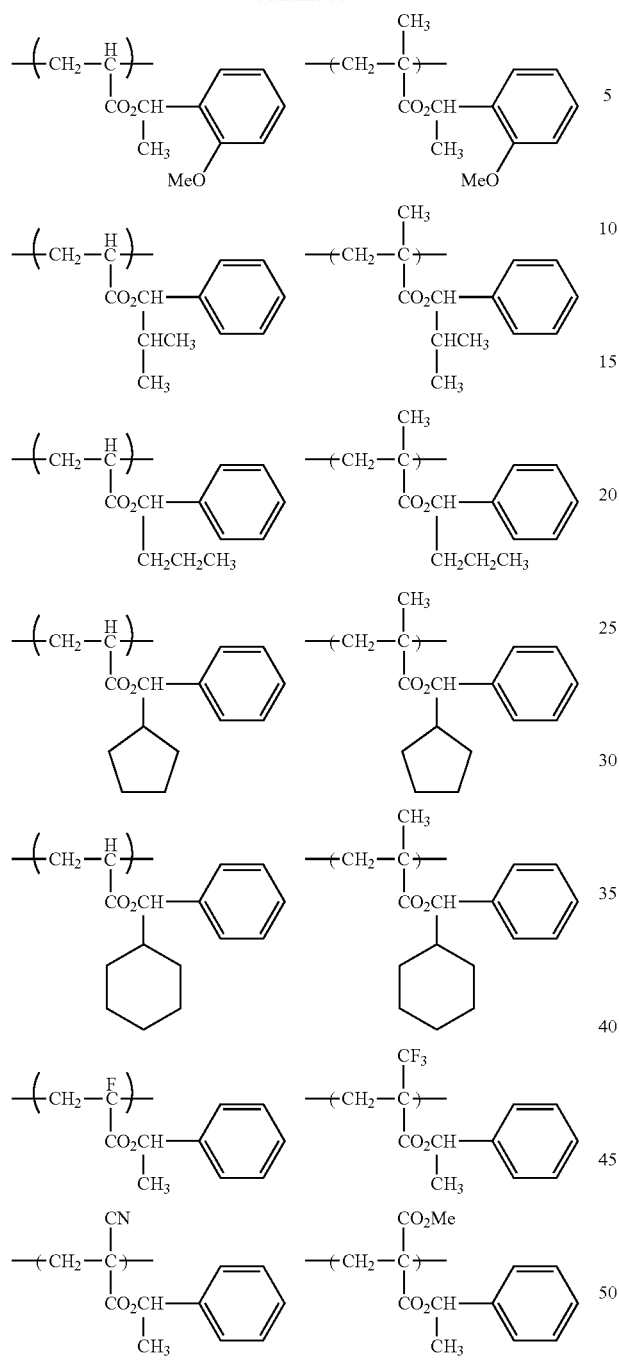
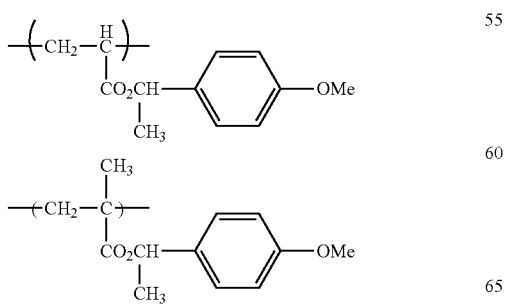
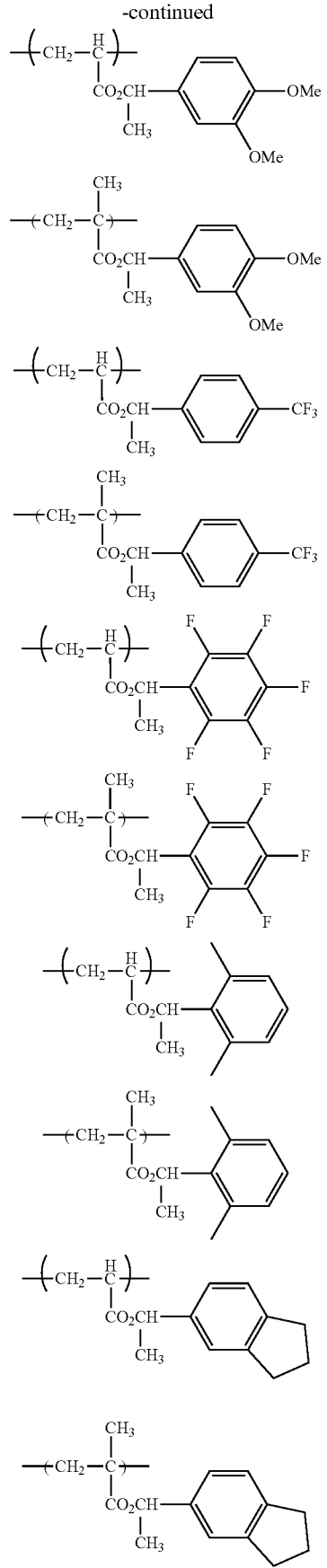

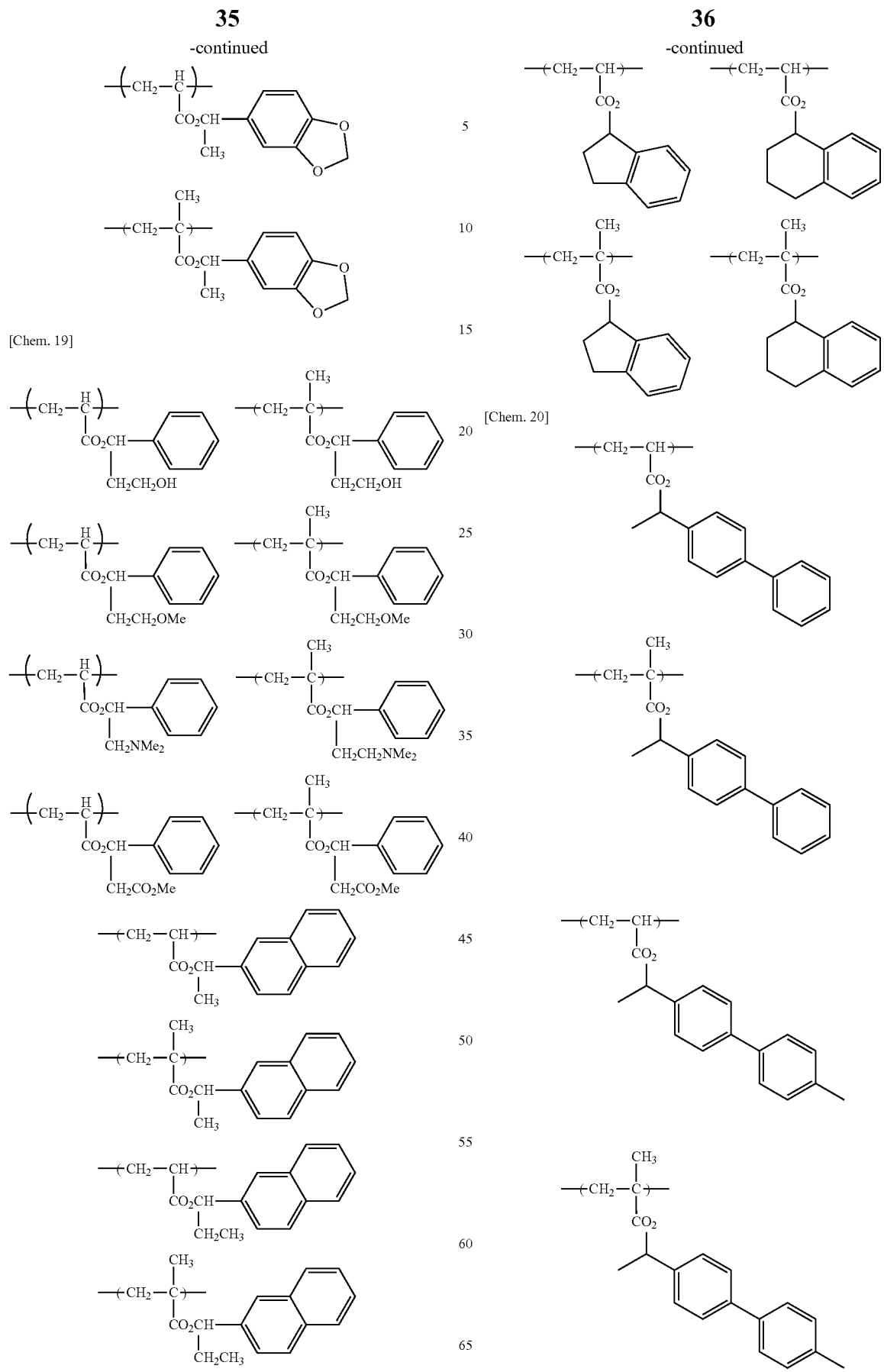

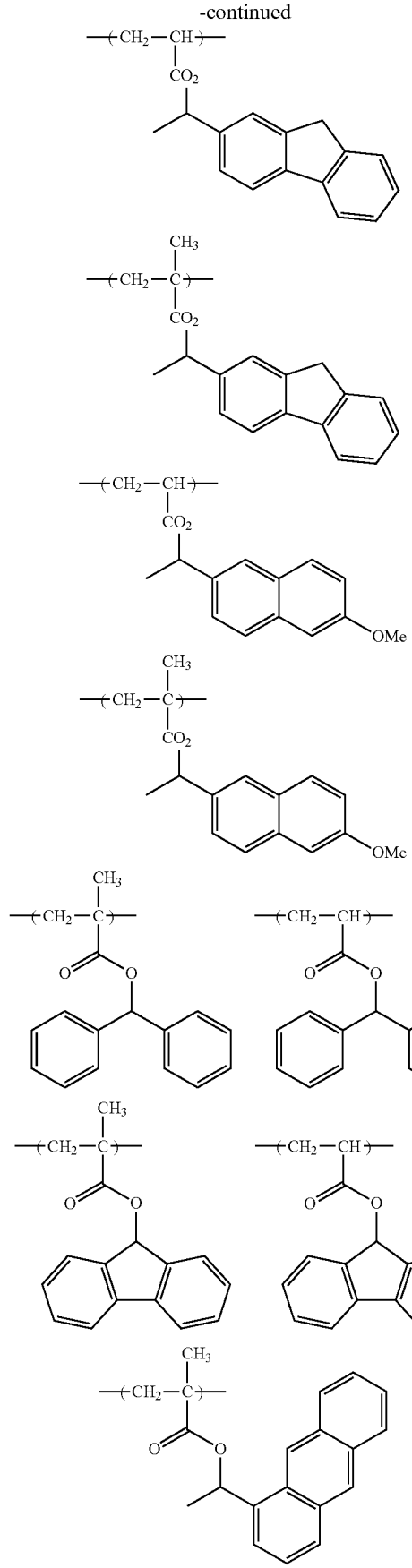
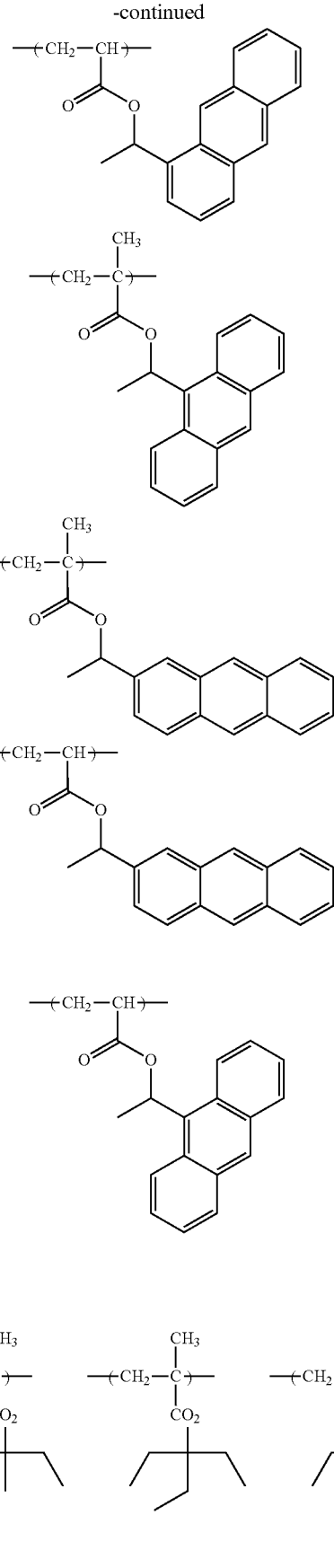

-continued
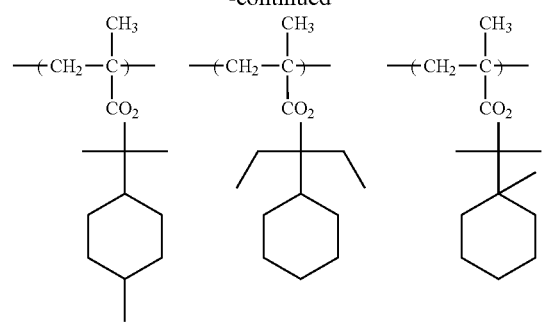
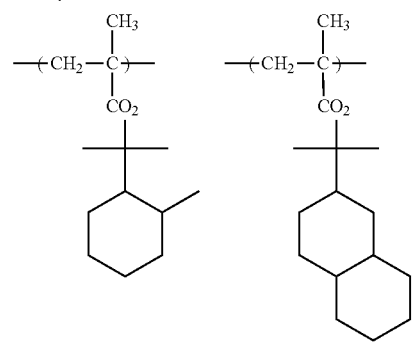
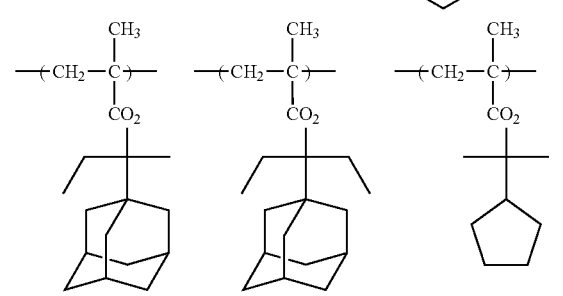
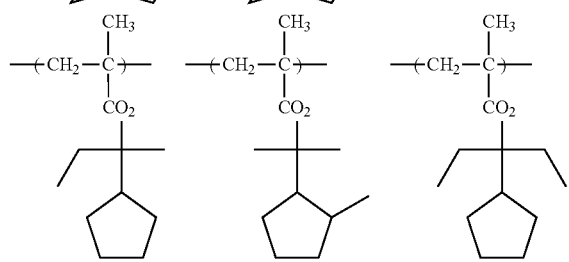
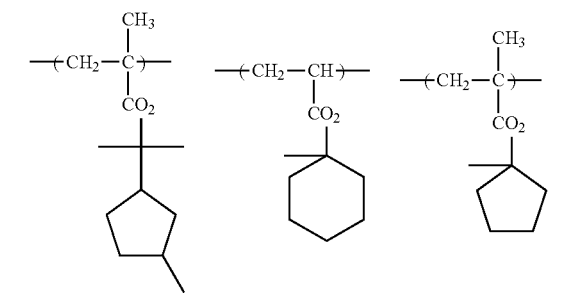
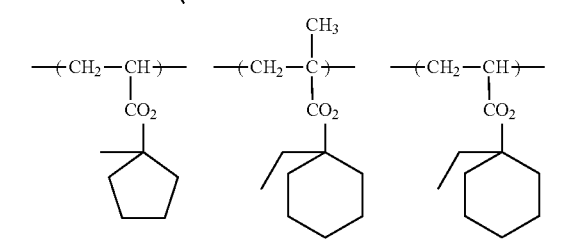
-continued
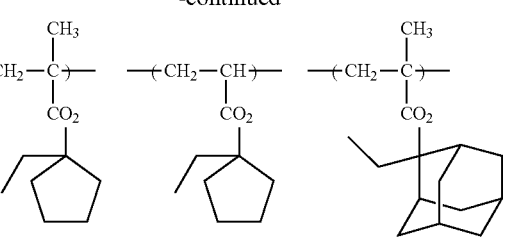
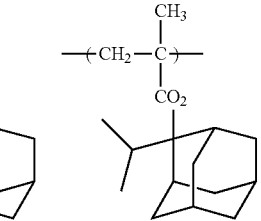
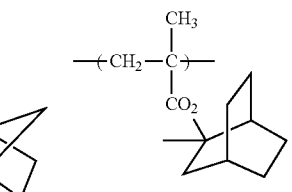
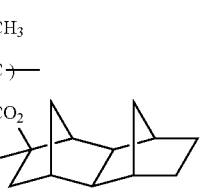
Among these, the repeating units below are preferable
[Chem. 22]
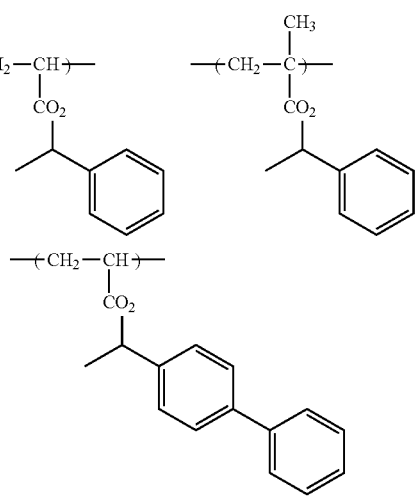

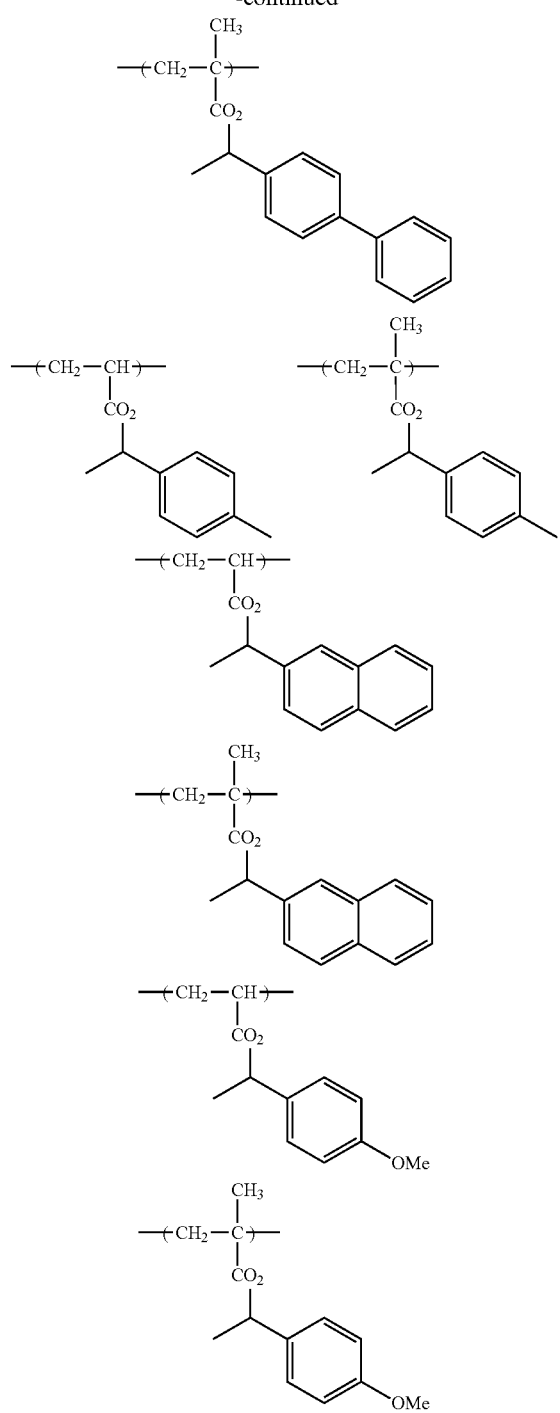
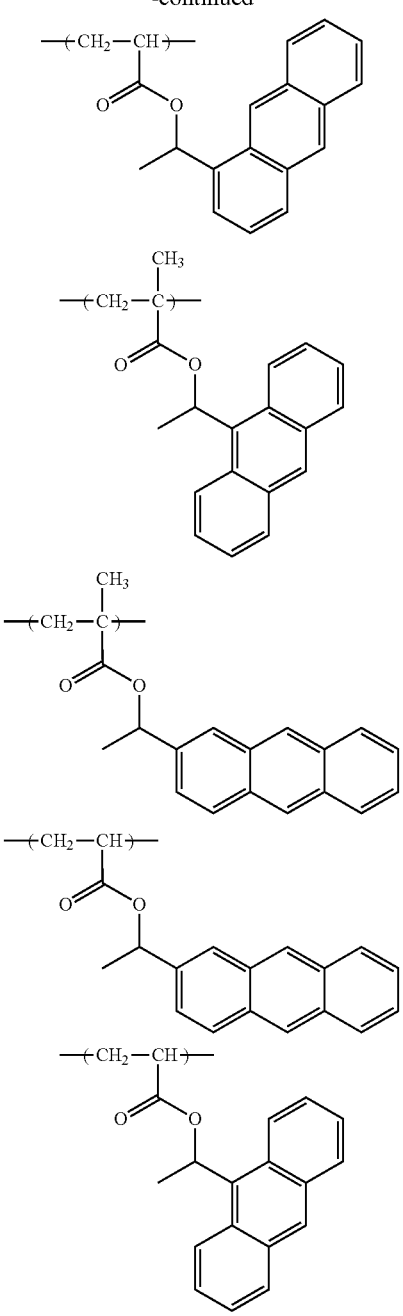
In addition, in another aspect, it is preferable that the repeating unit (C) be a repeating unit which is represented by the general formula (VI) below.
[Chem. 23]
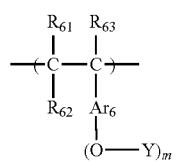

In the general formula (VI), $R_{61}$, $R_{62}$, and $R_{63}$ each independently represent a hydrogen atom or an alkyl group.

$Ar_6$ represents a divalent aromatic ring group.

Y each independently represent a group which generates an alkali soluble group by being decomposed by the action of an acid in a case of there being a plurality.

m represents an integer of 1 to 4.

The general formula (VI) will be described in further detail.

In a case where $R_{61}$ to $R_{63}$ are alkyl groups, there may be a linear shape or be branched, a carbon number of 1 to 10 is preferable, a carbon number of 1 to 6 is more preferable, and a methyl group is particularly preferable.

$Ar_6$ represents an aromatic ring group which may have a substituent, and as an aromatic ring, is preferably any of a benzene ring, a naphthalene ring, or an anthracene ring and a benzene ring is particularly preferable. In a case where $Ar_6$ has a substituent, there are the examples of an alkyl group, an alkoxy group, a branched alkyl group, a cycloalkyl group, a cycloalkoxy group, a hydroxyl group, a halogen atom, an aryl group, a cyano group, a nitro group, an acyl group, an acyloxy group, an acylamino group, a sulfonylamino group, an alkylthio group, an arylthio group, an aralkylthio group, an oxycarbonyl thiophene group, a methyl oxycarbonyl thiophene group, and a heterocyclic residue group such as a pyrrolidone residue group. Most preferable as the $Ar_6$ is an unsubstituted phenylene group.

As an example of the acid decomposable group Y, there can be the examples of —C($R_{36}$)($R_{37}$)($R_{38}$), —C($R_{01}$)($R_{02}$)(OR$_{39}$), —C(=O)—O—C($R_{36}$)($R_{37}$)($R_{38}$), —C($R_{01}$)($R_{02}$)—C(=O)—O—C($R_{36}$)($R_{37}$)($R_{38}$), —CH($R_{36}$)(Ar), and the like as described above. As the acid decomposable group in the general formula (VI), among these, —C($R_{01}$)($R_{02}$)(OR$_{39}$) is preferable, that is, the acid decomposable group is an acetal structure.

Below, there are specific examples of the repeating unit which is represented by the general formula (VI) but which are not limited to these.

[Chem. 24]

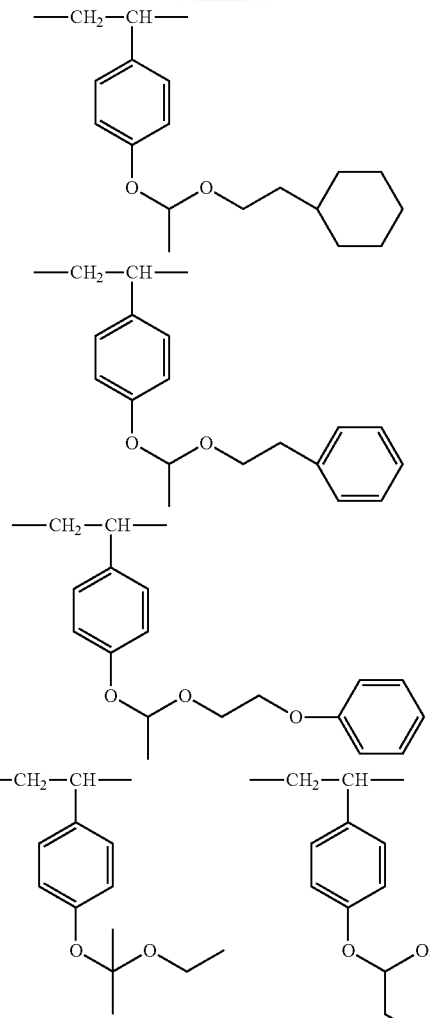
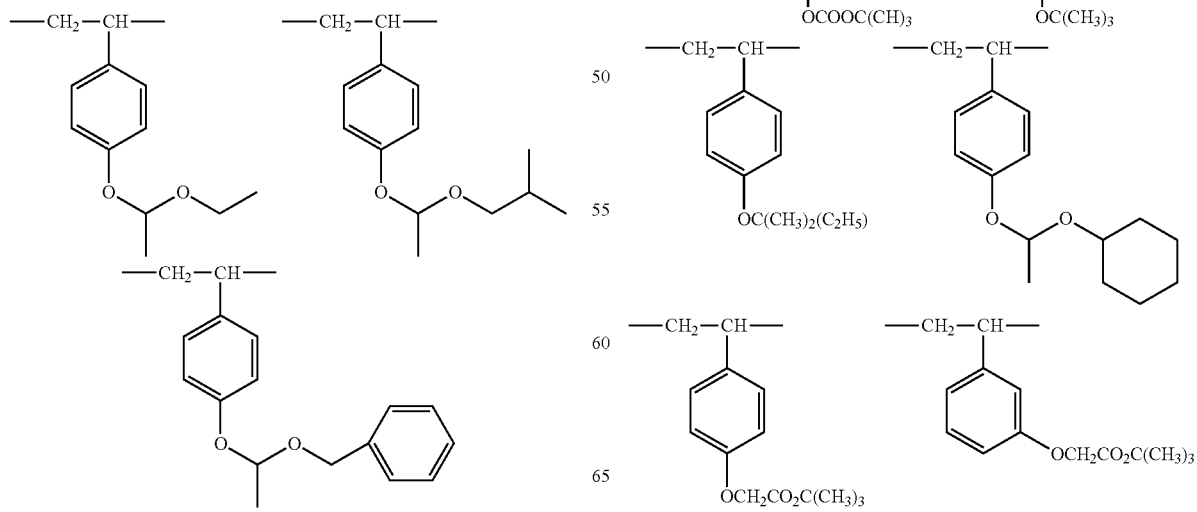
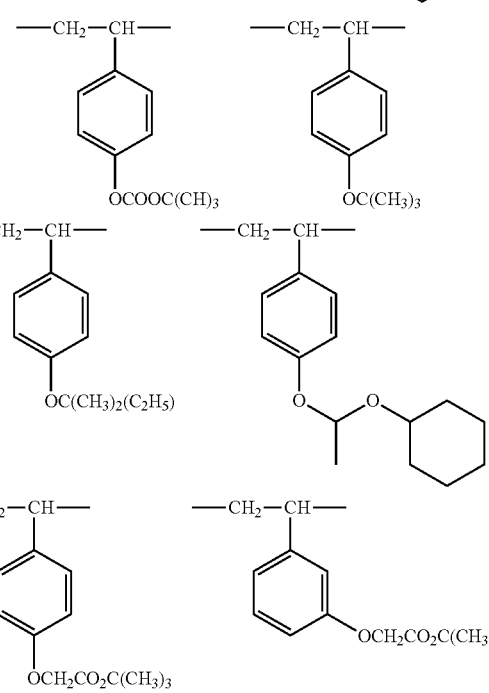

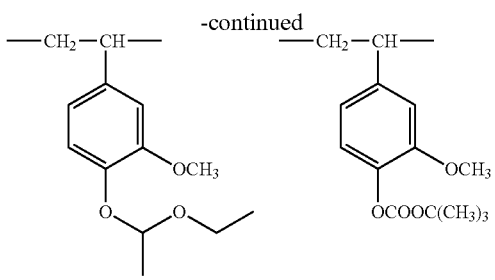

-continued

As the repeating unit (C) which is included in the resin (P) in the present invention, it is preferable that one type or more of a unit which is represented by the general formula (V) or the general formula (VI) be included and it is particularly preferable that one type of more of a repeating unit, which is a group which is represented by the general formula (VI) and —O—Y group is a group forming an acetal structure, be included. In a case of having the acetal structure, there is an advantage from the point of view of resolution since there is a tendency for it to be difficult for collapsing of the pattern to occur.

The content of the repeating unit (C) with regard to all of the repeating units in the resin (P) of the present invention is preferably in the range of 3 to 90 mol %, is more preferably in the range of 15 to 75 mol %, and is even more preferably, in the range of 30 to 70 mol %.

In addition, the ratio of the repeating unit (A) and the repeating unit (C) in the resin (P) (mol number of the repeating unit (A)/mol number of the repeating unit (C)) is preferably 0.04 to 1.0, is more preferably 0.05 to 0.9, and particularly preferably 0.06 to 0.8.

The resin (P) of the present invention preferably has a repeating unit with an aromatic ring group which is different to the repeating unit (A), the repeating unit (B), and the repeating unit (C). As such a repeating unit which has an aromatic ring, for example, there can be the example of a repeating unit which is represented by the general formula (VII) below.

[Chem. 25]

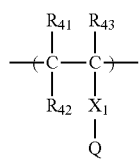
(VII)

In the general formula, $R_{41}$, $R_{42}$, and $R_{43}$ each independently represent a hydrogen atom, an alkyl group, a monovalent aliphatic hydrocarbon ring group, a halogen atom, a cyano group, or an alkoxycarbonyl group. $R_{42}$ may form a ring (preferably, a 5-membered or 6-membered ring) by bonding with Q and $R_{42}$ in this case represents an alkylene group.

$X_1$ represents a single bond or a divalent linking group.

Q represents a group which contains an aromatic ring group.

The general formulae (VII) will be described in further detail.

As specific examples of the alkyl group, the monovalent aliphatic hydrocarbon ring group, the halogen atom, and the alkoxycarbonyl group of $R_{41}$, $R_{42}$, and $R_{43}$ in the general formula (VII), it is possible that there is the same specific examples of $R_{51}$, $R_{52}$, and $R_{53}$ in the general formula (V) above.

In addition, in a case where $R_{42}$ represents an alkylene group, as the alkylene group, there is preferably an alkylene group with a carbon number of 1 to 8 such as a methylene group, an ethylene group, a propylene group, a butylene group, a hexylene group, and an octylene group. An alkylene group with a carbon number of 1 to 4 is more preferable and an alkylene group with a carbon number of 1 or 2 is particularly preferable.

As $R_{41}$ and $R_{43}$ in the general formula (VII), a hydrogen atom, an alkylene group or a halogen atom is more preferable, and a hydrogen atom, a methyl group, an ethyl group, a trifluoromethyl group (—$CF_3$), a hydroxymethyl group (—$CH_2$—OH), a chloromethyl group (—$CH_2$—Cl), and a fluorine atom (F) is particularly preferable. As $R_{42}$, a hydrogen atom, an alkyl group, a halogen atom, or an alkylene group (which forms a ring with Q) are more preferable, and a hydrogen atom, a methyl group, an ethyl group, a trifluoromethyl group (—$CF_3$), a hydroxymethyl group (—$CH_2$—OH), a chloromethyl group (—$CH_2$—Cl), a fluorine atom (F), a methylene group (which forms a ring with Q), or an ethylene group (which forms a ring with Q) is particularly preferable.

As specific examples of the divalent linking group which is represented by $X_1$, there is a group which is the same group which is exemplified as $X_1$ in the general formula (IV) which will be described later.

In the general formula (VII), Q is preferably an aromatic group which has a substituent with a carbon number of 1 to 20 or which is unsubstituted. As the aromatic group which is represented by Q, for example, there are the following.

A phenyl group, a naphthyl group, an anthranyl group, a phenanthryl group, a fluorenyl group, a triphenylenyl group, a naphthacenyl group, a biphenyl group, a pyrrolinyl group, a furanyl group, a thiophenyl group, a benzofuranyl group, a benzothiophene group, an isobenzofuranyl group, a quinolizyl group, a quinolinyl group, a phthalazyl group, a naphthyridyl group, a quinoxalyl group, a quinoxazolyl group, an isoquinolinyl group, a carbazolyl group, an acridyl group, a phenanthrolyl group, a thianthrenyl group, a chromenyl group, a xanthenyl group, a phenoxathiinyl group, a phenothiazyl group, and a phenazyl group. Among these, an aromatic hydrocarbon ring is preferable, a phenyl group, a naphthyl group, an anthranyl group, and a phenanthryl group are more preferable, and a phenyl group is even more preferable.

In one aspect, in the general formula (VII), $R_{41}$, $R_{42}$, and $R_{43}$ are preferably hydrogen atoms and the repeating unit which is represented by the general formula (VII-1) below is preferable.

[Chem. 26]

(VII-1)

Q represents a group which contains an aromatic ring group.

As the repeating unit which is represented by the general formula (VII), the repeating group which is represented by the general formula (IV) below (referred to below as "repeating unit (D)) is more preferable.

[Chem. 27]

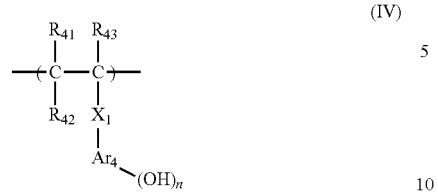

Here, $R_{41}$, $R_{42}$, and $R_{43}$ each independently represent a hydrogen atom, an alkyl group, a monovalent aliphatic hydrocarbon ring group, a halogen atom, a cyano group, or an alkoxycarbonyl group. In addition, $R_{42}$ may form a ring by bonding with $Ar_4$ and $R_{42}$ in this case represents an alkylene group.

$X_1$ represents a single bond or a divalent linking group.

$Ar_4$ represents a divalent aromatic ring group and represents a trivalent aromatic ring group when forming a ring with $R_{42}$ by bonding.

n is an integer of 1 to 4.

As specific examples of the alkyl group, the monovalent aliphatic hydrocarbon ring group, the halogen atom, the alkoxycarbonyl group of $R_{41}$, $R_{42}$, and $R_{43}$ in the general formula (IV) and a substituent which these groups can have, there are the same specific examples for each group in the general formula (VII).

As the divalent linking group which is represented by $X_1$, there are the examples of —COO—, —CONH—, —OCO—, —CO—, —O—, —S—, —SO—, —SO$_2$—, —NH—, an alkylene group, a cycloalkylene group, and an alkenylene group. Among these, —COO—, —CONH—, —OCO—, —CO—, —S—, —SO—, and —SO$_2$— are preferable and —COO—, —CONH—, —SO$_2$—, and —SO$_3$— are more preferable.

The divalent aromatic ring group which is represented by $Ar_4$ may have a substituent, and for example, an arylene group with a carbon number of 6 to 18 such as a phenylene group, a tolylene group, a naphthylene group, and an anthracenylene group or, for example, a divalent aromatic ring group which includes a hetero ring such as thiophene, furan, pyrrole, benzothiophene, benzofuran, benzopyrrole, thiadiazole, and thiazole.

As a preferable substituent in each of the groups above, there are the examples of an alkyl group, an alkoxy group such as a methoxy group, an ethoxy group, a hydroxyethoxy group, a propoxy group, a hydroxypropoxy group, and a butoxy group, and an aryl group such as a phenyl group which are examples in $R_{11}$ to $R_{13}$ in the general formula (I) as the repeating unit (A) described above.

As $Ar_4$, an arylene group with a carbon number of 6 to 18 which may have a substituent is more preferable and a phenylene group, a naphthylene group, and a biphenylene group are particularly preferable.

As a synthesis method of a monomer which corresponds to the repeating unit which is represented in the general formula (VII), there is no particular limitation, and for example, it is possible to synthesize with reference to the synthesis method of an aromatic compound containing a polymerizable carbon-carbon double bond described in J. Med. Chem., vol. 34 (5), 1675-1692 (1991), ibid vol. 35 (25), 4665-4675 (1992), J. Org. Chem. vol. 45 (18), 3657-3664 (1980), Adv. Synth. Catal. vol. 349 (1-2), 152-156 (2007), J. Org. Chem. vol. 28, 1921-1922 (1963), Synth. Commun. vol. 28 (15), 2677-2682 (1989), or documents which are cited in these.

Below, specific examples of the repeating units which are represented by the general formula (VII) are shown, but the present invention is not limited to these. In the general formulae, a represents an integer of 0 to 2.

[Chem. 28]

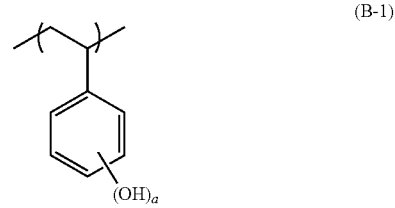

(B-1)

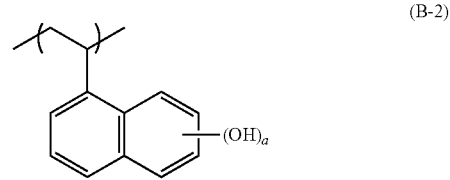

(B-2)

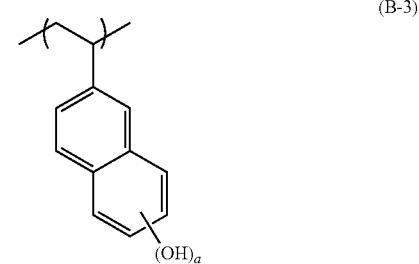

(B-3)

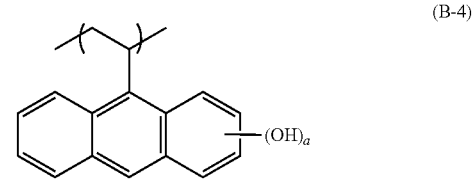

(B-4)

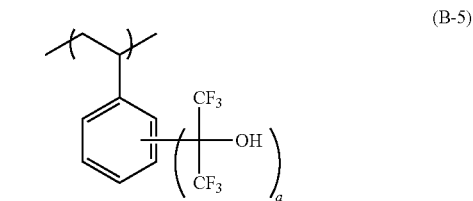

(B-5)

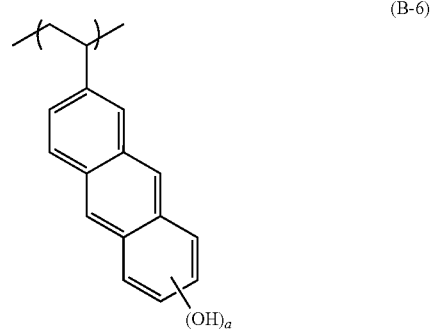

(B-6)

-continued
(B-7)
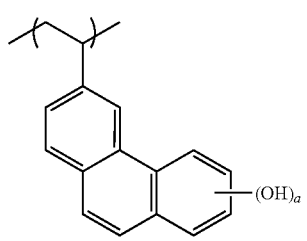
(B-8)
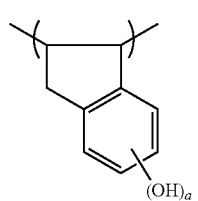
(B-9)
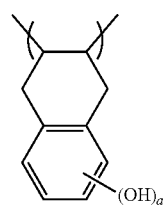
(B-10)
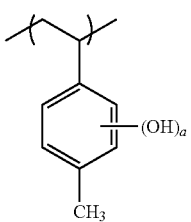
(B-11)
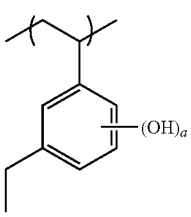
(B-12)
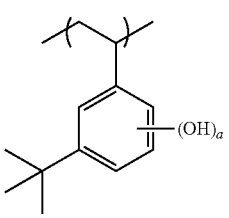
(B-13)
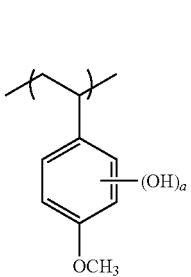
(B-14)
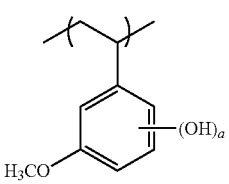
(B-15)
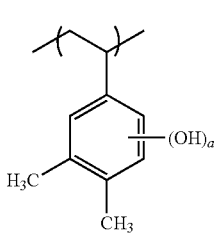
(B-16)
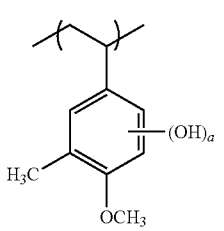
(B-17)
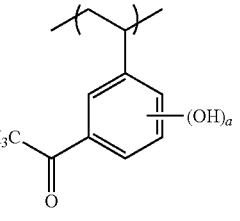
(B-18)
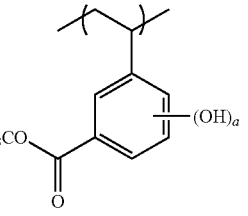
(B-19)
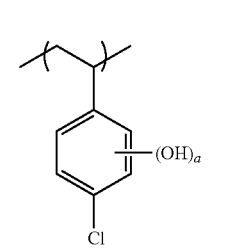
(B-20)
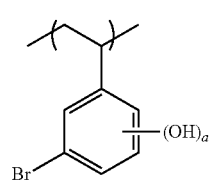

-continued
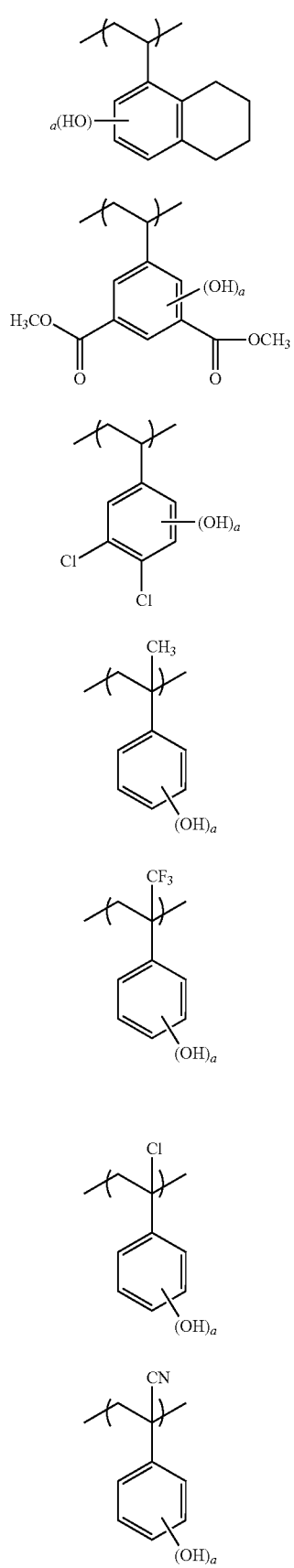
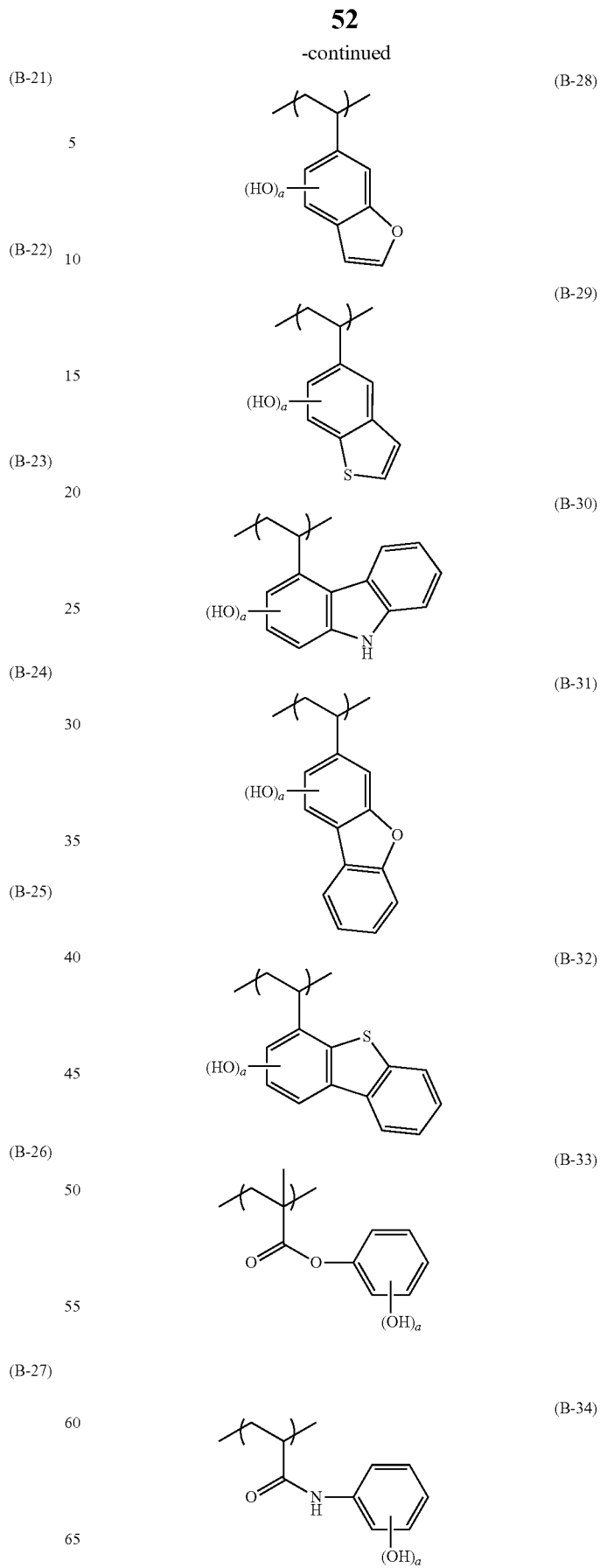

-continued

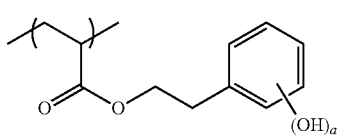
(B-35)

The content of the repeating unit which is represented by the general formula (VII) with regard to all of the repeating units in the resin (P) is preferably in the range of 5 to 90 mol %, is more preferably in the range of 10 to 80 mol %, and is even more preferably, in the range of 20 to 70 mol %. The repeating unit which is represented by the general formula (VII) may be one type or a combination of two or more types may be used, but it is preferable that at least the repeating, unit which is represented by the general formula (IV) be included.

In the present invention, the content (mol %) of the repeating unit which is represented by the general formula (VII) is preferably greater than or equal to the content of the repeating unit (C) described above.

Repeating Unit (E)

The resin (P) may have a repeating unit (E) which has a group which is decomposed by the action of an alkali developer and where the rate of solubility in the alkali developer is increased.

As the group which is decomposed by the action of an alkali developer and where the rate of solubility in the alkali developer is increased, there are the examples of a lactone structure, a phenyl ester structure, and the like.

As the repeating unit (E), the repeating unit which is represented by the general formula (AII) below is preferable.

[Chem. 30]

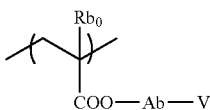
(AII)

In the general formula (AII), $Rb_0$ represents a hydrogen atom, a halogen atom, or an alkyl group (with preferably a carbon number of 1 to 4) which may have a substituent.

As a preferable substituent which the alkyl group of $Rb_0$ may have, there is a hydroxyl group and a halogen atom. As the halogen atom of $Rb_0$, there can be the examples of a fluorine atom, a chlorine atom, a bromine atom, and an iodine atom. As $Rb_0$, a hydrogen atom, a methyl group, a hydroxyl methyl group, and a trifluoromethyl group are preferable and a hydrogen atom and a methyl group are particularly preferable.

Ab represents a single bond, an alkylene group, a divalent linking group which has a single ring or polycyclic aliphatic hydrocarbon ring structure, an ether group, an ester group, a carbonyl group, or a divalent linking group which is a combination of these. A single bond or a divalent linking group which is represented by $-Ab_1-CO_2-$ is preferable.

$Ab_1$ is a linear or branched alkylene group or a single ring or polycyclic aliphatic hydrocarbon ring structure, and a methylene group, an ethylene group, a cyclohexylene group, an adamantylene group, or a norbornylene group is preferable.

V represents a group which is decomposed by the action of an alkali developer and where the rate of solubility in the alkali developer is increased. A group with an ester bond is preferable, and a group with a lactone structure is more preferable.

As groups with a lactone structure, it is possible to use any group with a lactone structure, but a group with a 5- to 7-membered ring lactone structure is preferable, and other ring structures where a 5- to 7-membered ring lactone structure is condensed with the form of forming a bicyclo structure or a spiro structure are preferable. It is more preferable to have a repeating unit with a lactone structure which is represented by any of the general formulae (LC1-1) to (LC1-17) below. A lactone structure may be directly bonded to the main chain. As preferable lactone structures, there are (LC1-1), (LC1-4), (LC1-5), (LC1-6), (LC1-13), (LC1-14) and (LC1-17).

[Chem. 31]

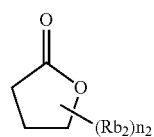
LC1-1

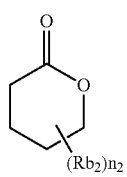
LC1-2

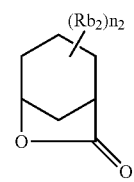
LC1-3

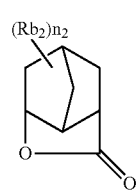
LC1-4

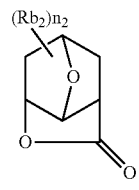
LC1-5

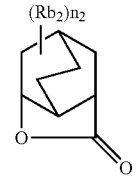
LC1-6

LC1-7 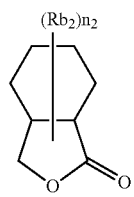

LC1-8 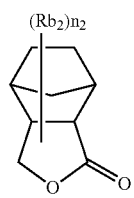

LC1-9 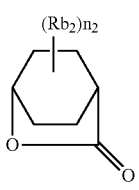

LC1-10 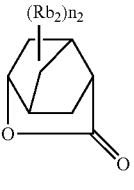

LC1-11 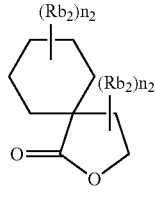

LC1-12 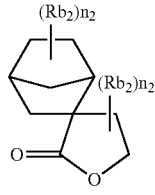

LC1-13 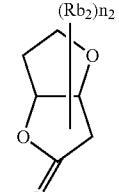

LC1-14 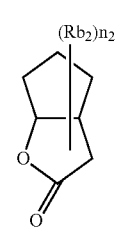

LC1-15 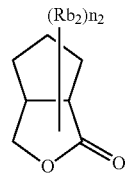

LC1-16 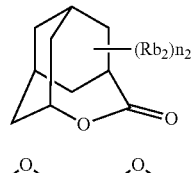

LC1-17 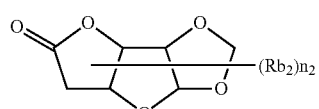

The lactone structure portion may have or may not have a substituent ($Rb_2$). As preferable substituents ($Rb_2$), there are the examples of an alkyl group with a carbon number of 1 to 8, a monovalent aliphatic hydrocarbon ring group with a carbon number of 4 to 7, an alkoxy group with a carbon number of 1 to 8, an alkoxycarbonyl group with a carbon number of 2 to 8, a carboxyl group, a halogen atom, a hydroxyl group, a cyano group, and an acid decomposable group, and an alkyl group with a carbon number of 1 to 4, a cyano group, or an acid decomposable group are more preferable. $n_2$ represents an integer of 0 to 4. When $n_2$ is 2 or more, each substituent may be the same or different when there is a plurality thereof. A plurality of substituents ($Rb_2$) may form a ring by being bonded to each other.

Repeating units with a lactone structure normally have optical isomers, and any optical isomer may be used. One type of optical isomer may be used alone, or a plurality of optical isomers may be used as a mixture. When one kind of optical isomer is mainly used, optical purity (ee) is preferably 90% or more and 95% or more is more preferable.

The content of the repeating unit (E) in the resin (P) is preferably in the range of 0 to 80 mol % with respect to all the repeating units, more preferably in the range of 1 to 60 mol and even more preferably in the range of 2 to 40 mol %. One kind of repeating unit (E) may be used alone, or two or more kinds may be used in combination. By the use of a specific lactone structure, there is improvement in line edge roughness and development defects.

Below, the specific examples of the repeating unit (E) are shown, but the invention is not limited to these. In the general formulae, Rx represents H, $CH_3$, $CH_2OH$ or $CF_3$.

[Chem. 32]

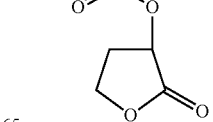 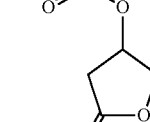 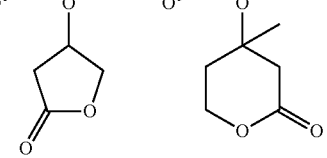

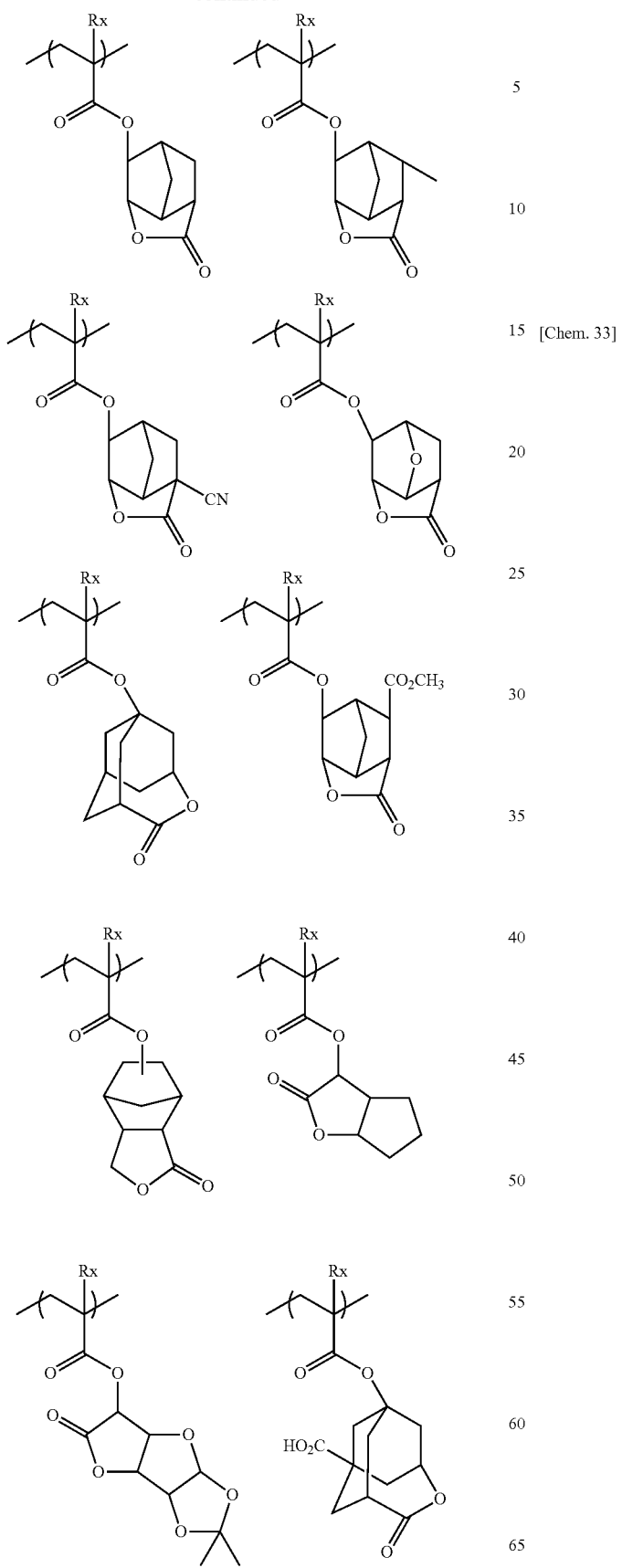
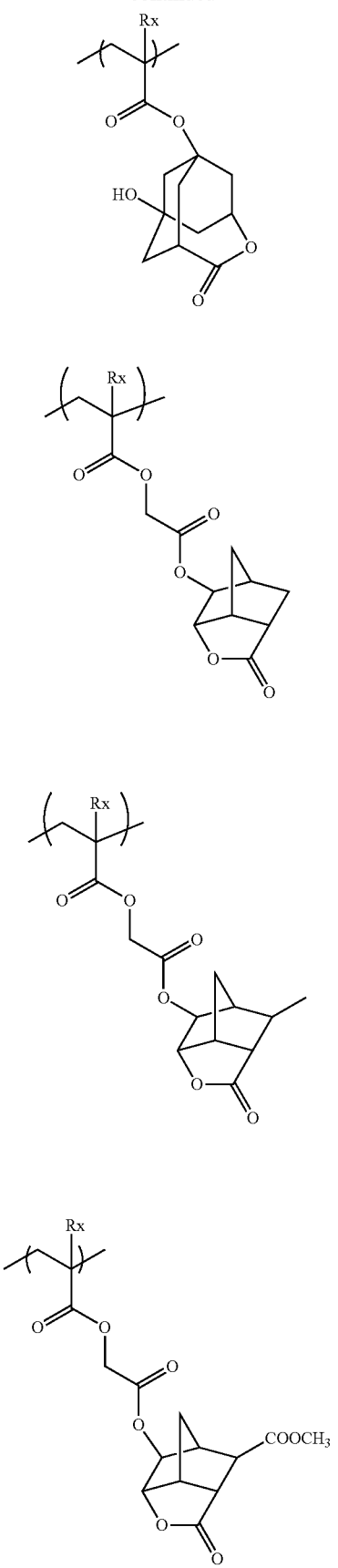
[Chem. 33]

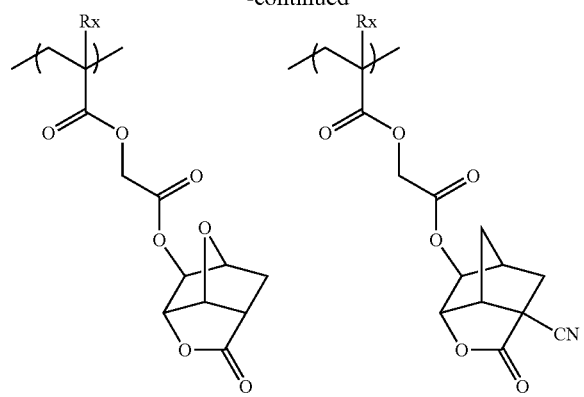
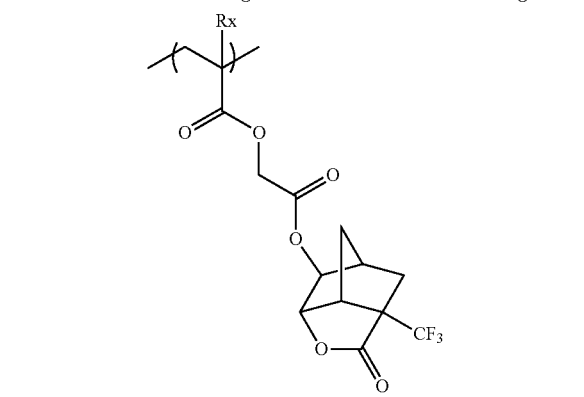
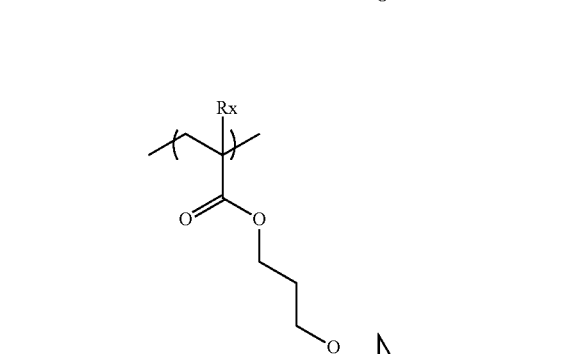
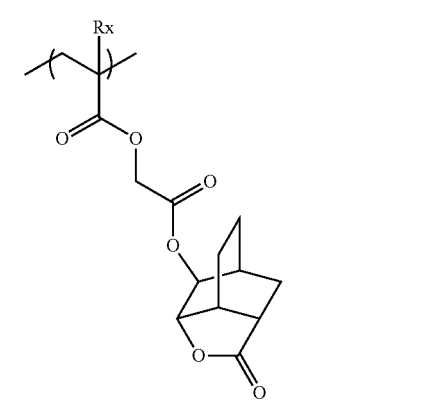
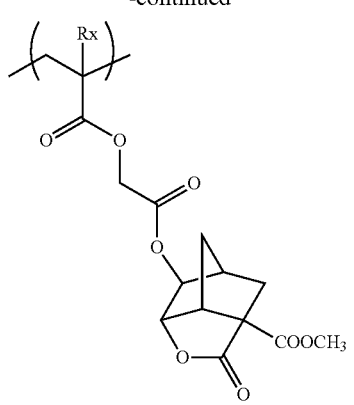
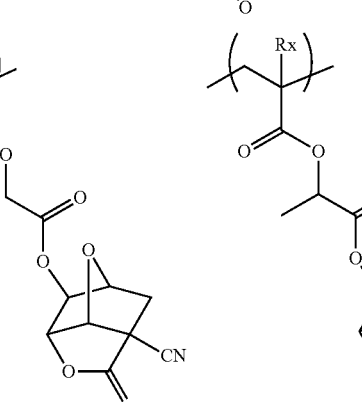
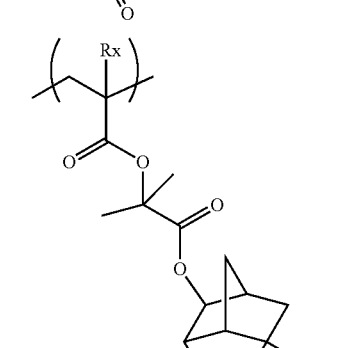
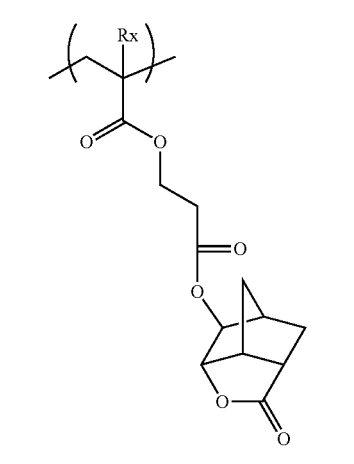

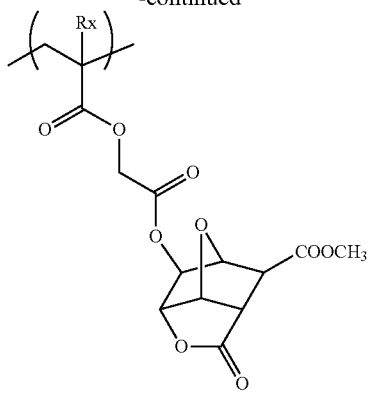

The form of the resin (P) of the present invention may be any form of a random type, a block type, a comb type, and a star type.

It is possible for the resin (P) to be synthesized by, for example, radical polymerization, cationic polymerization, or anionic polymerization of an unsaturated monomer which corresponds to each structure. In addition, it is also possible to obtain the resin which is the object by performing a polymeric reaction after polymerization with an unsaturated monomer which corresponds to a precursor of each structure.

For example, as a typical synthesis method, there are a complete polymerization method where an unsaturated monomer and a polymerization initiator are dissolved in a solvent and polymerization is performed by heating, a dropwise polymerization method where a solution of an unsaturated monomer and a polymerization initiator are added in drops to a heated solvent over 1 to 10 hours, and the like and the dropwise polymerization method is preferable.

As the solvent which is used in polymerization, for example, it is possible that there is a solvent which is able to be used when the actinic ray-sensitive or radiation-sensitive resin composition which will be described later is prepared, and polymerization using the solvent which is the same as the solvent which is used in the composition of the present invention is more preferable. Due to this, the generation of particles during storage can be suppressed.

It is preferable to perform the polymerization reaction in an atmosphere of an inert gas such as nitrogen or argon. Polymerization is started using a radical initiator which is commercially available (azo-based initiator, peroxide, and the like) as the polymerization initiator. As the radical initiator, an azo-based initiator is preferable and an azo-based initiator which has an ester bond, a cyano group, or a carboxyl group is preferable. As a preferable initiator, there are the examples of azobisisobutyronitrile, azobisdimethylvaleronitrile, dimethyl 2,2'-azobis(2-methyl propionate), and the like. Polymerization may be performed with the presence of a chain transfer agent (for example, an alkyl mercaptan) as required.

The concentration of the reaction is 5 to 70 mass % and preferably 10 to 50 mass %. The reaction temperature is normally 10° C. to 150° C., is preferably 30° C. to 120° C., and is more preferably 40° C. to 100° C.

The reaction time is normally 1 to 48 hours, is preferably 1 to 24 hours, and is more preferably 1 to 12 hours.

After the reaction is complete, there is cooling to room temperature and refining. As the refining, it is possible to apply a normal method such as a liquid-liquid extraction method where residual monomers and oligomer component are removed by rinsing with water and combining appropriate solvents, a refining method in a solution state such as ultrafiltration where only a specific molecular weight or less is extracted and removed, a reprecipitation method where residual monomers and the like are removed due to a resin being solidified in a poor solvent by a resin solution being added in drops to the poor solvent, or a refining method in a solid state such as washing a resin slurry which has been filtered using a poor solvent. For example, a resin is deposited as a solid by the resin coming into contact with a poorly soluble or insoluble solvent (poor solvent) where a volumetric amount of the reaction solvent is 10 times or less and preferably a volumetric amount of 10 to 5 times.

As the solvent which is used when precipitating or reprecipitating from a polymer solution (precipitation or reprecipitation solvent), it is sufficient if it is a poor solvent of the polymer, and according to the type of polymer, it is possible to appropriately select and use from among hydrocarbons, halogenated hydrocarbons, nitro compounds, ethers, ketones, esters, carbonates, alcohols, carboxylic acids, water, a mixed solvent which includes these solvents, or the like. Among these, as the precipitation or reprecipitation solvent, a solvent which includes at least alcohol (particularly, methanol and the like) or water is preferable.

The usage amount of the precipitation or reprecipitation solvent is able to be appropriately selected by considering the efficiency, the yield, and the like, but typically, it is 100 to 10000 parts by mass, preferably 200 to 2000 parts by mass, and more preferably 300 to 1000 parts by mass with regard to 100 parts my mass of the polymer solution.

The temperature during precipitation or reprecipitation is able to be appropriately selected by considering the efficiency, the yield, and the like, but is typically approximately 0 to 50° C. and preferably in the vicinity of room temperature (for example, approximately 20 to 35° C.). The precipitation or reprecipitation uses a common mixing container such as a mixer and it is possible to be performed using a common method such as a batch method or a continuous method.

The polymer which is precipitated or reprecipitated is provided for use by common solid-liquid separation such as filtration or centrifugation being applied and being dried. The filtration uses a filter element with solvent resistance and is preferably performed with pressurization. The drying is performed at normal pressure or at reduced pressure (preferably at reduced pressure) and at a temperature of approximately 30 to 100° C. and preferably at 30 to 50° C.

Here, after the resin is deposited and separated once, the resin may be dissolved again in a solvent and the resin is brought into contact with a poorly soluble or insoluble solvent. That is, after the completion of the radical polymerization reaction described above, there may be a method where the polymer comes into contact with a poorly soluble or insoluble solvent and a resin is extracted (process a), the resin is separated from the solvent (process b) and is dissolved in a solvent again to prepare a resin solution A (process c), and after that, a resin solid is extracted by the resin in the resin solution A coming into contact with a poorly soluble or insoluble solvent where a volumetric amount is less than 10 times of the resin solvent A (preferably a volumetric amount of 5 times or less) (process d), and the resin which has been extracted is separated (process e).

The molecular weight of the resin (P) according to the present invention is not particularly limited, but a weight average molecular weight is preferably in the range of 1000 to 100000, is more preferably in the range of 1500 to 60000, and is particularly preferably in the range of 2000 to 30000. Here, the weight average molecular weight of the resin indicates the polystyrene conversion molecular weight which has been measured using a GPC (carrier: THF or N-methyl-2-pyrrolidone (NMP)).

In addition, dispersion (Mw/Mn) is preferably 1.00 to 5.00, more preferably 1.03 to 3.50, and even more preferably, 1.05 to 2.50. In the specifications, the weight average molecular weight (Mw) and the number average molecular weight (Mn) of the resin (P) are able to be determined using an HLC-8120 (manufactured by Tosoh Corporation), using a TSK gel Multipore HXL-M column (7.8 mm ID×30.0 cm manufactured by Tosoh Corporation) as a column and using THF (tetrahydrofuran) as an eluent.

In addition, with the object of improving the performance of the resin according to the present invention, there may be another further repeating unit which is derived from a polymerizable monomer in a range where the resistance to dry etching does not remarkably suffer.

The content of the other repeating unit in the resin derived from a monomer with regard to all of the repeating units is typically 50 mol % or less and is preferably 30 mol % or less. As the other polymerizable monomer which is able to be used, those shown below are included. For example, there is a compound with one additional polymerizable unsaturated bond which is selected from a (meth)acrylate ester, (meth)acrylamide, an allyl compound, a vinyl ether, a vinyl ester, styrene, a crotonic acid ester, and the like.

Specifically, as the (meth)acrylate ester, for example, there are methyl (meth)acrylate, ethyl (meth)acrylate, propyl (meth)acrylate, t-butyl (meth)acrylate, amyl (meth)acrylate, cyclohexyl (meth)acrylate, ethylhexyl (meth)acrylate, octyl (meth)acrylate, t-octyl (meth)acrylate, 2-chloroethyl (meth)acrylate, 2-hydroxyethyl (meth)acrylate, glycidyl (meth)acrylate, benzyl (meth)acrylate, phenyl (meth)acrylate, and the like.

As the (meth)acrylamide, for example, there are (meth)acrylamide, N-alkyl (meth)acrylamide, (the alkyl group which has a number of carbon atoms of 1 to 10, and for example, there are a methyl group, an ethyl group, a propyl group, a butyl group, a t-butyl group, a heptyl group, an octyl group, a cyclohexyl group, a benzyl group, a hydroxyethyl group, and the like), N-aryl (meth)acrylamide (the aryl group is, for example, a phenyl group, a tolyl group, a nitrophenyl group, a naphthyl group, a cyanophenyl group, a hydroxyphenyl group, a carboxyphenyl group, or the like), N,N-dialkyl (meth)acrylamide (the alkyl group has a number of carbon atoms of 1 to 10 and there are, for example, a methyl group, an ethyl group, a butyl group, an isobutyl group, an ethylhexyl group, a cyclohexyl group, and the like), N,N-aryl (meth)acrylamide (the aryl group is, for example, a phenyl group or the like), N-methyl-N-phenyl acrylamide, N-hydroxy-ethyl-N-methyl acrylamide, N-2-ethyl-N-acetyl acetamide acrylamide, and the like.

As the allyl compound, for example, there are an allyl ester (for example, allyl acetate, allyl caproate, allyl caprylate, allyl laurate, allyl palmitate, allyl stearate, allyl benzoate, allyl acetoacetate, allyl lactate, and the like), allyloxyethanol, and the like.

As the vinyl ether, for example, there are an alkyl vinyl ether (for example, hexyl vinyl ether, octyl vinyl ether, decyl vinyl ether, ethylhexyl vinyl ether, methoxyethyl vinyl ether, ethylethoxy vinyl ether, chloroethyl vinyl ether, 1-methyl-2,2-dimethyl-propyl vinyl ether, 2-ethyl butyl vinyl ether, hydroxyethyl vinyl ether, diethylene glycol vinyl ether, dimethylaminoethyl vinyl ether, a diethylaminoethyl vinyl ether, a butylaminoethyl vinyl ether, a benzyl vinyl ether, a tetrahydrofurfuryl vinyl ether, and the like), and an aryl vinyl ether (for example, a phenyl vinyl ether, a tolyl vinyl ether, a chlorophenyl vinyl ether, a vinyl-2,4-dichlorophenyl ether, a vinyl naphthyl ether, a vinyl anthranilate ether, and the like).

As the vinyl ester, for example, there are vinyl butyrate, vinyl isobutyrate, vinyl trimethyl acetate, vinyl diethyl acetate, vinyl valerate, vinyl caproate, vinyl chloroacetate, vinyl dichloroacetate, vinyl methoxyacetate, vinyl butoxyacetate, vinyl phenylacetate, vinyl acetoacetate, vinyl lactate, vinyl-β-phenylbutyrate, vinyl cyclohexylcarboxylate, vinyl benzoate, vinyl salicylate, vinyl chlorobenzoate, vinyl tetrachlorobenzoate, and vinyl naphthoate.

As the crotonic acid ester, for example, there is alkyl crotonate (for example, butyl crotonate, hexyl crotonate, and glycerine monocrotonate).

As a dialkyl itaconic acid, there is dimethyl itaconate, diethyl itaconate, and dibutyl itaconate.

As a maleic acid or fumaric acid dialkyl ester, there are the examples of dimethyl maleate and dibutyl fumarate, and the like.

Other than this, there can be the examples of maleic anhydride, maleimide, acrylonitrile, methacrylonitrile, and maleyl nitrile. In addition, an added polymerizable unsaturated compound, where copolymerization with the repeating unit according to the present invention is possible, is able to be used without any particular limitations.

The resin (P) of the present invention is able to use one type by itself or a combination of two or more types. The content of the resin (P) on the basis of the total solid content in the actinic ray-sensitive or radiation-sensitive resin composition of the present invention is preferably 30 to 99.99 mass %, is more preferably 50 to 99.97 mass %, and is particularly preferably 70 to 99.95 mass %.

As preferable specific examples of the resin (P), for example, it is possible that there is a resin with one or more types of the repeating unit (A) which is selected from the specific examples of the repeating units which are represented by the general formulae (I) to (III)/one or more types of the repeating unit (D) which is selected from the specific examples of the repeating units which are represented by the general formula (IV)/one or more types of the repeating unit (E) which is selected from the specific examples of the repeating units which are represented by the general formulae (V) to (VI) or a resin with one or more types of the repeating unit (A) which is selected from the specific examples of the repeating units which are represented by the general formulae (I) to (III)/one or more types of the repeating unit (D) which is selected from the specific examples of the repeating units which are represented by the general formula (IV)/one or more types of the repeating unit (C) which is selected from the specific examples of the repeating units which are represented by the general formulae (V) to (VI)/one or more types of the repeating unit (E) which is selected from the specific examples of the repeating units which are represented by the general formula (AII).

More preferable specific examples of the resin (P) are shown below, but the present invention is not limited to these.

[Chem. 34]

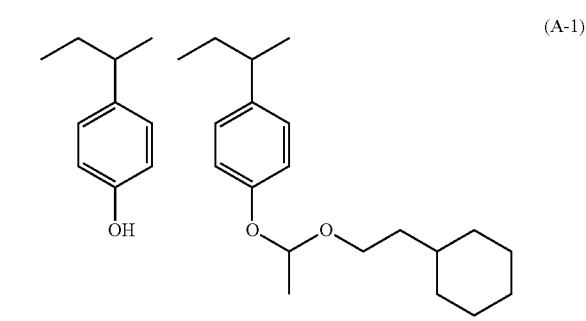

(A-1)

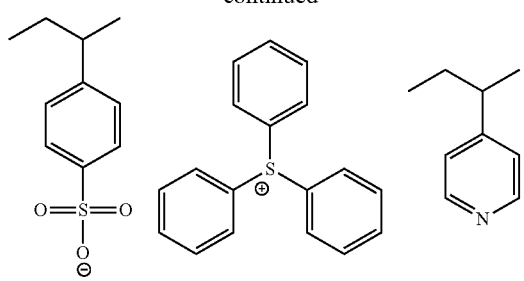
(A-2)
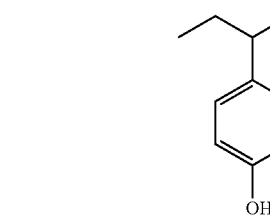
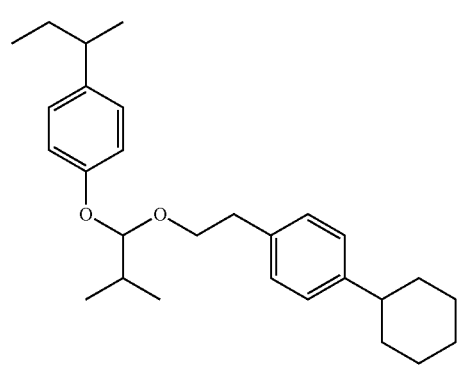
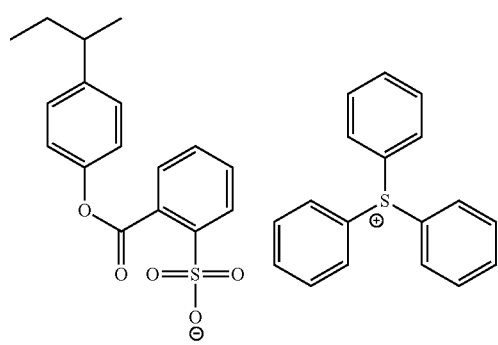
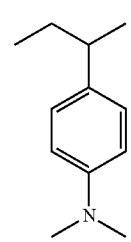
(A-3)
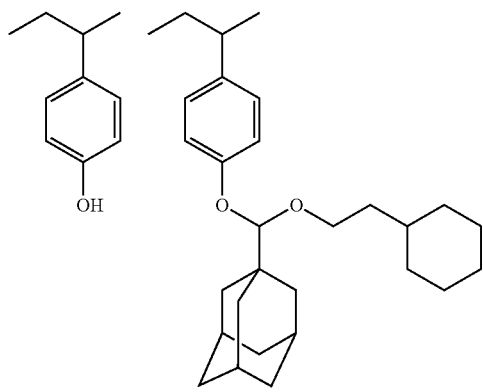
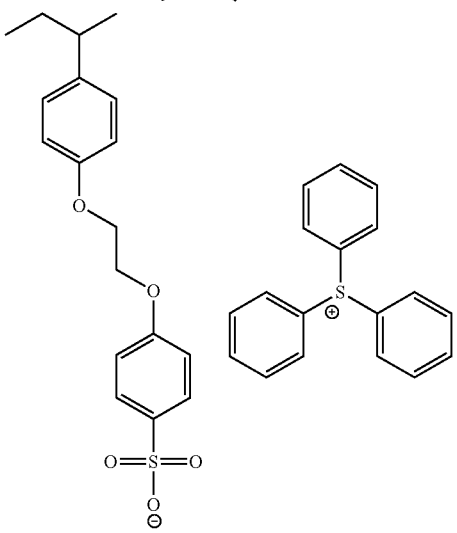
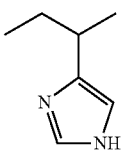
(A-4)
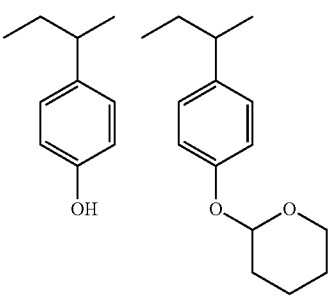
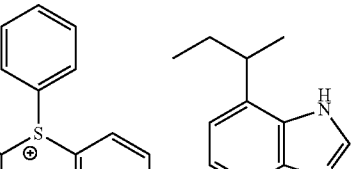

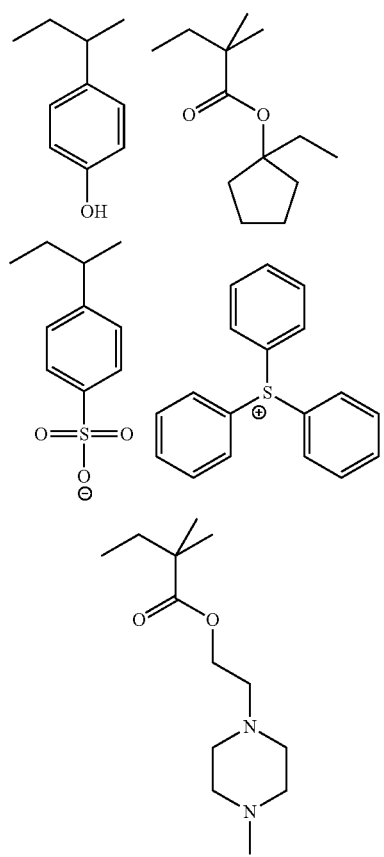
(A-5)
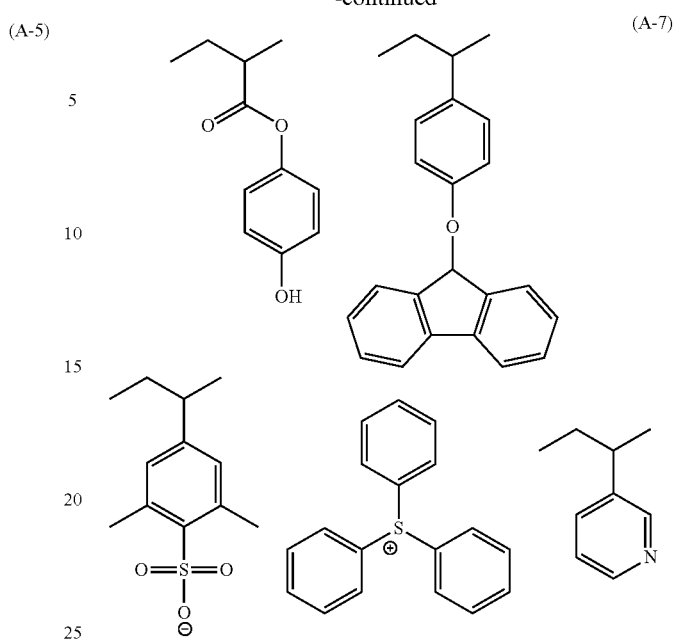
(A-7)
[Chem. 35]
(A-6)
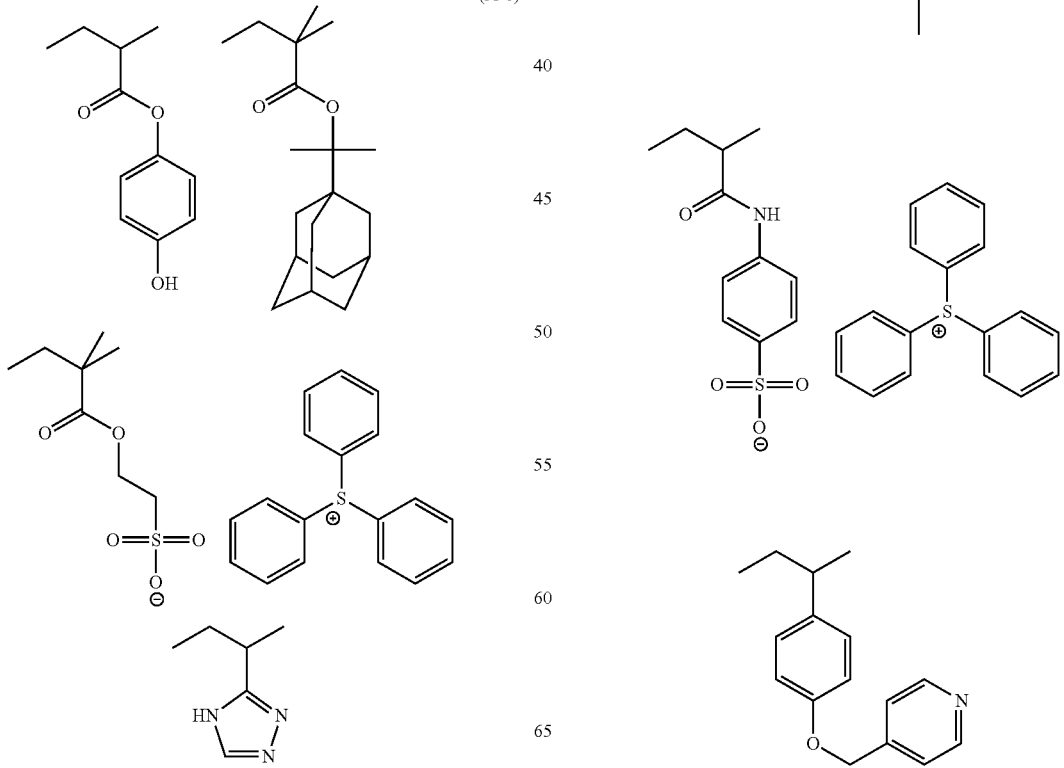
(A-8)

-continued

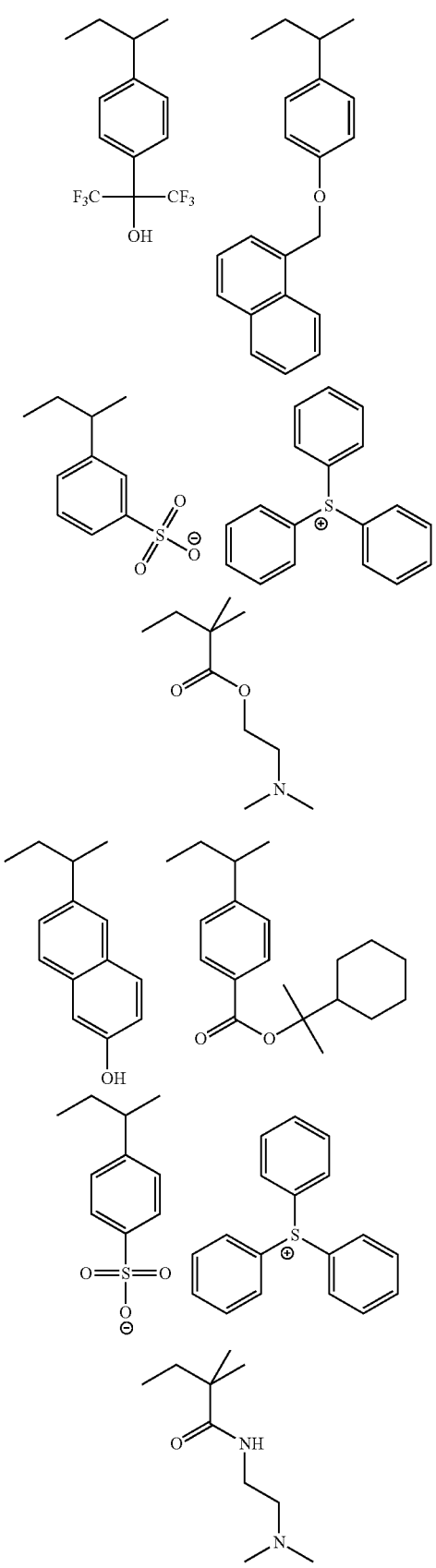

In the actinic ray-sensitive or radiation-sensitive resin composition of the present invention, as will be described below, a resin other than the resin (P) which has a group which is decomposed by the action of an alkali developer and where the rate of solubility in the alkali developer is increased (referred to below as "acid decomposable resin") may be further included along with the resin (P).

Photo-Acid Generator

The composition according to the present invention may further include a photo-acid generator with a low molecular weight in the related art.

The photo-acid generator is a compound which generates an acid due to irradiation with actinic rays or radiation. As the photo-acid generator, for example, it is possible to appropriately select and use a common compound which generates an acid due to irradiation with actinic rays or radiation using a photo-initiator for optical cationic polymerization, a photo-initiator for optical radical polymerization, an optical achromatizing agent, an optical discoloring agent, or a micro resist, or a mixture of these.

Examples of these are an onium salt such as a sulfonium salt or an iodonium salt, and a diazo disulfonic compound such as bis(alkylsulfonyl diazomethane). In the present application, it is preferable that the cation portion be an onium salt such as a sulfonium salt or an iodonium salt and the acid which is generated be an organic sulfonic acid.

Specific examples of the photo-acid generator are shown below but are not limited to these.

[Chem. 36]

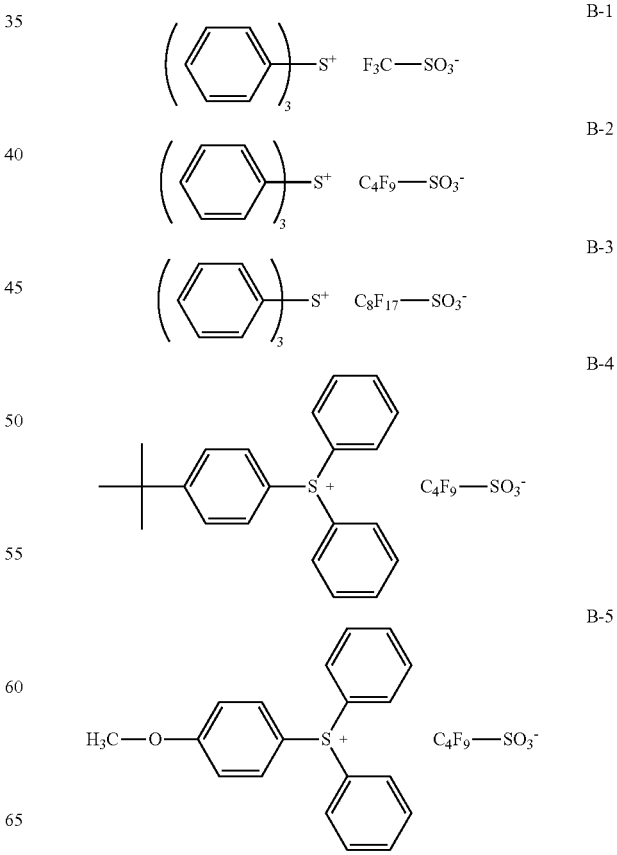

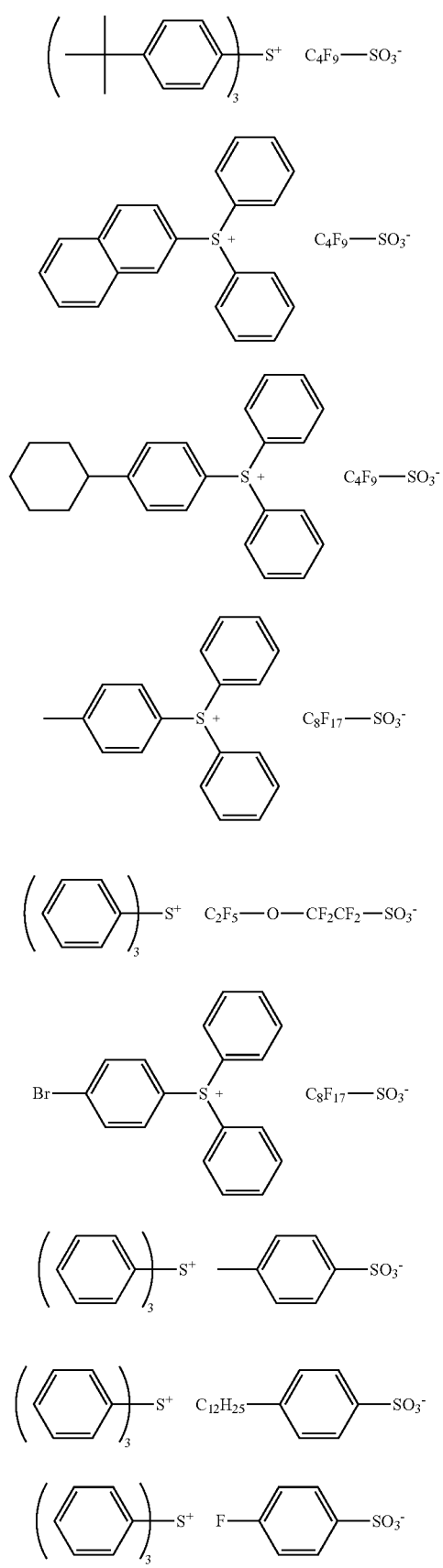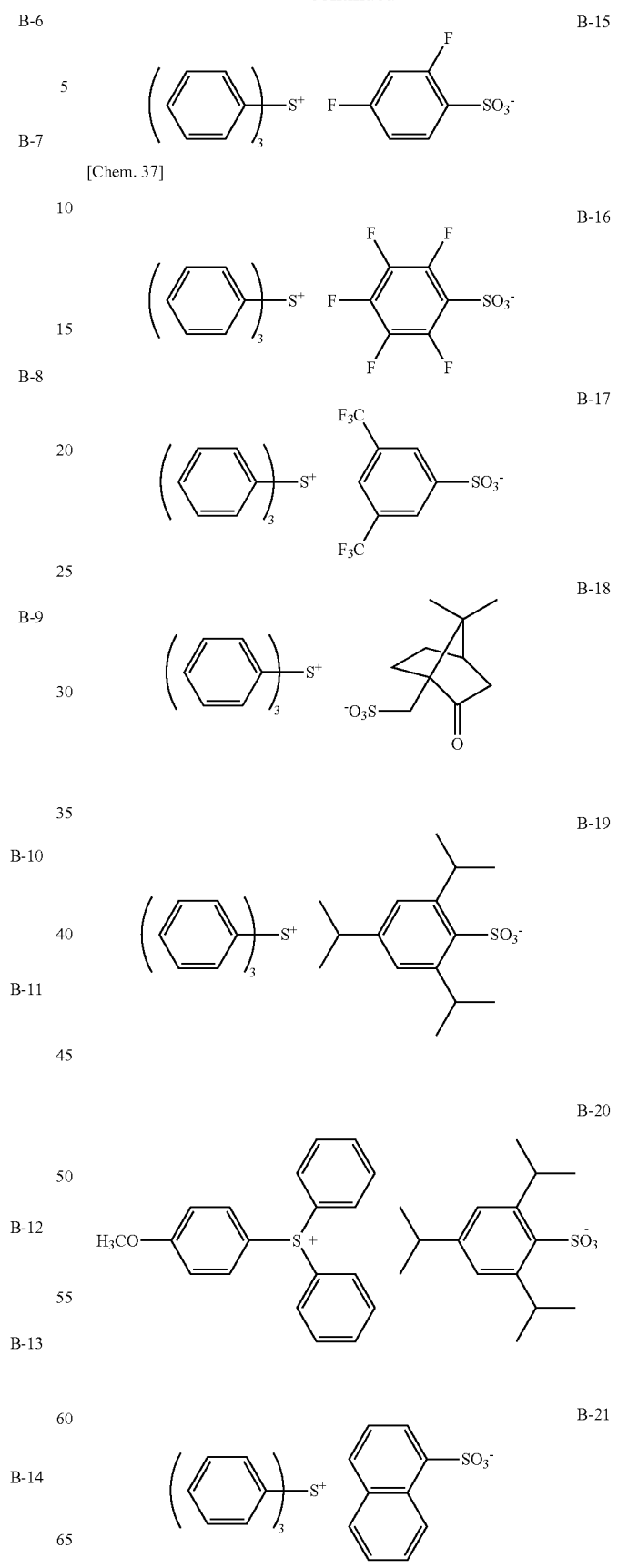

B-22
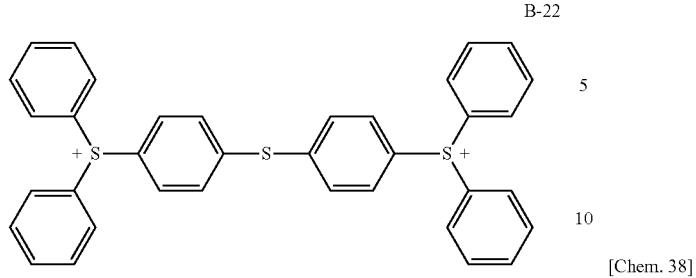
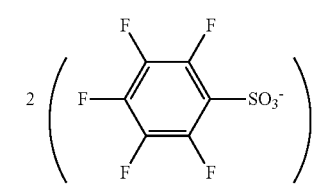
B-23
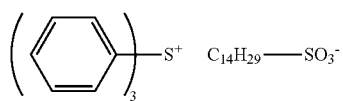
B-24
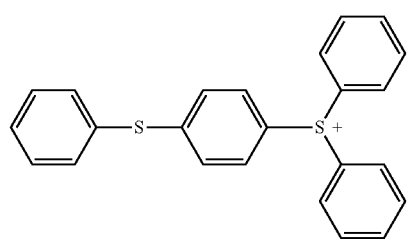
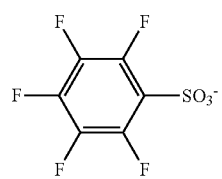
B-25
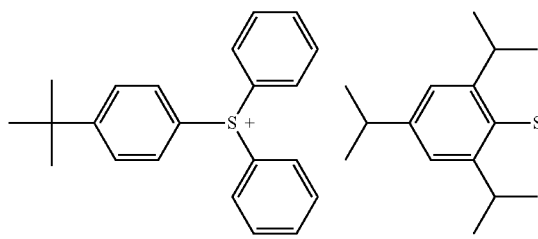
B-26
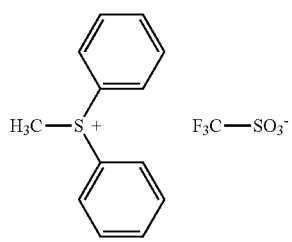
[Chem. 38]
B-27
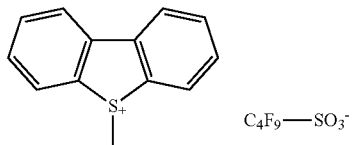
B-28
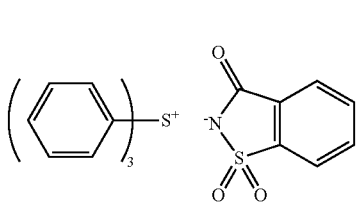
B-29
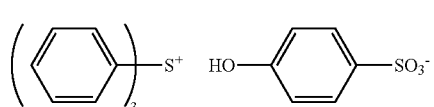
B-30
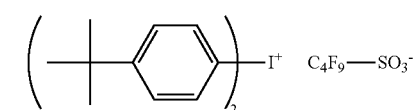
B-31
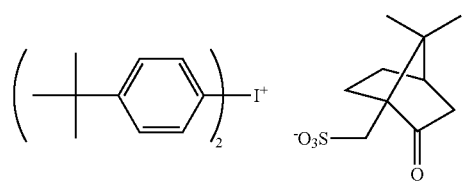
B-32
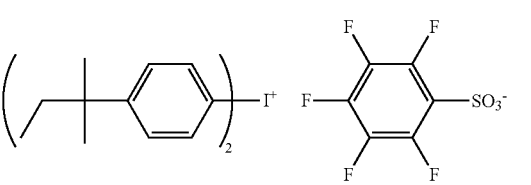
B-33
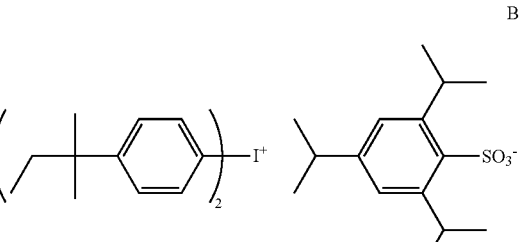
[Chem. 39]
B-57
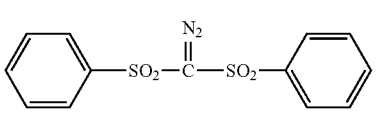
B-58
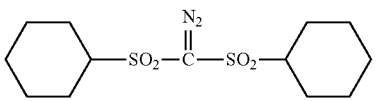

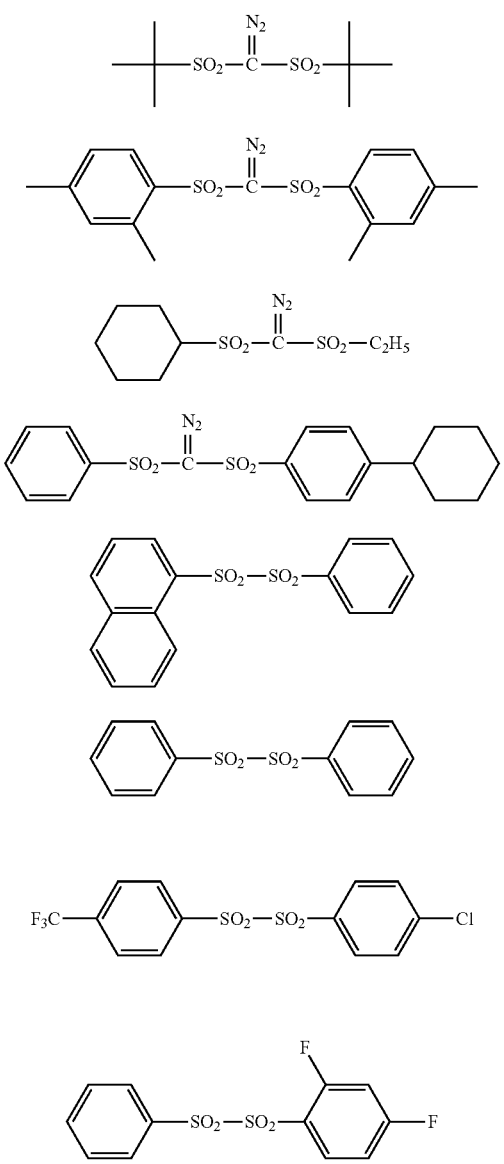

In addition, it is possible for the actinic ray-sensitive or radiation-sensitive resin composition of the present invention to further include a basic compound, a resin where the rate of solubility with regard to the alkaline aqueous solution through being decomposed by the action of an acid is increased, a solubility promoting agent with regard to a surfactant, an acid decomposition solubility inhibiting compound, a dye, a plasticizer, a light sensitizer, or a developer, or a compound with a proton acceptor moiety as required.

[2] Basic Compound

The actinic ray-sensitive or radiation-sensitive resin composition of the present invention may further include a basic compound.

The basic compound is preferably a nitrogen-containing organic basic compound.

The basic compound which is able to be used is not particularly limited, but, for example, the compounds which are classified into (1) to (4) below are preferably used.

(1) Compound which are represented by the general formula (BS-1) below.

[Chem. 40]

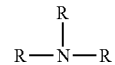

(BS-1)

In the general formula (BS-1), R each independently represent any of a hydrogen atom, an alkyl group (linear or branched), a monovalent aliphatic hydrocarbon ring group (single ring or polycyclic), a monovalent aromatic ring group, or a group where an alkylene group and a monovalent aromatic ring group are combined. However, it is necessary that all three of Rs are not hydrogen atoms.

The carbon number of the alkyl group as R is not particularly limited but is normally 1 to 20 and preferably 1 to 12.

The carbon number of the monovalent aliphatic hydrocarbon ring group as R is not particularly limited but is normally 3 to 20 and preferably 5 to 15.

The carbon number of the monovalent aromatic ring group as R is not particularly limited but is normally 6 to 20 and preferably 6 to 10. Specifically, there is an aryl group such as a phenyl group and a naphthyl group.

The carbon number of the group, where an alkylene group and a monovalent aromatic ring group are combined, as R is not particularly limited but is normally 7 to 20 and preferably 7 to 11. Specifically, there is an aralkyl group such as a benzyl group.

A hydrogen atom in the alkyl group, the monovalent aliphatic hydrocarbon ring group, the monovalent aromatic ring group, or the group, where an alkylene group and a monovalent aromatic ring group are combined, as R may be substituted using a substituent. As the substituent, there are the examples of an alkyl group, a monovalent aliphatic hydrocarbon ring group, a monovalent aromatic ring group, a group where an alkylene group and a monovalent aromatic ring group are combined, a hydroxyl group, a carboxyl group, an alkoxy group, an aryloxy group, an alkylcarbonyloxy group, an alkyloxycarbonyl group, and the like.

It is preferable that the compound which is represented by the general formula (BS-1) have only one of the three Rs as a hydrogen atom or that all of the Rs not be hydrogen atoms.

As specific examples of the compound of the general formula (BS-1), there are the examples of tri-n-butylamine, tri-n-pentylamine, tri-n-octylamine, tri-n-decylamine, tri-iso-decylamine, dicyclohexylmethylamine, tetradecylamine, pentadecylamine, hexadecylamine, octadecylamine, didecylamine, octadecylmethylamine, dimethylundecylamine, N,N-dimethyldodecylamine, methyldioctadecylamine, N,N-di-butylaniline, N,N-dihexylaniline, 2,6-diisopropylaniline, 2,4,6-tri(t-butyl)aniline, and the like.

In addition, in the general formula (BS-1), as one preferable aspect, there is a compound where at least R is a group where the alkyl group is substituted by a hydroxyl group. As specific compounds, there are the examples of triethanolamine, N,N-dihydroxyethylaniline, and the like.

In addition, the alkyl group as R may have an oxygen atom in the alkyl chain and an oxyalkylene chain may be formed. As the oxyalkylene chain, —$CH_2CH_2O$— is preferable. As specific examples, there are tris(methoxyethoxyethyl)amine, a compound which is disclosed from line 60, column 3 in the specifications of U.S. Pat. No. 6,040,112, and the like.

(2) Compound with Nitrogen-Containing Polycyclic Ring Structure

The polycyclic structure may have or may not have aromaticity. In addition, there may be a plurality of nitrogen atoms, and furthermore, a hetero atom other than nitrogen may be included. Specifically, there are the examples of a compound with an imidazole structure (2-phenylbenzimidazole, 2,4,5-triphenylimidazole, and the like), a compound with a piperidine structure (N-hydroxyethyl piperidine, bis(1,2,2,6,6-pentamethyl-4-piperidyl) sebacate, and the like), a compound with a pyridine structure (4-dimethylaminopyridine), a compound with an antipyrine structure (antipyrine, hydroxyantipyrine, and the like), and the like.

In addition, a compound with two or more ring structures is appropriately used. Specifically, there are the examples of 1,5-diazabicyclo[4.3.0]nona-5-ene, 1,8-diazabicyclo[5.4.0]-undeca-7-ene, and the like.

(3) Amine Compound with Phenoxy Group

The amine compound with a phenoxy group has a phenoxy group at a terminal on a side opposite to the nitrogen atom of the alkyl group of the amine compound. The phenoxy group may, for example, have a substituent such as an alkyl group, an alkoxy group, a halogen atom, a cyano group, a nitro group, a carboxyl group, a carboxylic acid ester group, a sulfonic acid ester group, an aryl group, an aralkyl group, an acyloxy group, and an aryloxy group.

More preferable is a compound with at least one oxyalkylene chain between the phenoxy group and the nitrogen atom. The number of oxyalkylene chains in one molecule is preferably 3 to 9 and more preferably 4 to 6. It is preferable to have —CH$_2$CH$_2$O— in the oxyalkylene chain.

As specific examples, there are 2-[2-{2-(2,2-dimethoxyphenoxy)ethyl}-bis-(2-methoxyethyl)]-amine, compounds (C1-1) to (C3-3) which are disclosed in paragraph [0066] of US2007/0224539A, and the like.

(4) Ammonium Salt

An ammonium salt may also be arbitrarily used. The ammonium salt is preferably a hydroxide or a carboxylate. More specifically, a tetraalkylammonium hydroxide which is typified by tetrabutylammonium hydroxide is preferable.

Other than this, a compound which is synthesized in Examples of JP2002-363146A and a compound which is described in paragraph [0108] of JP2007-298569A, and the like are able to be used.

The basic compound may be used alone, or two or more kinds of basic compounds may be used in combination.

The usage amount of the basic compound based on the total solid content of the actinic ray-sensitive or radiation-sensitive resin composition is normally 0.001 to 10 mass % and is preferably 0.01 to 5 mass %.

The molar ratio of the photo-acid generator/the basic compound is preferably from 2.5 to 300. That is, the molar ratio is preferably 2.5 or more from the viewpoint of sensitivity and resolution and preferably 300 or less from the viewpoint of suppressing the reduction in resolution due to thickening of the pattern over time after exposure until heat treatment. The molar ratio is more preferably from 5.0 to 200 and is still more preferably from 7.0 to 150.

[3] Acid Decomposable Resin Other than Resin (P)

The actinic ray-sensitive or radiation-sensitive resin composition of the present invention may further contain an acid decomposable resin (referred to below simply as "acid decomposable resin") other than the resin (P) as the acid decomposable resin.

The acid decomposable resin is a resin with a group (acid decomposable group), which is decomposed by the action of an acid and generates an alkali soluble group, in the main chain or a side chain of the resin or in both the main chain and a side chain. Among these, a resin with an acid decomposable group in a side chain is preferable.

As disclosed in EP254853B, JP1990-25850A (JP-H2-25850A), JP1991-223860A (JP-H3-223860A), JP1992-251259A (JP-H4-251259A), and the like, the acid decomposable resin is able to be obtained by reacting a precursor of a group which is able to be decomposed by acid with the alkali soluble resin or by copolymerization of an alkali soluble resin monomer, which is bonded with a group which is able to be decomposed by acid, with various monomers.

As the acid decomposable group, for example, a group, where the hydrogen atom in the alkali soluble group is substituted by a group which is desorbed due to the action of an acid, is preferable in a resin with the alkali soluble group such as a —COOH group and an —OH group.

As the acid decomposable group, specifically, the preferable example can be the group which is the same as the acid decomposable group which was described in the resin of the present invention described above (for example, the acid decomposable group which was described as the repeating unit (C) in the resin (P)).

As the resin with the alkali soluble group, there is no particular limitation, but examples are a resin which has poly(o-hydroxystyrene), poly(m-hydroxystyrene), poly(p-hydroxystyrene) and copolymers thereof, hydrogenated poly(hydroxystyrene), poly(hydroxystyrene) which has a substituent represented by the structures below, or a phenolic hydroxyl group, an alkali soluble resin with a hydroxystyrene structural unit such as a styrene-hydroxystyrene copolymer, a α-methylstyrene-styrene-hydroxystyrene copolymer, and a hydrogenated novolak resin, and an alkali soluble resin which contains a repeating unit with a carboxyl group such as a (meth)acrylic acid or a norbornene carboxylic acid.

[Chem. 41]

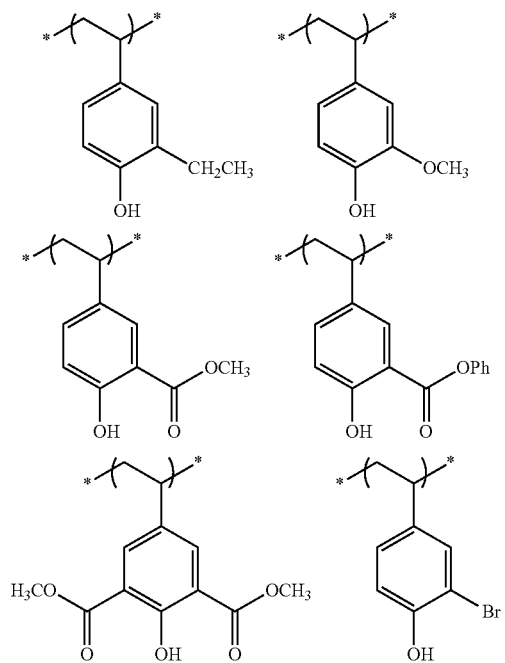

-continued

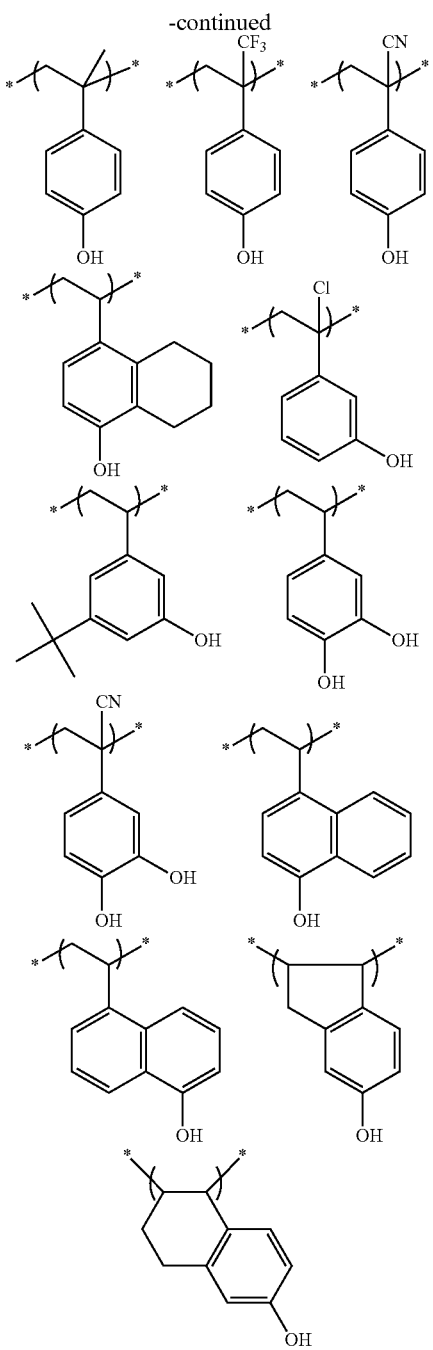

It is preferable that the rate of alkali solubility of the alkali soluble resins be 170 Å/second or more when measured (23° C.) using tetramethylammonium hydroxide (TMAH) with 2.38 mass %. 330 Å/second or more is particularly preferable.

With the number (X) of the repeating units which have the group which is able to be decomposed by acid in the resin and the number (Y) of the repeating units which have the alkali soluble group which is not protected by the group which is to be eluted by acid, the content of the group which is able to be decomposed by acid is represented by X/(X+Y). The content is preferably 0.01 to 0.7, is more preferably 0.05 to 0.50, and is even more preferably 0.05 to 0.40.

The weight average molecular weight of the acid decomposable resin is preferably 50,000 or less, is more preferably 1,000 to 20,000, and is particularly preferably 1,000 to 10,000 as a polystyrene conversion value using a GPC method.

Dispersion (Mw/Mn) of the acid decomposable resin is preferably 1.0 to 3.0, is more preferably 1.05 to 2.0, and is even more preferably, 1.1 to 1.7.

The acid decomposable resin may be used as a combination of two types or more.

The actinic ray-sensitive or radiation-sensitive resin composition of the present invention may or may not contain the acid decomposable resin other than the resin (P), and in the case of being contained, the mixing amount of the acid decomposable resin other than the resin (P) in the composition is preferably 0.1 to 70 mass %, is more preferably 0.1 to 50 mass %, and is even more preferably 0.1 to 30 mass % in the total solid content of the composition.

The composition of the present invention may further use a resin which has both a repeating unit which generates an acid due to the irradiation with actinic rays or radiation and a repeating which contains a group which is decomposed by the action of an acid and where the rate of solubility in the alkali developer is increased. As an example which is preferably used as such a resin, there are resins which are exemplified in JP1997-325497A (JP-H9-325497A), JP2009-93137A, JP2010-85971, JP2011-256856, and the like.

[4] Solvent

The actinic ray-sensitive or radiation-sensitive resin composition of the present invention preferably contains a solvent. As the solvent, for example, there can be the examples of organic solvents such as alkylene glycol monoalkyl ether carboxylate, alkylene glycol mono alkyl ether, an alkyl ester of lactic acid, alkyl alkoxycarbonyl propionate, a cyclic lactone (preferably with a carbon number of 4 to 10), a monoketone compound which may contain a ring (preferably with a carbon number of 4 to 10), alkylene carbonate, alkyl alkoxy acetate, and alkyl pyruvate.

As the alkylene glycol mono alkyl ether carboxylate, for example, there preferably are propylene glycol monomethyl ether acetate (PGMEA; other name of 1-methoxy-2-acetoxymethylpropane), propylene glycol monomethyl ether acetate, propylene glycol monopropyl ether acetate, propylene glycol monobutyl ether acetate, propylene glycol monomethyl ether propionate, propylene glycol monomethyl ether propionate, ethylene glycol monomethyl ether acetate, and ethylene glycol monoethyl ether acetate.

As the alkylene glycol monoalkyl ether, for example, there preferably are propylene glycol monomethyl ether (PGME; other name 1-methoxy-2-propanol), propylene glycol monoethyl ether, propylene glycol mono propyl ether, propylene glycol monobutyl ether, ethylene glycol monomethyl ether, and ethylene glycol mono ethyl ether.

As the alkyl ester of lactic acid, for example, there preferably are methyl lactate, ethyl lactate, propyl lactate, and butyl lactate.

As the alkyl alkoxycarbonyl propionate, for example, there preferably are 3-ethylethoxy propionate, 3-methylmethoxy propionate, 3-methylethoxy propionate, and 3-ethylmethoxy propionate.

As the cyclic lactone, for example, there preferably are β-propiolactone, β-butyrolactone, γ-butyrolactone, α-methyl-γ-butyrolactone, β-methyl-γ-butyrolactone, γ-valerolactone, γ-caprolactone, γ-octanoic lactone, and α-hydroxy-γ-butyrolactone.

As the monoketone compound which may contain a ring, for example, there preferably are 2-butanone, 3-methylbutanone, pinacolone, 2-pentanone, 3-pentanone, 3-methyl-2-pentanone, 4-methyl-2-pentanone, 2-methyl-3-pentanone, 4,4-dimethyl-2-pentanone, 2,4-dimethyl-3-pentanone, 2,2,4, 4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexen-2-one, 3-penten-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone, and 3-methylcycloheptanone.

As the alkylene carbonate, for example, there preferably are propylene carbonate, vinylene carbonate, ethylene carbonate, and butylene carbonate.

As the alkylalkoxy acetate, for example, there preferably are 2-methoxyethyl acetate, 2-ethoxyethyl acetate, 2-(2-ethoxyethoxy)ethyl acetate, 3-methoxy-3-methylbutyl acetate, and 1-methoxy-2-propyl acetate.

As the alkyl pyruvate, for example, there preferably are methyl pyruvate, ethyl pyruvate, and propyl pyruvate.

As the preferable solvent which is able to be used, there are the examples of 2-heptanone, cyclopentanone, γ-butyrolactone, cyclohexanone, butyl acetate, ethyl lactate, ethylene glycol monoethyl ether acetate, propylene glycol monomethyl ether acetate, propylene glycol monomethyl ether, 3-ethylethoxy propionate, ethyl pyruvate, 2-ethoxyethyl acetate, 2-(2-ethoxyethoxy)ethyl acetate, and propylene carbonate. As a particularly preferable solvent, there are the examples of a propylene glycol monomethyl ether acetate and a propylene glycol monomethyl ether.

In the present invention, the solvent described above may be used by itself or two or more types may be used together.

The actinic ray-sensitive or radiation-sensitive resin composition of the present invention preferably contains a solvent with a boiling point of 150° C. or less at normal pressure (760 mmHg).

The solvent described above may be used by itself or two or more types may be used together. In addition, the solvent may be used together with a solvent where the boiling point exceeds 150° C. at normal pressure. In the composition of the present invention, the content amount of the solvent with the boiling point of 150° C. or less is preferably 50 mass % or more and is more preferably 65 mass % or more with regard to the total amount of the solvent. 70 mass % to 100 mass % is particularly preferable.

The solvent with the boiling point of 150° C. or less preferably has a boiling point of 50 to 150° C. and the boiling point is more preferably 80 to 150° C.

The solvent with the boiling point of 150° C. or less is preferably an organic solvent, and for example, it is possible to be selected from an organic solvent such as alkylene glycol mono alkyl ether carboxylate, alkylene glycol mono alkyl ether, an alkyl ester of lactic acid, alkyl alkoxycarbonyl propionate, a cyclic lactone, a monoketone compound which may contain a ring, alkylene carbonate, alkylalkoxy acetate, and alkyl pyruvate.

For example, from the solvents shown below, a solvent with a boiling point of 150° C. or less at normal pressure is selected, and it is possible to further use an individual or two or more types of a solvent where the boiling point exceeds 150° C. at normal pressure.

As the alkylene glycol mono alkyl ether carboxylate, for example, there preferably are propylene glycol monomethyl ether acetate (PGMEA; 1-methoxy-2-acetoxymethylpropane) (b.p.=146° C.), propylene glycol monomethyl ether acetate (b.p.=164 to 165° C.), propylene glycol monopropyl ether acetate (b.p.=173-174° C./740 mmHg), ethylene glycol monomethyl ether acetate (b.p.=143° C.), and ethylene glycol monoethyl ether acetate (b.p.=156° C.).

As the alkylene glycol mono alkyl ether, for example, there preferably are propylene glycol monomethyl ether (PGME; 1-methoxy-2-propanol) (b.p.=119° C.), propylene glycol monomethyl ether (b.p.=130 to 131° C.), propylene glycol monopropyl ether (b.p.=148° C.), propylene glycol monomethyl ether (b.p.=169 to 170° C.), ethylene glycol monomethyl ether (b.p.=124 to 125° C.), and ethylene glycol monoethyl ether (b.p.=134 to 135° C.).

As the alkyl ester of lactic acid, for example, there preferably are methyl lactate (b.p.=145° C.), ethyl lactate (b.p.=154° C.), propyl lactate (b.p.=169-172° C.), and butyl lactate (b.p.=185 to 187° C.).

As the alkyl alkoxycarbonyl propionate, for example, there preferably are 3-ethylethoxy propionate (b.p.=169 to 170° C.), 3-methylethoxy propionate (b.p.=138 to 141° C.), and 3-ethylmethoxy propionate (b.p.=156 to 158° C.).

As the cyclic lactone, for example, there preferably are β-propiolactone (b.p.=162° C.), β-butyrolactone (b.p.=71 to 73° C./29 mmHg), γ-butyrolactone (b.p.=204 to 205° C.), α-methyl-γ-butyrolactone (b.p.=78 to 81° C./10 mmHg), β-methyl-γ-butyrolactone (b.p.=87 to 88° C./10 mmHg), γ-valerolactone (b.p.=82 to 85° C./10 mmHg), γ-caprolactone (b.p.=219° C.), γ-octanoic lactone (b.p.=234° C.), and α-hydroxy-γ-butyrolactone (b.p.=133° C./10 mmHg).

As the monoketone compound which may contain a ring, for example, there preferably are 2-butanone (b.p.=80° C.), 3-methylbutanone (b.p.=94 to 95° C.), pinacolone (b.p.=106° C.), 2-pentanone (b.p.=101 to 105° C.), 3-pentanone (b.p.=102° C.), 3-methyl-2-pentanone (b.p.=118° C.), 4-methyl-2-pentanone (b.p.=117 to 118° C.), 2-methyl-3-pentanone (b.p.=113° C.), 4,4-dimethyl-2-pentanone (b.p.=125 to 130° C.), 2,4-dimethyl-3-pentanone (b.p.=124° C.), 2,2,4,4-tetramethyl-3-pentanone (b.p.=152 to 153° C.), 2-hexanone (b.p.=127° C.), 3-hexanone (b.p.=123° C.), 5-methyl-2-hexanone (b.p.=145° C.), 2-heptanone (b.p.=149 to 150° C.), 3-heptanone (b.p.=146 to 148° C.), 4-heptanone (b.p.=145° C.), 2-methyl-3-heptanone (b.p.=158 to 160° C.), 5-methyl-3-heptanone (b.p.=161 to 162° C.), 2,6-dimethyl-4-heptanone (b.p.=165 to 170° C.), 2-octanone (b.p.=173° C.), 3-octanone (b.p.=167 to 168° C.), 2-nonanone (b.p.=192° C./743 mmHg), 3-nonanone (b.p.=187 to 188° C.), 5-nonanone (b.p.=186 to 187° C.), 2-decanone (b.p.=211° C.), 3-decanone (b.p.=204 to 205° C.), 4-decanone (b.p.=206 to 207° C.), 5-hexen 2-one (b.p.=128 to 129° C.), 3-penten-2-one (b.p.=121 to 124° C.), cyclopentanone (b.p.=130 to 131° C.), 2-methylcyclopentanone (b.p.=139° C.), 3-methylcyclopentanone (b.p.=145° C.), 2,2-dimethylcyclopentanone (b.p.=143 to 145° C.), 2,4,4-trimethylcyclopentanone (b.p.=160° C.), cyclohexanone (b.p.=157° C.), 3-methylcyclohexanone (b.p.=169 to 170° C.), 4-methylcyclohexanone (b.p.=169 to 171° C.), 4-ethylcyclohexanone (b.p.=192 to 194° C.), 2,2-dimethylcyclohexanone (b.p.=169 to 170° C.), 2,6-dimethylcyclohexanone (b.p.=174 to 176° C.), 2,2,6-trimethylcyclohexanone (b.p.=178 to 179° C.), cycloheptanone (b.p.=179° C.), 2-methylcycloheptanone (b.p.=182 to 185° C.), and 3-methylcycloheptanone (b.p.=100° C./40 mmHg)

As the alkylene carbonate, for example, there preferably are propylene carbonate (b.p.=240° C.), vinylene carbonate (b.p.=162° C.), ethylene carbonate (b.p.=243 to 244° C./740 mmHg), and butylene carbonate (b.p.=88° C./0.8 mmHg).

As the alkylalkoxy acetate, for example, there preferably are 2-methoxyethyl acetate (b.p.=145° C.), 2-ethoxyethyl acetate (b.p.=155 to 156° C.), 2-(2-ethoxyethoxy)ethyl acetate (b.p.=219° C.), and 1-methoxy-2-propyl acetate (b.p.=145 to 146° C.).

As the alkyl pyruvate, for example, there preferably are methyl pyruvate (b.p.=134 to 137° C.), ethyl pyruvate (b.p.=144° C.), and propyl pyruvate (b.p.=166° C.).

As a preferable solvent which is able to be used, there are the examples of 2-heptanone, cyclopentanone, γ-butyrolactone, cyclohexanone, butyl acetate, ethyl lactate, ethylene glycol monoethyl ether acetate, propylene glycol monomethyl ether acetate, propylene glycol monomethyl ether, 3-ethylethoxy propionate, ethyl pyruvate 2-ethoxyethyl acetate, 2-(2-ethoxyethoxy)ethyl acetate, and propylene carbonate, but from the point of view of reducing outgassing, a solvent with a boiling point of 150° C. at normal temperature is preferable such as 2-heptanone, propylene glycol monomethyl ether acetate, and propylene glycol monomethyl ether.

The usage amount of the solvent in the total amount of the composition of the present invention (including that with a boiling point of 150° C. or more and that with a boiling point of less than 150° C.) is able to be appropriately adjusted according to the desired film thickness and the like, but typically, the concentration of the total solid content of the composition is 0.5 to 30 mass %, is preferably 1.0 to 20 mass %, and more preferably 1.5 to 10 mass %.

[5] Surfactant

The actinic ray-sensitive or radiation-sensitive resin composition of the present invention preferably further contains a surfactant. As the surfactant, a fluorine based and/or a silicon based surfactant is preferable.

As the corresponding surfactant, there are the examples of Megafac F177 and Megafac R08 manufactured by Dainippon Ink and Chemicals Inc., PF656 and PF 6320 manufactured by OMNOVA Solutions Inc., Troysol S-366 manufactured by Troy Chemical Corp., FLUORAD FC430 manufactured by Sumitomo 3M Ltd., Polysiloxane polymer KP-341 manufactured by Shin-Etsu Chemical Industry Co., and the like.

In addition, it is possible to use other surfactants other than fluorine based and/or silicon based surfactants, more specifically, a polyoxyethylene alkyl ether, a polyoxyethylene alkyl aryl ether, and the like.

Other than this, it is possible to appropriately use a known surfactant. Surfactants which are able to be used, for example, are surfactants which are disclosed from paragraph [0339] and beyond in US 2008/0248425A.

The surfactant may be used by itself or two or more types may be used.

The usage amount of the surfactant is preferably 0.0001 to 2 mass %, is more preferably 0.001 to 1 mass %, and even more preferably 0.005 to 0.1 mass % with regard to the total solid content of the actinic ray-sensitive or radiation-sensitive resin composition.

[6] Acid Decomposable Solubility Inhibiting Compound

The actinic ray-sensitive or radiation-sensitive resin composition of the present invention is able to contain a solubility inhibiting compound with a molecular weight of 3000 or less (referred to below as "solubility inhibiting compound") where the rate of solubility in the alkali developer by being decomposed due to the action of an acid is increased.

As the solubility inhibiting compound, there are an alicyclic or aliphatic compound which contains an acid decomposable group such as a cholic acid derivative which includes an acid decomposable group described in Proceedings of SPIE, 2724, 355 (1996). As the acid decomposable group and the alicyclic structure, there are the same as the acid decomposable groups described above.

The actinic ray-sensitive or radiation-sensitive resin composition of the present invention preferably contains a structure where a phenolic hydroxyl group of a phenolic compound is substituted with the acid decomposable group in a case of irradiation using an electron beam or EUV light. The phenolic compound preferably contains 1 to 9 phenol skeletons and more preferably contains 2 to 6.

The molecular weight of the solubility inhibiting compound in the present invention is 3000 or less and is preferably 300 to 3000, and is more preferably 500 to 2500.

[7] Other Components

The actinic ray-sensitive or radiation-sensitive resin composition of the present invention may contain a dye. As an appropriate dye, there are the examples of an oil based dye and a basic dye.

It is possible to further add a light sensitizer such as that described below in order to improve the acid generation efficiency using exposure.

A solubility promoting compound with regard to the developer which is able to be used in the present invention is a low-molecular compound with a molecular weight of 1,000 or less where there are two or more phenolic OH groups and one or more carboxy groups. An alicyclic or aliphatic compound is preferable in a case where there is a carboxy group. The phenolic compounds with a molecular weight of 1,000 or less, for example, it is possible that there are those disclosed in JP1992-122938A (JP-H4-122938A), JP1990-28531A (JP-H2-28531A), U.S. Pat. No. 4,916,210B, and EP219294B.

In addition, it is possible to also appropriately use a compound with a proton acceptor functional group which is disclosed in JP2006-208781A and JP2007-286574A with regard to the composition of the present application.

[8] Pattern Formation Method

The actinic ray-sensitive or radiation-sensitive resin composition of the present invention is coated onto a support body such as a substrate and forms a film. The film thickness of the resist film is preferably 0.02 to 0.1 μm.

As the method of coating on the substrate, spin coating is preferable and a number of revolutions of 1000 to 3000 rpm is preferable.

For example, the actinic ray-sensitive or radiation-sensitive resin composition of the present invention is coated using an appropriate coating method such as a spinner or a coater on a substrate which is used in the manufacturing of precision integrated circuit elements, photomasks, imprint mold structures, and the like (example: silicon, silicon with silicon dioxide coating, silicon nitride, quartz substrate with a Cr layer, and the like), dried and formed into a film. Here it is also possible to coat a known antireflection film in advance.

The film is irradiated with actinic rays or radiation, preferably, at least one of an electron beam (EB), an X ray, or EUV light, baking (heating) is preferably performed, and is developed. Due to this, it is possible to obtain an excellent pattern.

In the development process, normally, an alkali developer is used. As the alkali developer of the composition of the present invention, it is possible to use an alkaline aqueous solution such as an inorganic alkali such as sodium hydroxide, potassium hydroxide, sodium carbonate, sodium silicate, sodium metasilicate, aqueous ammonia, a primary amine such as ethylamine and n-propylamine, a secondary amine such as di-n-butylamine and diethylamine, a tertiary amine such as triethylamine and methyldiethylamine, an alkanolamine such as dimethylethanolamine and triethanolamine, a quaternary ammonium salt such as tetramethylammonium hydroxide and tetraethylammonium hydroxide, and a cyclic amine such as pyrrole and piperidine.

Furthermore, it is possible to use by adding an appropriate amount of an alcohol and a surfactant to the alkali developer described above.

The alkali concentration of the alkali developer is normally 0.1 to 20 mass %.

The pH of the alkali developer is normally 10.0 to 15.0.

Here, for the details of a case where an imprint mold structure is manufactured by applying the composition of the present invention, for example, reference may be made to "Science and New Technology in Nanoimprint", edited by Yoshihiko Hirai, Frontier Publishing (published in June 2006), JP4109085B, JP2008-162101A, and the like.

EXAMPLES

Below, the present invention will be described in further detail using examples, but the content of the present invention is not limited due to these.

Synthesis Example 1

Resin (A-1)

A resin (A-1) described above was synthesized according to the scheme below.

and was purified using column chromatography with hexane/ethyl acetate, and 14.7 parts by mass of the monomer (2) was obtained.

Synthesis of Monomer (3)

50 parts by mass of triphenylsulfonium bromide was dissolved in 50 parts by mass of methanol. To the resulting solution, a mixed solution, which was obtained by stirring 30 parts by mass of 4-sodium styrene sulfonate, 50 parts by mass of methanol, and 130 parts by mass of deionized water at room temperature, was added dropwise. Subsequently, deionized water and chloroform were added and a product was extracted in an organic layer, and next, the organic layer was washed using deionized water. After the concentration of the organic layer, the deposited solid was made into slurry with hexane/ethyl acetate and filtered and 48 parts by mass of the monomer (3) was obtained.

Synthesis of Resin (A-1)

A mixture was obtained by dissolving 13.94 g of a compound (1) (50% propylene glycol monomethyl ether solution), 8.23 g of a compound (2), 4.47 g of a compound (3), 0.21 g of a compound (4), and 2.30 g of a polymerization initiator V-601 (manufactured by Wako Pure Chemical Industries) in 16.88 g of propylene glycol monomethyl ether (PGME). PGME (5.96 g) was added in a reaction container,

[Chem. 42]

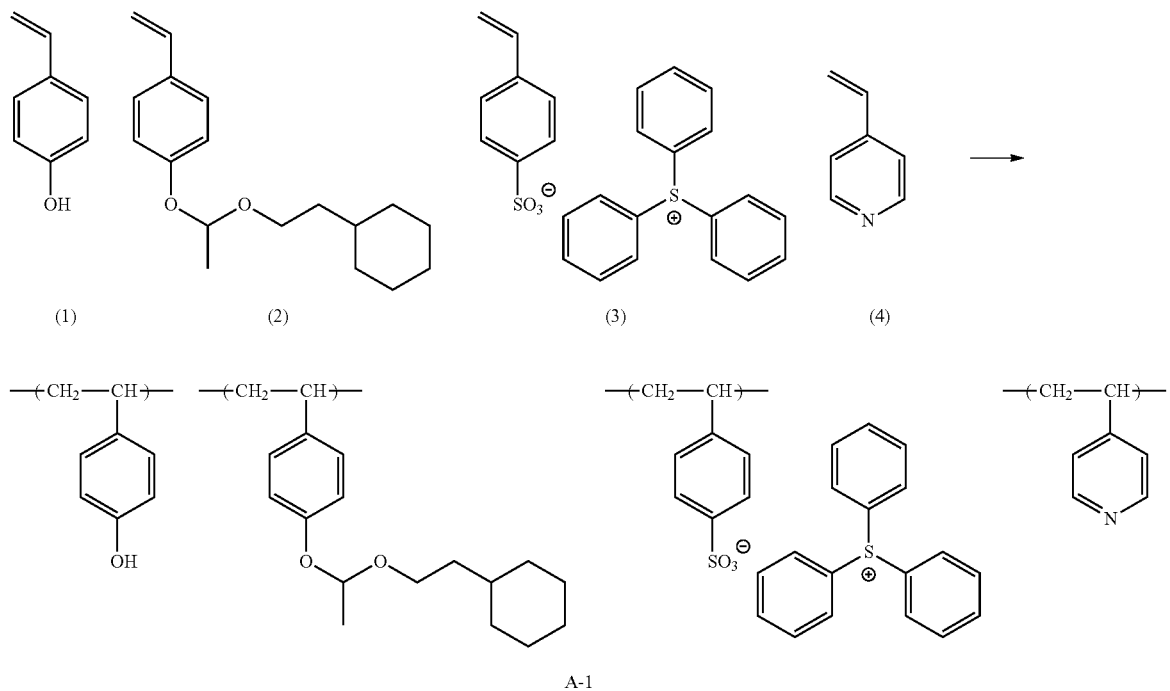

Synthesis of Monomer (2)

10 parts by mass of p-Hydroxy styrene and 0.01 parts by mass of a pyridine salt of p-toluenesulfonic acid were dissolved in 80 parts by mass of ethyl acetate at room temperature. While stirring the solution, a mixed solution of 13.1 parts by mass of 2-cyclohexylethyl vinyl ether and 20 parts by mass of ethyl acetate was added dropwise at room temperature. After dropwise addition, further reaction was performed for 24 hours at room temperature. Triethylamine was added to the reaction solution and the solution was basified, the organic layer was concentrated after washing with deionized water and after being heated to 85° C. in a nitrogen gas atmosphere, the mixture solution was added dropwise over two hours. Thus obtained reaction solution was heated and stirred over four hours, and then cooled to room temperature.

The above-mentioned reaction solution was diluted by adding 47 g of acetone. The diluted solution was added dropwise to 1000 g of hexane/ethyl acetate=8/2 and a polymer was precipitated and filtered. The filtered solid was washed using 250 g of hexane/ethyl acetate=8/2. The thus obtained solid was dissolved in 80 g of acetone, then added dropwise to 1000 g of methanol/distilled water=1/9 and a polymer was precipitated and filtered. The filtered solid was washed using 250 g of methanol/distilled water=1/9. After that, the washed solid was dried under reduced pressure and 6.56 g of the resin A-1 was obtained.

Other Resins (A-2) to (A-10), (a'-1), and (a'-2)

The previous resins (A-2) to (A-10) and (a'-1) and (a'-2) which are shown at the end for contrast were synthesized in the same manner as the Synthesis Example 1. In addition, the weight average molecular weight (Mw) and dispersion (Mw/Mn) were measured with regard to these resins. The results are shown in the table below with composition ratios.

TABLE 1

| Resin (P) | Molecular Weight | Composition Ratio (mol %) | Dispersion (Mw/Mn) |
|---|---|---|---|
| A-1 | 10800 | 58/30/10/2 | 1.5 |
| A-2 | 11000 | 63/25/10/2 | 1.4 |
| A-3 | 10200 | 68/20/9/3 | 1.5 |
| A-4 | 10350 | 47/40/11/2 | 1.5 |
| A-5 | 10500 | 43/45/10/2 | 1.5 |
| A-6 | 11300 | 62/25/10/3 | 1.5 |
| A-7 | 11000 | 56/30/10/4 | 1.4 |
| A-8 | 10600 | 26/60/10/4 | 1.5 |
| A-9 | 10500 | 30/57/10/3 | 1.5 |
| A-10 | 10600 | 44/40/12/4 | 1.5 |
| a'-1 | 11750 | 49/51 | 1.6 |
| a'-2 | 11850 | 65/35 | 1.5 |

[1] Resist Evaluation (EB Exposure)

Manufacture of Chemical Amplification Positive Resist

Example 1

The components which are shown below (each component amount is the mass % with the total solid content as a standard) were dissolved in a mixed solution of propylene glycol monomethyl ether acetate/propylene glycol monomethyl ether=40/60 (mass ratio) and a solution of solid content with a concentration of 1.8 mass % was prepared.

Example 1

| Resin A-1 | 99.99 mass % |
|---|---|
| Megafac F177 (manufactured by Dainippon Ink and Chemicals Inc., fluorine based) | 0.01 mass % |

Examples 2 to 10

Other than modifying the resin A-1 to the resins which are shown in the table below, the other resin compositions were prepared in the same manner.

Contrast

Comparative Examples 1 and 2

For contrast, the components which are shown below (each component amount is the mass % with the total solid content as a standard) were dissolved in a mixed solution of propylene glycol monomethyl ether acetate/propylene glycol monom- ethyl ether=40/60 (mass ratio) and a solution of solid content with a concentration of 1.8 mass % was prepared.

Comparative Example 1

| Resin (a'-1) | 64.99 mass % |
|---|---|
| PAG1 | 33 mass % |
| Compound N-1 | 2 mass % |
| Megafac F177 (manufactured by Dainippon Ink and Chemicals Inc., fluorine based) | 0.01 mass % |

Comparative Example 2

With regard to the comparative example 1, other than the resin (a'-1) and the compound N-1 being changed to a resin (a'-2) and a compound N-2, the comparative example 2 is prepared in the same manner.

[Chem. 43]

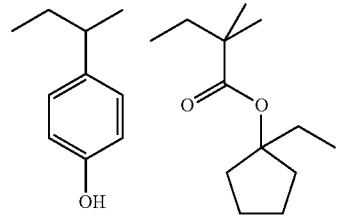

(a'-1)

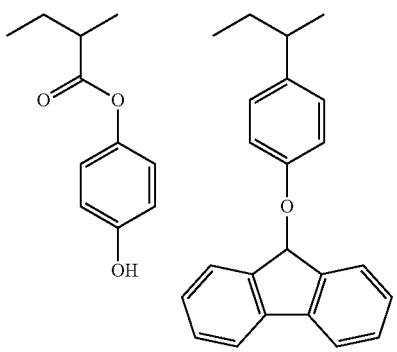

(a'-2)

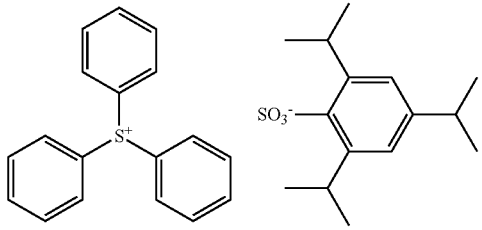

PAG1

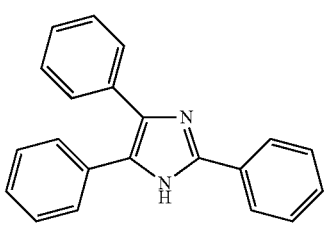

N-1

-continued

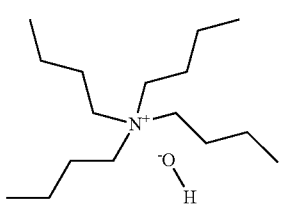

N-2

The solution which is obtained as described above was filtered using a polytetrafluoroethylene filter with a pore size of 0.1 μm and a chemical amplification positive resist composition (positive resist solution) was prepared.

The chemical amplification positive resist composition which had been prepared was uniformly coated onto a silicon substrate, on which a hexamethyldisilazane treatment had been carried out, using a spin coater, heating and drying was performed on a hot plate for 90 seconds at 120° C., and a positive resist film with a film thickness of 50 nm was formed.

Pattern Formation

Exposure of the positive resist film was performed while the exposure amount was changed in steps of 1.0 μC/cm² in a range from 0 to 55 μC/cm² using an electron beam. Immediately after irradiation, heating on a hot plate for 90 seconds at 110° C. was performed. Furthermore, development was carried out for 60 seconds at 23° C. using a tetramethylammonium hydroxide aqueous solution with a concentration of 2.38 mass %, and after rinsing with purified water for thirty seconds, and drying, a line and space pattern was formed, and the pattern which was obtained was evaluated using the method described below.

Resist Evaluation

Sensitivity

The line width of the pattern which had been obtained was observed using a scanning electron microscope (S-9220 manufactured by Hitachi Ltd.). The minimum irradiation energy when a 100 nm line width (line:space=1:1) was resolved was set as the sensitivity.

Resolving Power

The resolution limit in an irradiation amount which indicates the sensitivity described above (the minimum line width where the lines and the spaces are separated and resolved) is set as the resolving power. The smaller the value of the resolving power, there is a meaning of improved resolution.

Pattern Formation

A cross-section formation of a 100 nm line pattern in the irradiation amount which indicates the sensitivity described above was observed using a scanning electron microscope (S-4300 manufactured by Hitachi Ltd.) and an evaluation of T-top formation was performed. More specifically, in the cross-sectional formation of the line pattern, when "the largest value of the line width in the region from the surface of the pattern to 10 nm in the depth direction is set as L1" and "the smallest value of the line width in the region from a place 10 nm from the surface of the pattern toward the depth direction to a place 50 nm from the surface of the pattern toward the depth direction is set as L2", a value which is represented by L1/L2 was determined as the T-top fraction. When the T-top fraction is close to one, there is a meaning of improved pattern formation.

Line Edge Roughness (LER)

A line pattern of the irradiation amount which indicates the sensitivity described above was observed using a scanning electron microscope (S-9220 manufactured by Hitachi Ltd.). The roughness of a 25 nm line (line:space=1:1) which was resolved was set as the line edge roughness.

The results are shown in Table 2 below.

TABLE 2

| Example | Resin (P) | Sensitivity (μC/cm²) | Pattern Formation | Resolution Limit (nmL/S) | LER (nm) |
|---|---|---|---|---|---|
| Example 1 | A-1 | 24 | Rectangle | 17.5 | 3.6 |
| Example 2 | A-2 | 26 | Rectangle | 20.0 | 3.7 |
| Example 3 | A-3 | 25 | Rectangle | 20.0 | 3.5 |
| Example 4 | A-4 | 27 | Rectangle | 17.5 | 3.3 |
| Example 5 | A-5 | 23 | Rectangle | 20.0 | 3.8 |
| Example 6 | A-6 | 26 | Rectangle | 20.0 | 3.5 |
| Example 7 | A-7 | 25 | Rectangle | 17.5 | 3.4 |
| Example 8 | A-8 | 24 | Rectangle | 17.5 | 3.7 |
| Example 9 | A-9 | 26 | Rectangle | 17.5 | 3.7 |
| Example 10 | A-10 | 26 | Rectangle | 17.5 | 3.8 |
| Comparative Example 1 | a'-1 | 38 | T-top Shape | 25.0 | 5.1 |
| Comparative Example 2 | a'-2 | 36 | T-top Shape | 25.0 | 5.2 |

As is understood from Table 2, the chemical amplification positive resist composition of the present invention is able to satisfy high sensitivity, high resolution, excellent pattern formation, and superior line edge roughness at the same time in a case where an electron beam is used as the exposure light source.

[2] Resist Evaluation (EUV Exposure)

A positive resist solution of examples 11 to 20 and comparative examples 3 and 4 were each obtained in the same manner as in examples 1 to 10 and comparative examples 1 and 2 described above, except that the concentration of the solid content was changed to 2.0 mass %.

The positive resist solution described above was coated onto a silicon substrate, on which a hexamethyldisilazane treatment had been carried out, using a spin coater. This was heated and dried on a hot plate for 90 seconds at 100° C. and a resist film with an average film thickness of 50 nm was formed.

Pattern Formation

With regard to the resist film, EUV light was irradiated using an EUV exposure device. Immediately after irradiation, heating was performed on a hot plate for 90 seconds at 100° C. After this, development was carried out for 60 seconds at 23° C. using a tetramethylammonium hydroxide aqueous solution with a concentration of 2.38 mass %, and after rinsing with purified water for thirty seconds, drying was performed. Due to this, a line and space pattern (line:space=1:1) was formed.

Sensitivity

First, a cross-section formation of the line and space pattern which had been obtained was observed using a scanning electron microscope (S-4800 manufactured by Hitachi Ltd.). Then, the minimum irradiation energy when a 100 nm line width was resolved was determined and this value was set as the "sensitivity (mJ/cm²)".

Pattern Formation

A cross-section formation of a 100 nm line pattern (line:space=1:1) of the irradiation amount which indicated the sensitivity described above was observed using a scanning electron microscope (S-4800 manufactured by Hitachi Ltd.). Then, the formation was evaluated.

Resolving Power Evaluation

The resolution limit of an irradiation amount which indicates the sensitivity described above (the minimum line width where the lines and the spaces are separated and resolved) was set as the resolution limit.

Line Edge Roughness (LER)

A line pattern of the irradiation amount which indicates the sensitivity described above was observed using a scanning electron microscope (S-9220 manufactured by Hitachi Ltd.). The roughness of a 25 nm line (line:space=1:1) was set as the line edge roughness.

The evaluation results of these are shown in Table 3 below.

TABLE 3

(EUV Exposure)

| Example | Resin (P) | Sensitivity (μJ/cm²) | Pattern Formation | Resolution Limit (nmL/S) | LER (nm) |
|---|---|---|---|---|---|
| Example 11 | A-1 | 14 | Rectangle | 20.0 | 4.1 |
| Example 12 | A-2 | 15 | Rectangle | 22.0 | 4.3 |
| Example 13 | A-3 | 15 | Rectangle | 23.0 | 3.9 |
| Example 14 | A-4 | 16 | Rectangle | 21.0 | 3.8 |
| Example 15 | A-5 | 13 | Rectangle | 23.0 | 4.1 |
| Example 16 | A-6 | 15 | Rectangle | 22.0 | 4.2 |
| Example 17 | A-7 | 15 | Rectangle | 20.0 | 4 |
| Example 18 | A-8 | 14 | Rectangle | 20.0 | 4.5 |
| Example 19 | A-9 | 15 | Rectangle | 20.0 | 4.3 |
| Example 20 | A-10 | 15 | Rectangle | 20.0 | 4.3 |
| Comparative Example 3 | a'-1 | 22 | T-top Shape | 26.0 | 6.8 |
| Comparative Example 4 | a'-2 | 21 | T-top Shape | 28.0 | 7.1 |

As is understood from Table 3, the chemical amplification positive resist composition of the present invention is able to satisfy high sensitivity, high resolution, excellent pattern formation, and superior line edge roughness at the same time in a case where EUV light is used as the exposure light source.

This application claims priority under 35 U.S.C. §119 of Japanese Patent application JP 2011-146475, filed on Jun. 30, 2011, the entire contents of which are hereby incorporated by reference.

What is claimed is:

1. An actinic ray-sensitive or radiation-sensitive resin composition comprising a resin (P) which includes:
    a repeating unit (A) having an ionic structural moiety which generates an acid anion by being decomposed due to irradiation with actinic rays or radiation;
    a repeating unit (B) having a proton acceptor moiety, and
    a repeating unit (C) having a group which generates an alkali soluble group by being decomposed by the action of an acid, and
    the resin (P) has at least one repeating unit represented by the following general formulae (I) to (III) as the repeating unit (A),

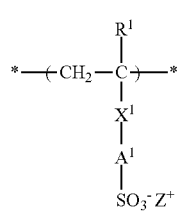
(I)

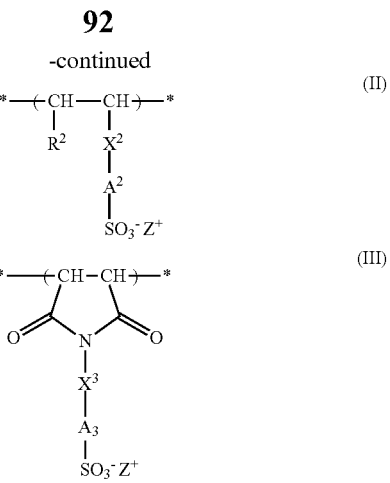

wherein, in general formulae (I) to (III), $R^1$ represents a hydrogen atom, an alkyl group, a cycloalkyl group, a hydroxymethyl group, an alkoxymethyl group, a halogen atom, or a cyano group, $R^2$ represents —COOR$^{11}$ or —CON(R$^{12}$)(R$^{13}$), R$^{11}$, R$^{12}$, and R$^{13}$ each independently represent a hydrogen atom, an alkyl group, a cycloalkyl group, an alkenyl group, an aryl group, or an aralkyl group, R$^{12}$ and R$^{13}$ may form a ring with a nitrogen atom by being bonded, $X^1$, $X^2$, and $X^3$ each independently represent a single bond or a divalent linking group, $A^1$, $A^2$, and $A^3$ each independently represent a divalent linking group which does not include a fluorine atom, and $Z^+$ represents an onium cation.

2. The composition according to claim 1, wherein $A^1$, $A^2$, and $A^3$ are alkylene groups which include only carbon atoms and hydrogen atoms or arylene groups which include only carbon atoms and hydrogen atoms.

3. The composition according to claim 1, wherein $A^1$, $A^2$, and $A^3$ are unsubstituted phenylene groups.

4. The composition according to claim 1, wherein the proton acceptor moiety of the repeating unit (B) is amine, aniline, or a nitrogen-containing heterocyclic structure.

5. The composition according to claim 1, wherein the repeating unit (C) is a repeating unit represented by the general formula (V) or the general formula (VI) below,

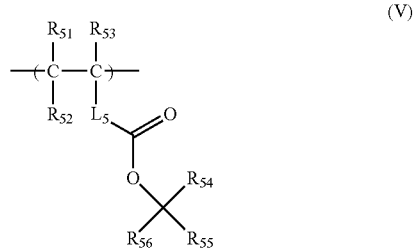
(V)

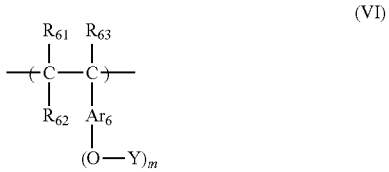
(VI)

wherein, in the general formula (V), $R_{51}$, $R_{52}$, and $R_{53}$ each independently represent a hydrogen atom, an alkyl group, a monovalent aliphatic hydrocarbon ring group, a halogen atom, a cyano group, or an alkoxycarbonyl group, $R_{52}$ may form a ring by being bonded with $L_5$ and $R_{52}$ in this case represents an alkylene group, $L_5$ represents a single bond or a divalent linking group and represents a trivalent linking group when forming a ring with $R_{52}$, $R_{54}$ represents an alkyl group and $R_{55}$ and $R_{56}$ each independently represent a hydrogen atom, an alkyl group, a monovalent aliphatic hydrocarbon ring group, or a monovalent aromatic ring group; Meanwhile, $R_{55}$ and $R_{56}$ are not hydrogen atoms at the same time, $R_{55}$ and $R_{56}$ may form a ring by being bonded to each other;

wherein, in the general formula (VI), $R_{61}$, $R_{62}$, and $R_{63}$ each independently represent a hydrogen atom or an alkyl group, $Ar_6$ represents a divalent aromatic ring group, Y represents a group which generates an alkali soluble group by being decomposed by the action of an acid, and each independently represents a group which generates an alkali soluble group by being decomposed by the action of an acid in a case of there being a plurality thereof, and m represents an integer of 1 to 4.

6. The composition according to claim 5, wherein the repeating unit (C) is represented by the general formula (VI) and an —O—Y group is a group forming an acetal structure.

7. The composition according to claim 1 wherein the repeating unit (A) is represented by the general formula (I).

8. The composition according to claim 1, wherein $X^1$, $X^2$, and $X^3$ represent a single bond, an arylene group, an alkylene group, a cycloalkylene group, —O—, —SO$_2$—, —CO—, —NR$_{21}$—, or a divalent linking group which combine thereof, wherein, $R_{21}$ represents an alkyl group, a cycloalkyl group, or an aryl group.

9. The composition according to claim 1, wherein $Z^+$ represents a sulfonium cation.

10. The composition according to claim 1, wherein the proton acceptor moiety of the repeating unit (B) is a nitrogen-containing heterocyclic structure.

11. The composition according to claim 1, wherein the resin (P) further includes a repeating unit (D) which is represented by the general formula (IV) below,

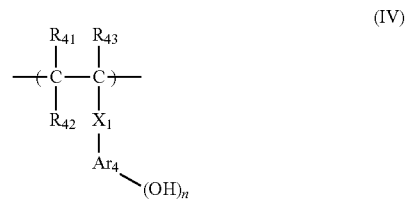

(IV)

wherein, in the general formula (IV), $R_{41}$, $R_{42}$, and $R_{43}$ each independently represent a hydrogen atom, an alkyl group, a monovalent aliphatic hydrocarbon ring group, a halogen atom, a cyano group, or an alkoxycarbonyl group; In addition, $R_{42}$ may form a ring by being bonded with $Ar_4$ and $R_{42}$ in this case represents an alkylene group, $X_1$ represents a single bond or a divalent linking group, $Ar_4$ represents a divalent aromatic ring group and represents a trivalent aromatic ring group when forming a ring with $R_{42}$, and n is an integer of 1 to 4.

12. An actinic ray-sensitive or radiation-sensitive film which is formed using the composition according to claim 1.

13. A pattern forming method, comprising:

exposing the actinic ray-sensitive or radiation-sensitive film according to claim 12, and developing the exposed film.

14. The pattern forming method according to claim 13, wherein an exposure light source is at least one of an electron beam, an X ray, or EUV light.

15. A semiconductor device manufacturing method, comprising:

the pattern forming method according to claim 13.

16. A semiconductor device which is manufactured using the method according to claim 15.

\* \* \* \* \*